(12) United States Patent
Matsumoto et al.

(10) Patent No.: US 7,616,067 B2
(45) Date of Patent: Nov. 10, 2009

(54) PHASE SYNCHRONIZATION CIRCUIT AND ELECTRONIC APPARATUS

(75) Inventors: Tomohiro Matsumoto, Kanagawa (JP); Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 77 days.

(21) Appl. No.: 11/900,110

(22) Filed: Sep. 10, 2007

(65) Prior Publication Data
US 2008/0061889 A1    Mar. 13, 2008

(30) Foreign Application Priority Data
Sep. 12, 2006    (JP)    ............... 2006-246327

(51) Int. Cl.
H03L 7/087    (2006.01)
(52) U.S. Cl. ............... 331/16; 331/11; 331/17
(58) Field of Classification Search ............ 331/10, 331/11, 14, 16, 17, 18, 25, 44; 327/156, 327/157; 375/376
See application file for complete search history.

(56) References Cited

U.S. PATENT DOCUMENTS

| | | | | |
|---|---|---|---|---|
| 6,998,922 | B2 * | 2/2006 | Jensen et al. | 331/17 |
| 7,298,219 | B2 * | 11/2007 | Dosho et al. | 331/16 |
| 7,301,414 | B2 * | 11/2007 | Hino | 331/179 |
| 2005/0237125 | A1 * | 10/2005 | Hino | 331/179 |
| 2006/0145767 | A1 * | 7/2006 | Vaananen | 331/16 |

OTHER PUBLICATIONS

Zhi-Ming Lin et al., "A CMOS Voltage-Controlled Oscillator With Temperature Compensated", *The Second IEEE Asia Pacific Conference on ASICs*, Aug. 28-30, 2000, pp. 85-86.

Soon-Seob Lee et al., "Process-and-Temperature Compensated CMOS Voltage-Controlled Oscillator for Clock Generators", *Electronics Letter*, vol. 39, No. 21, Oct. 16, 2003, pp. 1-2.

Takashi Morie et al., "A -90dBc@10kHz Phase Noise Fractional-N Frequency Synthesizer With Accurate Loop Bandwidth Control Circuit", *Symposium on VLSI Circuits Digest of Technical Papers*, pp. 52-55, 4-900784-01-X, Jun. 2005.

Kun-Seok Lee et al., "Fast AFC technique Using a Code Estimation and Binary Search Algorithm for Wideband Frequency Synthesis", *Proceedings of ESSCIRC*, Grenoble, France, 2005, pp. 181-184, Sep. 2005.

* cited by examiner

*Primary Examiner*—Robert Pascal
*Assistant Examiner*—Ryan J. Johnson
(74) *Attorney, Agent, or Firm*—Wolf, Greenfield & Sacks, P.C.

(57) ABSTRACT

A phase synchronization circuit and an electronic apparatus equipped with the phase synchronization circuit are provided. The phase synchronization circuit includes an oscillation unit, a phase comparison unit, a loop unit, a drive unit, an oscillation control signal unit, and a gain characteristic information obtaining unit. In the phase synchronization unit, a compensation signal is generated based on the gain characteristic information obtained by the gain characteristic information obtaining unit at the time of the usual phase synchronizing operation, and the drive unit is controlled by the compensation signal so that a product of the input signal-oscillation frequency conversion gain at the time of actual operation and the drive signal with which the drive unit drives the loop filter unit is constant.

12 Claims, 39 Drawing Sheets

FIG. 12A

| OSCILLATION FREQUENCY OF OSCILLATOR | COUNT VALUE | |
|---|---|---|
| 790MHz<fcco<795MHz | 158,159 | ← JUDGING REFERENCE FREQUENCY (ACTUAL) |
| 795MHz | 158,159,160 | |
| 795MHz<fcco<800MHz | 159,160 | ← JUDGING REFERENCE FREQUENCY (IDEAL) |
| 800MHz | 159,160,161 | |
| 800MHz<fcco<805MHz | 160,161 | |
| 805MHz | 160,161,162 | |
| 805MHz<fcco<810MHz | 161,162 | |
| 810MHz | 161,162,163 | |

FIG. 12B

| OSCILLATION FREQUENCY OF OSCILLATOR | COUNT VALUE | |
|---|---|---|
| 790MHz<fcco<795MHz | 158,159 | |
| 795MHz | 158,159,160 | |
| 795MHz<fcco<800MHz | 159,160 | ← JUDGING REFERENCE FREQUENCY (ACTUAL) |
| 800MHz | 159,160,161 | |
| 800MHz<fcco<805MHz | 160,161 | ← JUDGING REFERENCE FREQUENCY (IDEAL) |
| 805MHz | 160,161,162 | |
| 805MHz<fcco<810MHz | 161,162 | |
| 810MHz | 161,162,163 | |

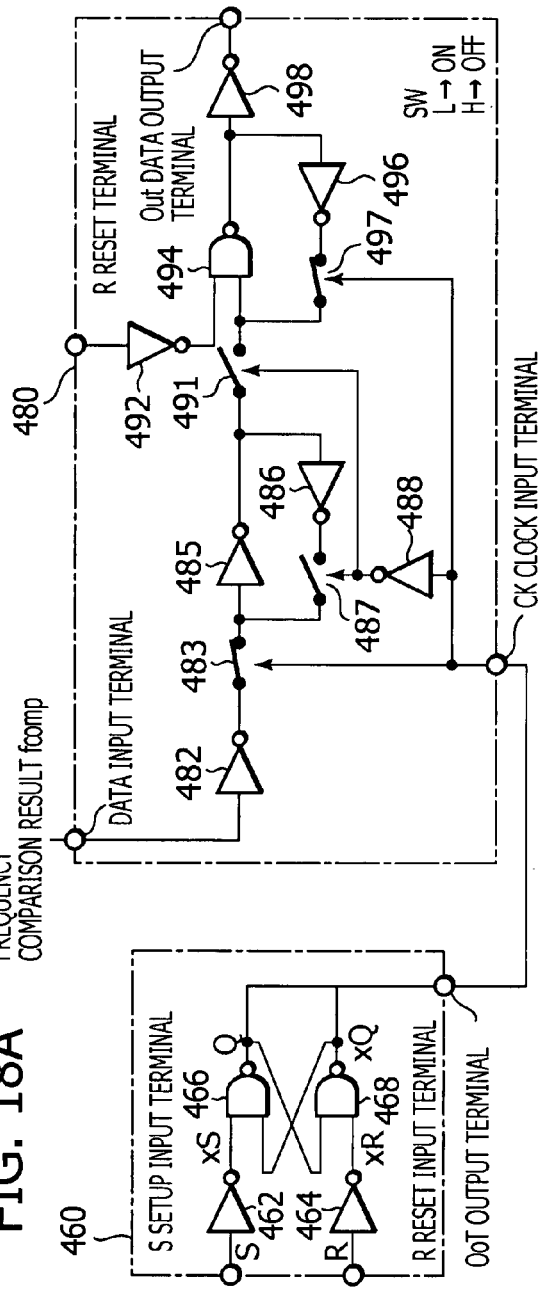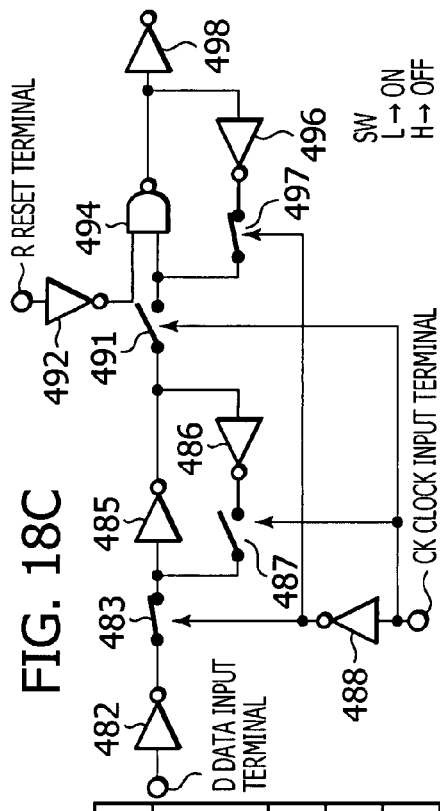

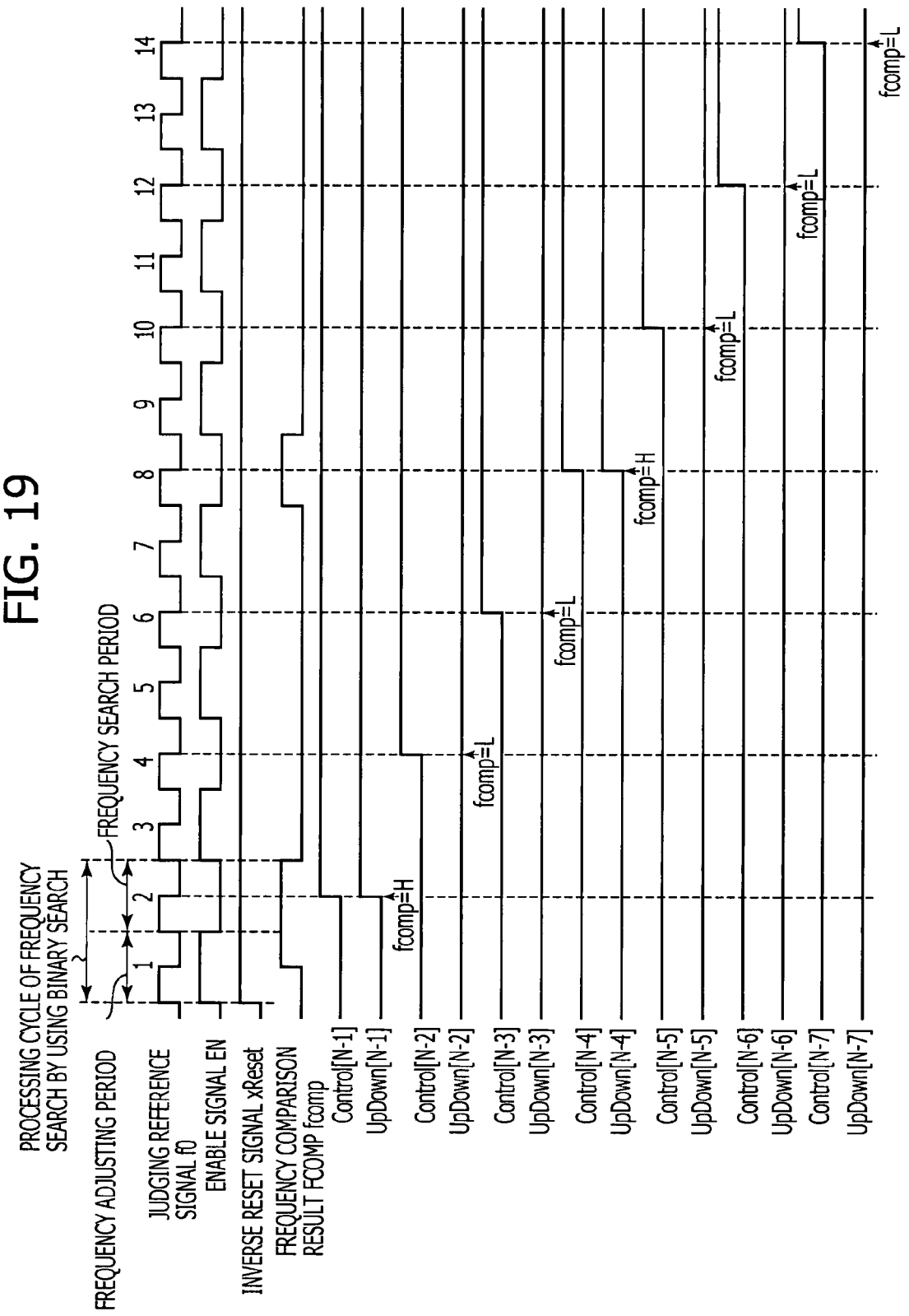

PRIOR ART

PRIOR ART

PRIOR ART

PHASE SYNCHRONIZATION CIRCUIT AND ELECTRONIC APPARATUS

CROSS REFERENCES TO RELATED APPLICATIONS

The present invention contains subject matter related to Japanese Patent Application No. JP 2006-246327, filed in the Japanese Patent Office on Sep. 12, 2006, the entire contents of which being incorporated herein by reference.

BACKGROUND OF THE INVENTION

1. Field of the Invention

The present invention relates to a phase synchronization (PLL: Phase Locked Loop) circuit used for a communication apparatus for reception and transmission, such as a TV set, a mobile phone, etc. and an optical disc apparatus, etc., and an electronic apparatus having the phase synchronization circuit.

2. Description of Related Art

For example, a phase synchronization (PLL: Phase Locked Loop) circuit may be incorporated in electronic devices, such as various types of communication apparatuses, and transmission/reception apparatuses or optical disc apparatuses.

FIG. 40 is a circuit block diagram generally showing a phase synchronization circuit. A structure of a phase synchronization circuit 100Z as shown in FIG. 40 also generalizes and illustrates a structure disclosed in non-patent literatures 1-3 to be described later.

As shown, the phase synchronous circuit 100Z includes an oscillation unit 101 for generating an output oscillation signal Vout of an oscillation frequency fosci based on an oscillation control signal CN, and a frequency division unit 102 for dividing the oscillation frequency fosci of the output oscillation signal Vout outputted from the oscillation unit 101 into 1/α, and for acquiring a frequency-divided oscillation signal Vout1.

Further, the phase synchronization circuit 100Z includes a phase comparison unit 103 for comparing phases between an input signal Vin and the output oscillation signal Vout from the oscillation unit 101 or the frequency-divided oscillation signal Vout1 from frequency division unit 102, to output an error signal indicative of a phase difference which is a comparison result as a comparison result signal Vcomp, a current output type drive unit 104Z (hereafter referred to as charge pump unit 104) for outputting and inputting a charge pump current Icp according to the comparison result signal Vcomp outputted from the phase comparison unit 103, and at least a capacitor (capacitance element) 164 of loop filter capacitance Cp, and further provided with a loop filter unit 106 for generating the oscillation control signal CN for controlling the oscillation frequency fosci of the oscillation unit 101 by using the charge voltage Vcp of the capacitor 164 based on the charge pump current Icp from the charge pump unit 104. In this example of structure, the loop filter unit 106 is also provided with a voltage/current conversion unit 166 which converts the charge voltage Vcp of the capacitor 164 into oscillation control current Icnt so that it may correspond to the oscillation unit 101 being a current control oscillation unit 101A.

In the phase synchronization circuit 100Z of such a structure, the input signal Vin and the output oscillation signal Vout from the oscillation unit 101 (or frequency-divided oscillation signal Vout1 by means of the frequency division unit 102) are inputted into the phase comparison unit 103. Based on the comparison result signal Vcomp which indicates the phase error, the oscillation unit 101 is oscillated by way of a technique of the charge pump PLL and the output oscillation signal Vout phase-locked to the input signal Vin is acquired.

Here, linearized closed loop transfer function is generally used for the analysis of the charge pump PLL. With the charge pump current Icp, the input signal-oscillation frequency conversion gain Kosci of the oscillation unit 101, the loop filter capacitance Cp of the capacitor 164, the conversion gain Klp of the loop filter unit 106, the damping effect Flp of the loop filter unit 106, and the frequency division ratio α of the frequency division unit 102, its zone (natural angle frequency or natural frequency; hereafter simply referred to as zone) ωn and the damping factor ζ can be expressed by equation (1-1) and equation (1-2). The damping effect Flp of the loop filter unit 106 and the conversion gain Klp of the loop filter unit 106 correspond to a structure of the loop filter unit 106 (as will be illustrated in detail in embodiments).

The loop filter unit 106 is shown as an example of the drive unit 104Z here in the case of a charge pump 104CP driven in a current mode. However, by way of a circuit theory, "principle of duality" is effected between current and voltage. Therefore, equation (1-1) and equation (1-2) analyzed in a current mode paying attention to the charge pump current Icp can be expressed by equation (1-3) and equation (1-4) when analyzing them in a voltage mode paying attention to a drive voltage Vdr which drives the loop filter unit 106. Since each of equations (1) is known, the derivation processes of the equations will not be explained hereafter.

$$\left. \begin{array}{ll} \omega_n = \sqrt{\dfrac{Icp \cdot Kosci \cdot Klp}{Cp \cdot \alpha}} & \ldots (1-1) \\ \zeta = \dfrac{Cp \cdot Flp}{2} \omega n & \ldots (1-2) \\ \omega n = \sqrt{\dfrac{Vdr \cdot Kosci \cdot Klp}{Cp \cdot \alpha}} & \ldots (1-3) \\ \zeta = \dfrac{Cp \cdot Flp}{2} \omega n & \ldots (1-4) \end{array} \right\} \quad (1)$$

However, when the phase synchronization circuit 100Z is actually manufactured by IC (Integrated Circuit; semiconductor integrated circuit), parameters which determine the zone ωn, such as the charge pump current Icp, the conversion gain Klp, and the input signal-oscillation frequency conversion gain Kosci, and the damping factor ζ vary from designed values. Thus, it becomes difficult to set the zone ωn an and the damping factor ζ as desired values. Furthermore, considering that they are used in various places, the zone ωn and the damping factor ζ shift from the preset values further, since each parameter changes also with temperature.

If the zone ωn shifts from the preset value considerably, a period until the output oscillation signal Vout is phase-locked to the input signal Vin, i.e., acquisition time, also changes from a preset value. Then, the design of the whole system using the phase synchronization circuit 100Z becomes difficult, and a jitter increases when the zone ωn is shifted much lower. In order to avoid this problem, a technology of compensating for the manufacture variations and temperature characteristics of the input signal-oscillation frequency conversion gain Kosci becomes indispensable As an arrangement which can meet such a demand, there is an arrangement proposed in non-patent documents 1-3.

ZHI-MING LIN, KUEI-CHEN HUANG, JUN-DA CHEN, and MEI-YUAN LIAO, "A CMOS VOLTAGE-CONTROLLED OSCILLATOR WITH TEMPERATURE COMPENSATED", The Second IEEE Asia Pacific Conference on ASICs/Aug. 28-30, 2000, p.p 85-86 (non-patent document 1)

Soon-Seob Lee, Tae-Geun Kim, Jae-Tack Yoo and Soo-Won Kim, "Process-and-temperature compensated CMOS voltage-controlled oscillator for clock generators", ELECTRONICS LETTERS 16th Oct. 2003, Vol. 39, No. 21, p.p 1484-1485 (non-patent document 2)

Takashi Morie, Shiro Dosho, Kouji Okamoto, Yuji Yamada and Kazuaki Sogawa, "A-90 dBc@10 kHz Phase Noise Fractional-N Frequency Synthesizer with Accurate Loop Bandwidth Control Circuit", 2005 Symposium on VLSI Circuits Digest of Technical Papers, p 52~55 (non-patent document 3)

For example, non-patent document 1 has proposed the following arrangement where a voltage controlled oscillator (VCO; Voltage Controlled Oscillator) is constituted by means of plural stages of delay stages (delay stage) (see FIG. 41A similar to FIG. 1 in this document 1), diode connections between PMOS transistors and NMOS transistors are connected in series to be a load so that a common output voltage of the delay stage may always be constant, to thereby compensate for temperature characteristics (see FIG. 41B similar to FIG. 3 in document 1). FIG. 41A is quoted from FIG. 1 of the non-patent document 1, which shows the whole structure of the VCO. FIG. 41B is quoted from FIG. 3 of the non-patent document 1, which shows the delay stage of the VCO.

Further, non-patent document 2 has proposed the following arrangement where the voltage controlled oscillator (VCO) is constituted by means plural stages of delay cells (delay cell), and current independent of a temperature or manufacture variations is made by means of a circuit so that the current may be bias current for a delay cell (see FIG. 42 similar to FIG. 1 of document 2). FIG. 42 is quoted from FIG. 1 of the non-patent document 2, which shows VCO design to provide both current subtraction bias (CSB) selection and a fixed bias (FB) selection.

Further, non-patent document 3 has proposed the following arrangement where a highly precise bias circuit is provided which does not depend on a temperature change in order for charge pump current to be constant, as well as a gain control amplifier which adjusts a gain with respect to the oscillation control signal CN is provided on the input side of the voltage controlled oscillator (VCO), and the gain of a voltage controlled oscillator (VCO) is measured. By controlling the gain control amplifier with a compensation value according to the result, feedback is provided for an input of the voltage controlled oscillator (see FIG. 43 similar to FIG. 1 of the document 3). FIG. 43 is quoted from FIG. 1 of the non-patent document 3, which shows block diagram of the synthesizer with loop bandwidth calibration.

SUMMARY OF THE INVENTION

However, it is very difficult for the arrangements described in non-patent documents 1 and 2 to compensate completely in the case where the input signal-oscillation frequency conversion gain Kosci of the voltage controlled oscillator is nonlinear. Further, since the arrangement as described in non-patent document 1 requires to devise a structure of a delay stage, design of circuitry of the delay stage becomes complicated. Furthermore, since the arrangement as described in non-patent document 2 requires a circuit which creates the current independent of the temperature or manufacture variations, and also requires an arrangement where the created current should be the bias current for the delay cells, the design of circuitry of the voltage controlled oscillator becomes complicated.

Further, the arrangement as described in non-patent document 3 further requires a highly precise bias circuit which does not depend on the temperature change in order for the charge pump current to be constant, and a gain control amplifier for adjusting the gain with respect to the oscillation control signal CN before the input of the voltage controlled oscillator.

Furthermore, in the arrangement as described in non-patent document 3, each compensation circuit also has a manufacture variation. Even taking the variation into consideration, the compensation circuit must be designed so as to be able to compensate for the gain of the voltage controlled oscillator, to thereby become very difficult to design the compensation circuit. This is because the gain value of gain control amplifier is adjusted absolutely based on the measurement result, that is, the absolute value of the gain is managed, and however, in the management of the absolute value, it is substantially impossible to avoid the variation due to a device characteristic or the circuit structure.

The present invention arises in view of the above-mentioned situations, and provides an arrangement where a new circuit structure which is different from the arrangements as described in non-patent documents 1-3 can prevent generation of variations in the zone on resulting from the manufacture variation and the temperature change of the input signal-oscillation frequency conversion gain Kosci or the damping factor $\zeta$.

Further, more preferably the present invention provides an arrangement where accuracy management of the bias circuit with respect to the charge pump can be eased or the manufacture variation of compensation can be minimized.

Further, more preferably the present invention provides an arrangement where the bias circuit for the oscillating circuit is unnecessary, the oscillating circuit may not have a special circuit structure, and a general circuit can be used.

A phase synchronization circuit in accordance with an illustrative embodiment or an electronic device provided with the phase synchronization circuit is a phase synchronization circuit including an oscillation unit, a phase comparison unit, a loop unit, a drive unit, an oscillation control signal unit, and a gain characteristic information obtaining unit. The oscillation unit for outputting an output oscillation signal with a predetermined frequency based on an oscillation control signal. The phase comparison unit for comparing phases between the output oscillation signal outputted from the oscillation unit and an input signal inputted from the outside. The a drive unit for generating a drive signal based on a signal indicative of a phase comparison result outputted from the phase comparison unit, and driving the loop filter unit by the drive signal. The oscillation control signal generation unit for generating the oscillation control signal based on a loop filter output signal outputted from the loop filter unit so that the phase of the output oscillation signal synchronizes with the phase of the input signal. The gain characteristic information obtaining unit for obtaining gain characteristic information which specifies an input signal-oscillation frequency-conversion gain characteristic of the oscillation unit at the time of actual operation and for storing the gain characteristic information, the gain characteristic information being obtained by comparing an actual oscillation frequency and first and second target frequencies to find a difference, while supplying, by using the target frequencies, a regulation signal of a predetermined magnitude and a compensation for oscillating the oscillation unit at each frequency as the oscillation control signal. In the phase synchronization unit, a compensation signal is generated based on the gain characteristic information obtained by the gain characteristic information obtaining unit at the time of the usual phase synchronizing operation, and the drive unit is controlled by the compensation signal so that a product of the input signal-oscillation frequency conversion gain at the time of actual operation and the drive signal with which the drive unit drives the loop filter unit is constant.

The illustrative embodiment of the phase synchronization circuit is arranged such that at the time of usual phase synchronizing operation after obtaining gain characteristic information, a compensation signal is generated based on the gain characteristic information (expressed by stored information) obtained by the gain characteristic information obtaining unit, and the compensation signal controls the drive unit so that a product of the input signal-oscillation frequency conversion gain (also abbreviated and referred to as frequency conversion gain) and the drive signal for driving the loop filter unit by the drive unit at the time of working may become constant.

One embodiment of the present invention is somewhat similar to the arrangement as described in non-patent document 3 in that the information about the input signal-oscillation frequency conversion gain of in a real operating situation is measured, and the result is reflected at the time of phase synchronizing operation, however, the control techniques is completely different in compensation. In other words, the illustrative embodiment arises paying attention to Icp·Kosci and Vdr·Kosci in equation (1), and controls the drive unit for loop filters by using the gain characteristic information (more particularly, compensation signal based on gain characteristic information) so that the product of the frequency conversion gain and the drive signal for the loop filters may become constant. Even if Kosci still has a variation, the product of Kosci and Icp or Vdr can be made constant by adjusting the Icp and Vdr sides so that the variation may be offset. As can be seen from equation (1), even with Kosci having a variation, if the product of Kosci and Icp or Vdr is constant, the zone con and the damping factor $\zeta$ are constant.

In this way, the influence of the compensation variation is eased which is produced by the arrangement as described in the non-patent document 1 where the frequency conversion gain is controlled to be constant. This is because highly precise absolute value management of the amount of compensation is required in order to control the frequency conversion gain to be constant, thus being difficult to realize it. While, it becomes possible to perform management by "ratio", where management accuracy is eased, by employing an arrangement for controlling the product of Kosci and Icp or Vdr to be constant as in the illustrative embodiment of present invention.

Further, a further illustrative embodiment of the phase synchronization circuit as recited in the dependent claims defines further advantageous example of the phase synchronization circuit in accordance with an embodiment of the present invention.

For example, in an electric (electronic) circuit, current and a voltage have the relation of "principle of duality." Thus, the input signal and the control signal inputted into each functional part or the signal outputted from each functional part may be in either the voltage mode or the current mode. In the connection relationships among the functional parts, when the voltage mode and the current mode are mismatched with each other, a signal conversion unit (for example, a current/voltage conversion unit which converts a current signal into a voltage signal and a voltage/current conversion unit which converts a voltage signal into a current signal) for matching between them may be provided.

However, in terms of a schematic circuit structure as a gain characteristic information obtaining unit, it is desirable that, when the oscillation unit is a current control oscillation unit controlled by oscillation control current, it may be arranged to be of a current output type which outputs an oscillation control signal in the current mode. When it is a voltage control oscillation unit controlled by oscillation control voltage, it may be arranged to be of a voltage output type which outputs the oscillation control signal in the voltage mode.

Further, in an effort to acquire a compensation signal by means of two types of target frequencies in the gain characteristic information obtaining unit, it is desirable that, while employing a structure of K times the second frequency control signal acquired in the frequency control signal generation unit with respect to the second target frequency at the time of acquiring the compensation information, a quotient obtained by dividing a product of a standard input signal-oscillation frequency conversion gain and a standard drive signal by a difference between a first target frequency and a second target frequency may be set as "K". In this way, it is possible to control a product of the frequency conversion gain and the drive signal for the loop filters to be certainly constant.

Further, as a circuit structure which realizes such a setup of "K" times, either a voltage mode or a current mode may be adopted. The current mode has an advantage that a current mirror circuit structure can be adopted which has a comparatively simple structure and can realize the management of the ratio with high precision.

In this case, when the oscillation control signal is in the voltage mode, the voltage/current conversion unit which converts the frequency control signal in the voltage mode into the frequency control signal in the current mode may be interposed on the input side of the current mirror circuit.

Further, either the voltage mode or the current mode can be adopted also for a configuration of the drive unit which drives the loop filter unit. When the compensation signal is in the current mode, it is desirable that the drive unit is also arranged to operate in the current mode similarly and to have a structure of the so-called charge pump. In this case, it is desirable to prepare a current source which generates current of 1/β times the charge pump current, and to control an amount of the bias current generated in the current source based on the compensation signal obtained by the gain characteristic information obtaining unit.

Further, when acquiring the gain characteristic information by means of two types of target frequencies (first and second target frequencies) in the gain characteristic information obtaining unit, it is preferable to employ a technique of frequency search by using binary search in which the target frequency and an actual frequency are compared in magnitude while switching the frequencies in the direction of decreasing bit-weighting for each frequency, and the frequency comparison result is held as digitized data, which is repeated the predetermined number of times (the number of times corresponds to the number of bits) while controlling again the oscillation unit by frequency control current based on the data.

According to an embodiment of the present invention, the gain characteristic information with which the input signal-oscillation frequency conversion gain characteristic of the oscillation unit in the real operating situation is specified by using two types of target frequencies is measured. Then, at the time of the usual phase synchronizing operation, based on the gain characteristic information, the drive unit is controlled so that the product of the frequency conversion gain (Kosci) at the time of actual operation and the drive signal for the loop filters (Icp and Vdr) may be constant. By controlling the product of Kosci and Icp or Vdr to be constant, it becomes possible to prevent the generation of variations in the zone and damping factor resulting from the variations in the frequency conversion gain.

Further, as an additional effect, by employing an arrangement in which the product of Kosci and Icp or Vdr is controlled to be constant, it becomes possible to perform the management by "ratio" with which the management accuracy is eased, and the variations in the zone ωn or the damping factor ζ resulting from the manufacture variations and the temperature changes of the frequency conversion gain can be compensated with high precision. As a result, it is possible to reduce the manufacture variation of the compensation. Further, since it becomes possible to perform the management by "ratio" with which management accuracy is eased, the management of accuracy can be eased also with respect to the structure of the drive unit which performs control for compensation.

Furthermore, as another additional advantageous effect, by means of two types of target frequencies (first and second target frequencies), the gain characteristic information with which the frequency conversion gain in the real operating situation is specified is measured, while supplying the oscillation unit with a regulation signal of a predetermined magnitude and an oscillation control signal which is compensation for causing the oscillation unit to oscillate at each frequency. Thus, if it returns to the usual phase synchronizing operation after acquiring the gain characteristic information, the compensation (that is, the frequency control signal indicative of a difference from the regulation signal) for causing the oscillation frequency to be one target frequency is synthesized with the regulation signal to be supplied to the oscillation unit. Then, if the first target frequency is set as the frequency to be locked with the usual phase synchronizing operation, the problem does not arise with the response at the time of switching.

These and other features and aspects of the invention are set forth in detail below with reference accompanying drawings in the following detailed description of embodiments.

BRIEF DESCRIPTION OF THE DRAWINGS

FIG. 12A is a chart for explaining malfunction in the programmable counter, and shows a relationship between judgment mistake section of program counter and judging reference frequency when frequency division ratio M=160.

FIG. 12B is a chart for explaining malfunction in the programmable counter, and shows a relationship between judgment mistake section of program counter and judging reference frequency when frequency division ration M=161

FIGS. 18A and 18C are diagrams showing details of constituent elements for one bit of the data storage unit which constitutes the frequency comparison result storage unit.

FIG. 18B is a truth table in operation of the data storage unit.

FIG. 19 is a timing chart for explaining the whole operation of the frequency comparison unit and the frequency comparison result storage unit, in the case where the processing cycle of the frequency search by using binary search is assumed to be equivalent to two clocks of the judging reference signal f0.

DETAILED DESCRIPTION OF EMBODIMENTS

Hereafter, with reference to the drawings, the illustrative embodiments of the present invention will be described in detail.

<Outline of Optical Disc Apparatus>

Figure 1:
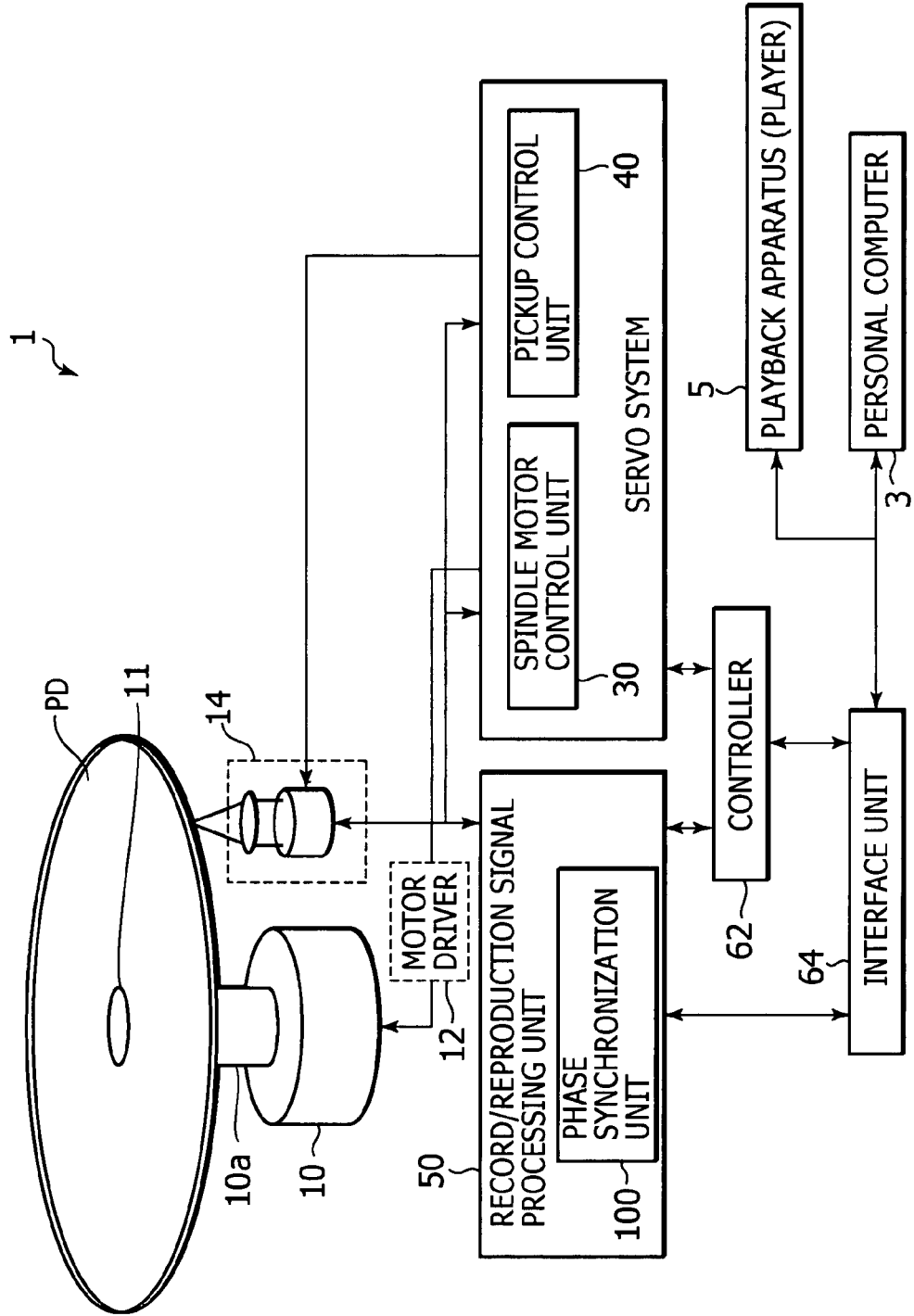
FIG. 1 is a block diagram showing a embodiment of an optical disc apparatus having a phase synchronization circuit.

FIG. 1 is a block diagram showing an embodiment of an optical disc apparatus which is an example of an electronic device having a phase synchronization circuit.

An optical disc apparatus 1 of this embodiment includes an optical pickup 14 having a laser light source for recording additional information on an optical disc PD (Photo Disk) or for reading the information recorded on the optical disc PD. Further, it has a servo system, a record/reproduction system, and a controller system as a signal processing system. Here, the optical disc apparatus 1 has a rotation servo system, a tracking servo system, and a focal servo system as the servo system. The tracking servo system and the focal servo system are also collectively referred to as a pickup servo system.

The optical disc PD may be one of so called read only optical discs, such as CD (compact disk) and CD-ROM (Read Only Memory), as well as a write once optical disk like CD-R (Recordable), and a rewritable type optical disc like CD-RW (Rewritable), for example. Further, it may be not only the CD type optical disc, but also MO (magneto-optical disc), and DVD type optical disc, so-called next generation DVD, such as a usual DVD (Digital Video or Versatile Disk), and a Blu-ray (Blu-ray) or HD-DVD (High Definition DVD). Furthermore, it may be so called double-density CD (DDCD; DD=Double Density), CD-R, or CD-RW having the recording density approximately twice that of the current format and even following the current CD format.

The optical disc apparatus 1 is particularly provided with a spindle motor 10, as a rotation servo system, for rotating the optical disc PD on which information to be played back, such as music, is recorded, a motor driver 12 for driving the spindle motor 10, and a spindle motor control unit 30 which is an example of the rotation control unit (rotation servo system) for controlling the motor driver 12.

Although not shown, the spindle motor control unit 30 has a rough servo circuit, a speed (speed) servo circuit, a phase (phase) servo circuit, and a selector for switching and outputting each output of each servo circuit.

The rough servo circuit controls the rotation speed of optical disc PD roughly. The speed servo circuit adjusts the rotation speed with higher precision based on a synchronization signal. The phase servo circuit matches a phase of a reproduction signal to a phase of a reference signal. The selector switches each of the outputs from the rough servo circuit, the speed servo circuit, and the phase servo circuit, and outputs it to the motor driver 12.

The optical disc PD is arranged to be fixed to a rotor shaft 10a of the spindle motor 10 by means of a chuck 11. The spindle motor 10 is controlled by the motor driver 12 and the spindle motor control unit 30 so that a linear speed may be constant. The linear speed can be gradually changed by the motor driver 12 and the spindle motor control unit 30.

Further, the optical disc apparatus 1 includes a pickup control unit 40 for controlling a radius direction position (of the optical pickup 14) with respect to the optical disc PD, as the tracking servo system and the focal servo system. Although not shown, the pickup control unit 40 includes, for example, a sub-coding detector circuit for reading sub-coding recorded on the optical disc PD, and a tracking servo circuit for controlling the radius direction position of the optical pickup 14 with respect to the optical disc PD based on a track error signal detected by a track error detection circuit (not shown) and address information detected by the sub-coding detector circuit.

By controlling a track actuator (not shown) and a seeking motor, the pickup control unit 40 controls a laser spot of laser light emitted from the optical pickup 14 to be located in a target place (data recording position or data playback position) on the optical disc PD.

The optical pickup 14 includes therein a known semiconductor laser (not shown), an optical system, a focal actuator, a track actuator, a light receiving element, a position sensor, etc., and is arranged such that a recording side of the optical disc PD may be irradiated with laser light, and reflected light may be received and converted into an electric signal. The semiconductor laser of the optical pickup 14 is arranged to be driven by a laser driver (not shown). By way of the drive of this laser driver, an optical beam of predetermined reproduction power is emitted at the time of data reproduction, and an optical beam of predetermined record power is emitted at the time of recording the information.

Further, this optical pickup 14 is arranged to be moved by the seeking motor (slide motor) (not shown) in a sledge (radius) direction. Based on the signal acquired from the light receiving element or the position sensor, the focal actuator, the track actuator, and the seeking motor are controlled by the motor driver 12, the spindle motor control unit 30, and the pickup control unit 40, so as to locate the laser spot of the laser light in the target place (data recording position or data playback position) on the optical disc PD.

Further, the optical disc apparatus 1 has a record/playback signal processing unit 50, as a record/playback system, which is an example of an information record unit for recording information through the optical pickup 14 and an information reproduction unit for reproducing the information recorded on the optical disc PD. Although an example of a detailed structure of the record/playback signal processing unit 50 will be described later, it is at least provided with a phase synchronization unit 100 which is an example of the phase synchronization circuit.

Further, as the controller system, the optical disc apparatus 1 includes a controller 62 for controlling operation of the servo system which has the spindle motor control unit 30 and the pickup control unit 40, or the record/playback signal processing unit 50, and an interface unit 64 for performing a function of interfacing (connecting) to a personal computer (hereafter referred to as PC) 3 which is an example of an information processing apparatus for performing various types of information processes by means of the optical disc apparatus 1, and to a playback apparatus (so-called CD player, so-called DVD player, etc.) 5 which plays back a sound and/or an image, (hereafter PC 3 and playback apparatus 5 may be referred to as main apparatus).

In the optical disc apparatus 1 of such a structure, at the time of playback processing, a light signal read from the optical disc PD by the optical pickup 14 is converted into an electric signal with the light receiving element built in the optical pickup 14. The electric signal is sent to the servo system (control system) having the spindle motor control unit 30 which controls the spindle motor 10 or the optical pickup 14, and the pickup control unit 40, and to the record/playback signal processing unit 50 which records and reproduces data.

Under control of the controller 62, the spindle motor control unit 30 and the pickup control unit 40 adjust the number of rotations of the spindle motor 10 and focusing and tracking of the optical pickup 14 based on the electric signal.

In addition to this, in the record/playback signal processing unit 50, the obtained analog electric signal is converted into digitized data to be decoded and then passed to the main apparatus which uses the optical disc apparatus 1, such as the PC 3 and the playback apparatus 5. The PC 3 and the playback apparatus 5 plays the decoded data back to the image and audio data.

Further, at the time of the record process of recording the data on the optical disc PD, the spindle motor control unit 30 and the pickup control unit 40 rotate the optical disc PD at a constant speed under control of the controller 62. While, in the record/playback signal processing unit 50, contrary to the reproduction, the data are encoded and supplied to the laser diode built in the optical pickup 14 etc., to thereby convert the electric signal into the light signal and record the information on the optical disc PD.

<Outline of Record and Signal Processing Unit>

Figure 2:
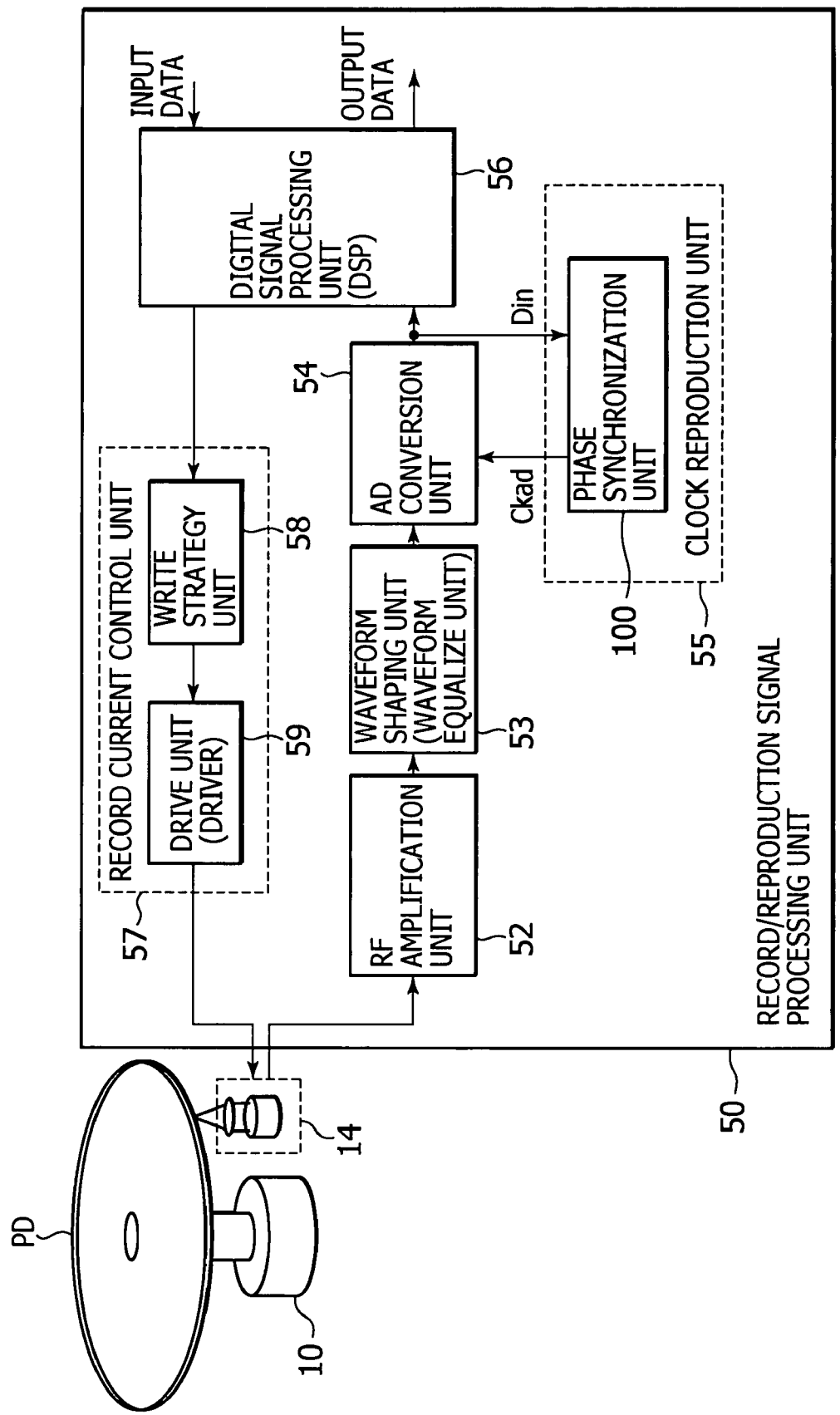
FIG. 2 is a functional block diagram showing an example of a structure of a record/playback signal processing unit.

FIG. 2 is a functional block diagram showing an example of a structure of the record/playback signal processing unit 50. As shown, the record/playback signal processing unit 50 includes an RF amplification unit 52 for amplifying a minute RF (high frequency) signal (hereafter also referred to as reproduction RF signal) read by the optical pickup 14 to a predetermined level, a waveform shaping unit (waveform equalizer; Equalizer) 53 for shaping the reproduction RF signal outputted from the RF amplification unit 52, and an AD conversion unit (ADC; Analog to Digital Converter) 54 for converting the analog reproduction RF signal outputted from the waveform shaping unit 53 into digitized data.

Since the signal read by the optical pickup 14 has various frequencies and its amplitude decreases at a high frequency, the signal itself causes interference between codes and cannot reproduce the data correctly. In order to compensate for this, the waveform shaping unit 53 carries out waveform equalization for the output signal of the RF amplification unit 52.

Further, the record/playback signal processing unit 50 includes a clock reproduction unit 55 for reproducing a clock signal (hereafter, may be simply referred to as clock) based on the digital data sequence outputted from the AD conversion unit 54, a digital-signal processing unit 56 constituted by DSP (Digital Signal Processor) which carries out digital signal processing, such as demodulating the digital data sequence (corresponding to the reproduction RF signal) outputted from the AD conversion unit 54, and decoding digital audio data, digital image data, etc., and a record current control unit 57 for controlling (ON/OFF switching) the record current of the laser light for recording the information on the optical disc PD.

As will be described later in detail, the clock reproduction unit 55 includes a data recovery type phase synchronization unit 100 which locks onto the digital data (digital data sequence Din) from the AD conversion unit 54 and generates a clock signal. The clock reproduction unit 55 supplies the reproduced clock signal to the AD conversion unit 54 as an AD clock (sampling clock) CKad, or supplies it to other functional parts. The AD conversion unit 54 converts an analog signal into digital data based on this AD clock CKad.

The record current control unit 57 has a write strategy unit (Write Strategy) 58 for carrying out multi-pulse modulation for optical output power according to a quality of material and a recording speed of the optical disc PD, and a drive unit (Laser Diode Driver) 59 provided with an APC (Auto Power Control) control circuit for holding optical output (optical intensity, optical output power) of the laser light emitted from the laser light source (provided within the optical pickup 14) at a constant value.

The optical beam for recording emitted from the laser light source is converted into parallel light by a collimator lens (not shown) in the optical pickup 14, passes through a beam splitter (not shown), and is focused with an object lens (not shown) then projected on the optical disc PD which is rotated and driven by the spindle motor 10. At this stage, since the optical beam for recording is modulated according to the information for recording, a pit sequence corresponding to the information is formed in a predetermined position (information record area) of the optical disc PD, whereby the information is recorded on the optical disc PD. At this stage, it is arranged that a data error due to form distortion of a pit (record mark) by means of the write strategy unit 58 is prevented in the present embodiment.

For example, as for the laser used as a light source, the semiconductor laser using a semiconductor device has been widely used as the light source for various types of apparatuses in recent years, since it is very small and responds to drive current at high speed. Further, as for the rewritable optical disc PD used as a medium for recording and reproduction, a phase-change optical disk, a magneto-optical disc, etc. are widely known and provide different outputs of the laser light irradiated when recording, reproducing and eliminating.

Generally, at the time of recording, in order to make the record mark (referred to as the pit on the optical disc PD), the output of the laser beam is increased (for example, 30 mW or more). In order to be able to read the information at the time of playback without destroying the record pit, the laser beam of a weaker output (for example, 3 mW) than that at the time of recording is projected onto the optical disc PD. In the recent optical disc PD of high density, of a high transmission rate, it is necessary to fully control the intensity of these laser beams in order to obtain an error rate allowing record/playback.

However, as for the semiconductor laser, a temperature characteristic of a drive current/optical output characteristic changes considerably. In order to set the optical output as desired intensity, a circuit (so-called APC control circuit) for controlling the optical output of the semiconductor laser to be constant is required. As for the APC control, a negative feedback control loop is arranged such that the feedback current obtained by monitoring the light signal when writing the information may be predetermined power reference current, so that laser luminescence power may be controlled to be constant.

Here, in the recent writable optical disc PD, mark edge recording is dominant in which changes at both ends of the record mark are recorded because of its advantage of high density. Further, in the write strategy unit 58, a write strategy technology which carries out multi-pulse modulation of the laser output power according to the quality of the material and a recording speed of a disk is employed as a technology of stopping the data error due to the form distortion of the mark when performing the mark edge recording (for example, see Japanese Unexamined Patent Application Publication (KOKAI) 2000-244054).

Phase Synchronization Unit

First Embodiment

Figure 3:
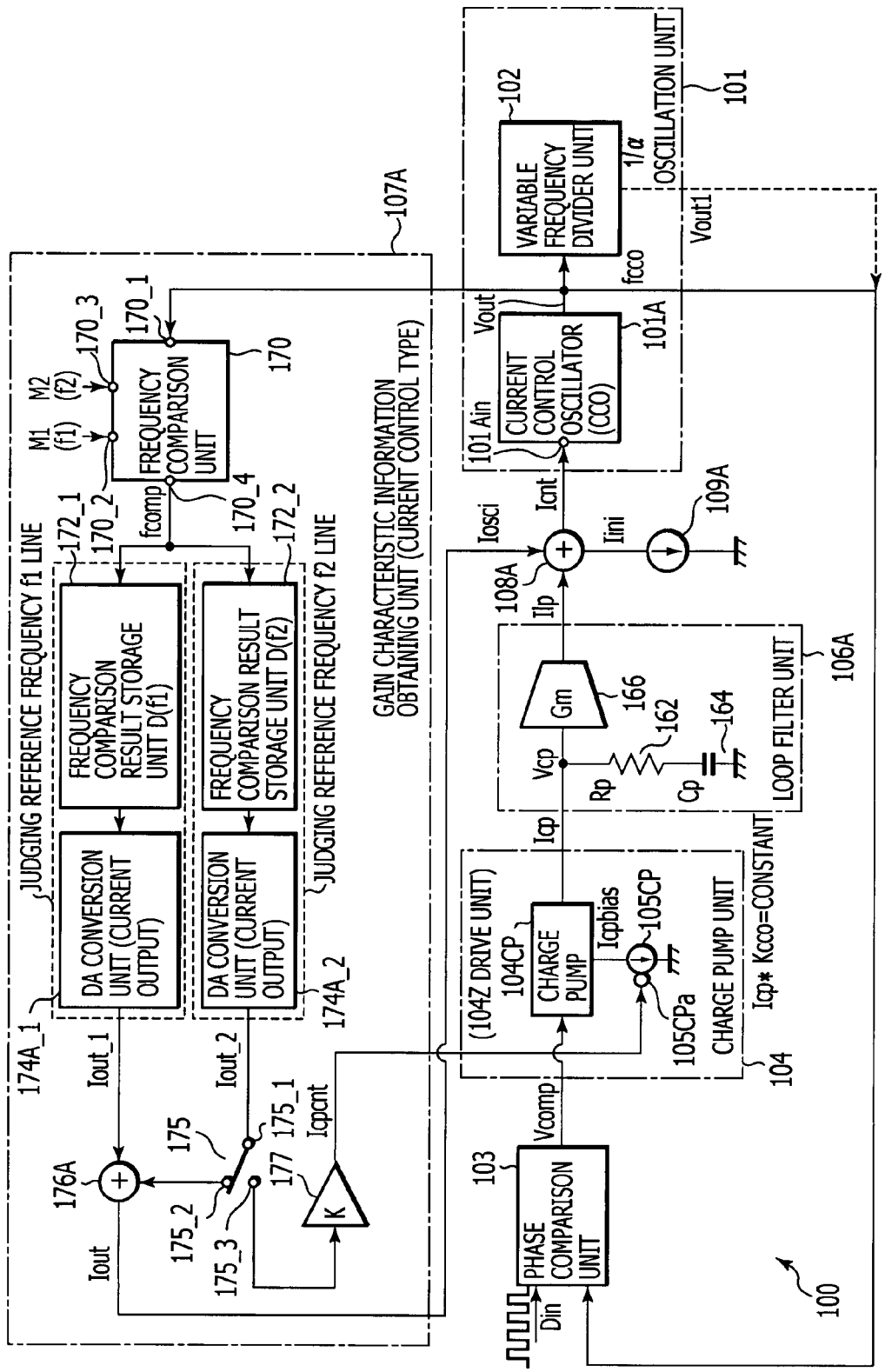
FIG. 3 is a functional block diagram showing a first embodiment of a phase synchronization unit.
Figure 4:
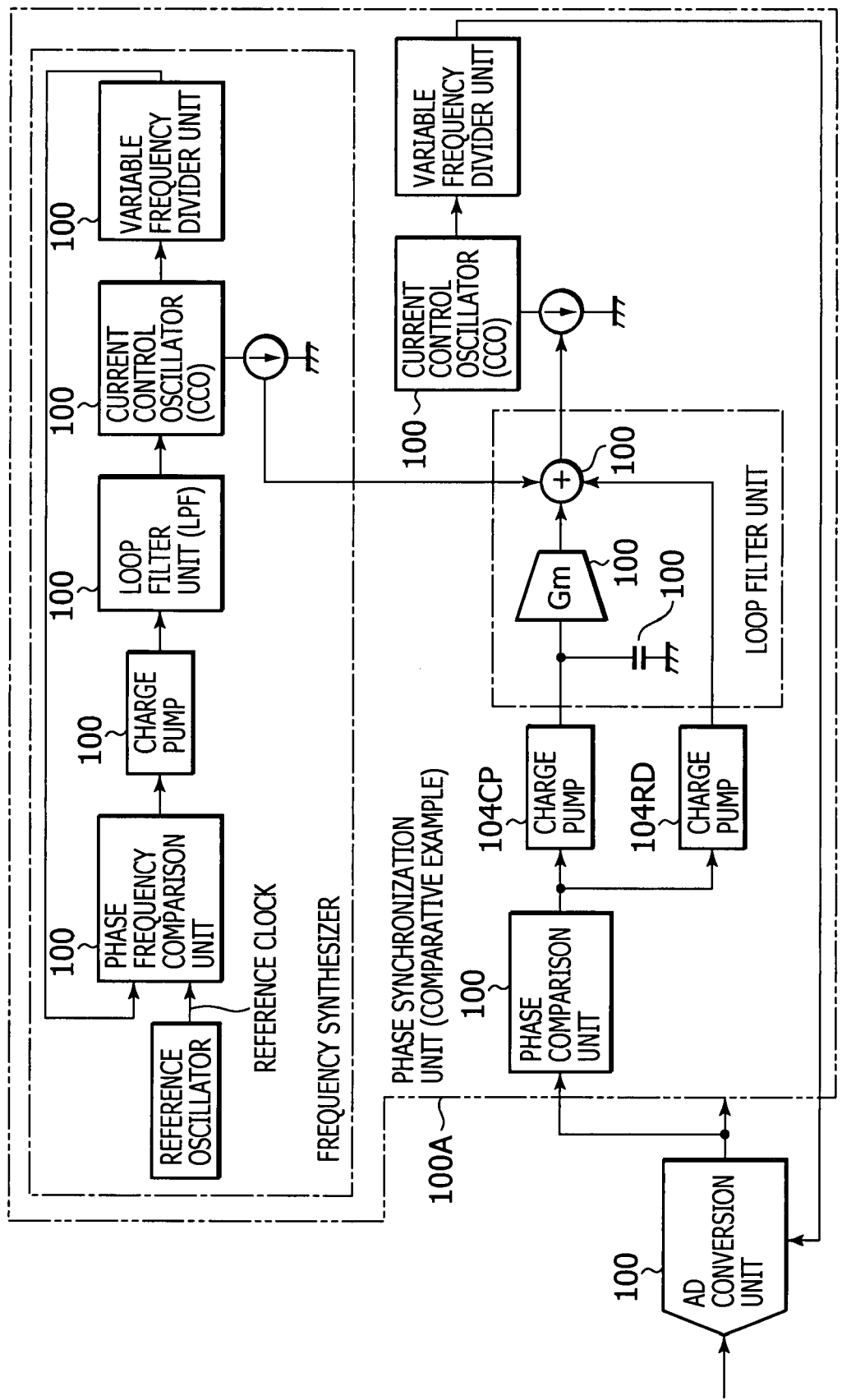
FIG. 4 is a block diagram showing an example of a structure of the phase synchronization unit when not applying a gain characteristic information obtaining unit as a comparative example.

FIG. 3 is a functional block diagram showing a first embodiment of the phase synchronization unit (phase synchronization circuit) 100. Further, FIG. 4 is a block diagram showing an example of a structure of a phase synchronization unit 100A when not applying the gain characteristic information obtaining unit as a comparative example. It should be noted that this comparative example shows an example in which two charge pumps 104CPs and 104RD are used for the charge pump unit 104, as with the second embodiment to be described later.

The phase synchronization unit 100 of this embodiment has a first feature that a current control oscillating circuit (CCO; Current Control Oscillator) is employed as the oscillation unit, and has a second feature that current output type one (gain characteristic information obtaining unit 107A) is provided as the gain characteristic information obtaining unit 107 for compensating for the manufacture variations and temperature characteristics of the frequency conversion gain characteristic of the current control oscillating circuit.

By using two types of target frequencies (judging reference frequencies f1 and f2), the gain characteristic information obtaining unit 107A synthesizes a predetermined regulation signal In with the compensation for oscillating the current control oscillation unit 101A at each frequency. While supplying this (as oscillation control current Icnt) to the current control oscillation unit 101A, it measures the information on the difference between the oscillation control signals of two types of target frequencies for specifying the input current-oscillation frequency conversion gain Kcco of the current control oscillation unit 101A in the real operating situation, to thereby obtain the information indicative of control current Icpcnt (an example of compensation signal) for compensating for the variations in the input current-oscillation frequency conversion gain Kcco and to store the information in a predetermined storage medium. And at the time of actual phase synchronizing operation, the control current Icpcnt shown by the stored information is used as the compensation signal, so that the drive part 104Z is controlled to offset the variations in the input current-oscillation frequency conversion gain Kcco.

In particular, the phase synchronization unit 100 of the first embodiment includes the current control oscillation unit (CCO) 101A. According to the oscillation control current Icnt supplied to a frequency control input terminal 101Ain and the input current-oscillation frequency conversion gain Kcco of itself, the current control oscillation unit 101A outputs the output oscillation signal Vout of an oscillation frequency fcco corresponding to the oscillation control current Icnt from an output terminal 101Aout.

The frequency division unit 102 for dividing the oscillation frequency fcco of the output oscillation signal Vout outputted from the output terminal 101Aout of the current control oscillation unit 101A into $1/\alpha$, and acquiring the frequency-divided oscillation signal Vout1 may be provided at the latter stage of the current control oscillation unit 101A, as necessary. In addition, a is a frequency division ratio which is a positive integer, preferably power of 2 (two) and variable.

Further, the phase synchronization unit 100 includes the phase comparison unit 103 for comparing the phases of the digital data sequence Din outputted from the AD conversion unit 54 and the output oscillation signal Vout from the current control oscillation unit 101A or the frequency-divided oscillation signal Vout1 (hereafter referred to as output oscillation signal Vout, as long as there is no notice) from the frequency division unit 102, and outputting an error signal indicating a phase difference which is a comparison result as the comparison result signal Vcomp, the charge pump unit 104 for outputting and inputting the charge pump current Icp according to the comparison result signal Vcomp outputted from the phase comparison unit 103, and a loop filter unit 106A for generating loop filter output current Ilp for controlling the oscillation frequency fcco of the current control oscillation unit 101A based on the charge pump current Icp from the charge pump unit 104.

In the phase synchronization unit 100 of the first embodiment, the charge pump unit 104 includes a charge pump 104CP for outputting and inputting the drive current (referred to as charge pump current Icp) according to the comparison result signal Vcomp outputted from the phase comparison unit 103, and a current source 105CP which is of a current value variable type and supplies bias current Icpbias to the charge pump 104CP.

The phase comparison unit 103 compares phases between the digital data sequence Din and the output oscillation signal Vout, and inputs into the charge pump 104CP the error signal showing the phase difference which is a comparison result as the comparison result signal Vcomp.

The current source 105CP of the current value variable type is arranged so that the charge pump current Icp can be controlled in the current mode. In particular, it is arranged that the control current Icpcnt supplied to a control input terminal 105CPa may be received in a current mirror form (1:1 is sufficient as the current mirror ratio) and the bias current Icpbias may be supplied to the charge pump 104CP. When the current mirror ratio is 1:1, control current Icpcnt=bias current Icpbias. The charge pump 104CP outputs the charge pump current Icp of $\beta$ times the bias current Icpbias.

By "control current Icpcnt is received in the current mirror form", we mean that it is arranged that, for example, N-channel type MOS (NMOS) transistors are connected in the current mirror form, one drain terminal commonly connected with the gate terminal is set as the control input terminal 105CPa to be supplied with the control current Icpcnt, and the bias current Icpbias is acquired at the drain terminal at the other terminal.

Further, the phase synchronization unit 100 of the first embodiment includes, at the latter stage of the charge pump 104CP, the loop filter unit 106A, the gain characteristic information obtaining unit 107A for compensating for the manufacture variations and temperature characteristics of the frequency conversion gain characteristics of the current control oscillation unit 101A, a current summing unit 108A for summing the current signal from each part to be supplied to the frequency control input terminal 101Ain of the current control oscillation unit 101A, a regulation current source 109A for supplying the current summing unit 108A with initial current Iini matched to the oscillation frequency fcco of the desired output oscillation signal Vout.

The current summing unit 108A is an example of the oscillation control signal generation unit which sums up the current signal from each part to generate the oscillation control current Icnt so that the phase of the output oscillation signal Vout may synchronize with the phase of the digital data sequence Din.

Here, by "the initial current Iini matched to the oscillation frequency fcco of the desired output oscillation signal Vout" is meant an amount of current by which the oscillation frequency fcco having the desired frequency may be obtained only with the initial current Iini in the case where other currents (the loop filter output current Ilp and frequency control current Iosci from the gain characteristic information obtaining unit 107A) are not inputted into the current summing unit 108A under a standard or ideal condition.

In the case where there are plural types of desired frequencies (=oscillation frequency fcco), the initial current Iini optimized for each of the desired frequencies (=oscillation frequency fcco) is set up. For this reason, each time a data rate (frequency) of the digital data sequence Din is switched, the initial current Iini of the regulation current source 109A is switched.

Although not shown, as a structure for this, it is preferably arranged that the regulation current source 109A for each frequency to which the individual initial current Iini matched with the frequency is set is provided for every frequency, every time the data rate (frequency) of the digital data sequence Din is switched, the regulation current source 109A for each frequency is switched to that matched with the frequency.

In this way, the frequency control current Iosci based on the gain compensation processing by the gain characteristic information obtaining unit 107A may only be an amount of current with which a difference between the desired frequency and the oscillation frequency fcco in the real operating situation under the initial current Iini (and the loop filter output current Ilp) can be compensated for. As a result, one initial current Iini is matched to a certain desired frequency, and an amount of compensation current (=the frequency control current Iosci) with which the gain characteristic information obtaining unit 107A should cope can be reduced compared with the case where the correspondence to the plural types of desired frequencies is attended with the frequency control current Iosci from the gain characteristic information obtaining unit 107A.

The loop filter unit 106A of the first embodiment is arranged to correspond to a current output so as to suit the current control oscillation unit 101A. In particular, the loop filter unit 106A has a capacitor (capacitance element) 164 of the loop filter capacitance Cp, and the voltage/current conversion unit (transconductance) 166 of a voltage current conversion gain Gm.

An output of the charge pump 104CP is commonly connected to one terminal of the capacitor 164 and an input of the voltage/current conversion unit 166. The other terminal of the capacitor 164 is connected to grounding (GND) which is a reference potential. When the phase synchronization unit 100 is constituted by an IC (semiconductor integrated circuit), the capacitor 164 is connected outside the IC.

Based on the charge pump current Icp outputted from the charge pump 104CP, a voltage signal (referred to as charge pump voltage Vcp) is generated at one terminal (that is, input of the voltage/current conversion unit 166) of the capacitor 164 in the loop filter unit 106A.

Since it is an operation of charging/discharging the capacitor 164, the loop filter unit 106A functions as a low-pass filter of at least one cutoff frequency, where a frequency component which is equal to or greater than a predetermined cutoff frequency (also referred to as roll-off frequency or poll) out of the comparison result signal Vcomp from the phase comparison unit 103 is attenuated so that the oscillation control current Icnt supplied to the current control oscillation unit 101A may be smoothed.

In addition, as with the third embodiment, it is possible to raise the function as the low-pass filter by connecting not only the capacitor 164 but also a resistance element 162 of loop filter resistance Rp in series. Unlike the second embodiment, when it is arranged that one charge pump 104CP is provided as a charge pump unit 104, the arrangement where this resistance element 162 is provided is usually adopted.

Based on the charge pump current Icp outputted from the charge pump 104CP, the voltage/current conversion unit 166 converts the charge pump voltage Vcp generated at one terminal (that is, input of the voltage/current conversion unit 166) of the capacitor 164 into a current signal (referred to as loop filter output current Ilp) according to the voltage current conversion gain Gm.

When connecting the resistance element 162 and the capacitor 164 in series, the whole voltage current conversion gain (from the charge pump unit 104 to the loop filter unit 106A) is Gm (Rp+1/sC) (s is jw) because of the effect of the resistance element 162.

The gain characteristic information obtaining unit 107A of the first embodiment includes a frequency comparison unit 170 for comparing the oscillation frequency fcco of the output oscillation signal Vout outputted from the current control oscillation unit 101A with two types of judging reference frequencies f1 and f2, a first frequency comparison result storage unit 172_1 for holding the frequency comparison result fcomp (as N-bit digital data D(f1)) resulting from comparison with the first judging reference frequency f1 in the frequency comparison unit 170, a second frequency comparison result storage unit 172_2 for holding the frequency comparison result fcomp (as N-bit digital data D(f2)) resulting from comparison with the second judging reference frequency f2 in the frequency comparison unit 170, and DA conversion units 174A_1 and 174A_2 as a DA conversion unit (DAC; Digital to Analog Converter) 174 for converting the frequency comparison result fcomp of each N-bit stored at each of the frequency comparison result storage units 172_1 and 172_2 into an analog signal.

In the frequency comparison unit 170, the output oscillation signal Vout is supplied from the current control oscillation unit 101A to the signal input terminal 170_1. The information for specifying the judging reference frequencies f1 and f2 respectively is supplied to the judging reference frequency setup terminals 170_2 and 170_3, and the frequency comparison result fcomp is outputted from the judgment result output terminal 170_4.

With respect to the respective judging reference frequencies f1 and f2 as the target frequency, the frequency comparison unit 170 compares magnitudes between the oscillation frequency fcco of the output oscillation signal Vout outputted from the current control oscillation unit 101A and the judging reference frequencies f1 and f2, and passes the frequency comparison result fcomp to the frequency comparison result storage units 172_1 and 172_2.

Here, the information which respectively specifies the judging reference frequencies f1 and f2 may be information which specifies the judging reference frequencies f1 and f2 directly and respectively. Alternatively, it may be information substantially allowing specification of the judging reference frequencies f1 and f2 respectively, such as frequency division ratios M1 and M2 in relation with the reference signal etc. As will be described later in detail, the latter is adopted in the frequency comparison unit 170 of this embodiment.

Further, although it will be described later in detail, the N-bit digital data corresponding to a frequency difference between the judging reference frequency f1 and the judging reference frequency f2 is stored at the frequency comparison result storage unit 172_2. Since it is a value corresponding to the frequency difference between the judging reference frequency f1 and the judging reference frequency f2, the N-bit digital data stored by this frequency comparison result storage unit 172_2 reflects the input current-oscillation frequency conversion gain Kcco of the current control oscillation unit 101A.

Furthermore, as for the DA conversion units 174A_1 and 174A_2 of the first embodiment, one that is of the current output type is used so that the oscillation control signal CN supplied to the frequency control input terminal 101Ain of the current control oscillation unit 101A may be matched with the oscillation control current Icnt as much as possible.

Still further, the gain characteristic information obtaining unit 107A of the first preferred embodiment includes a path selection switch 175 for switching a path of an output current signal Iout_2 of the second DA conversion unit 174A_2 taken into an input terminal 175_1, a current summing unit 176A for summing an output current signal Iout_1 of the first DA conversion unit 174A_1 and the output current signal Iout_2 of the second DA conversion unit 174A_2 through one output terminal 175_2 of the path selection switch 175, and a current/current conversion unit 177 for amplifying the output current signal Iout_2 of the second DA conversion unit 174A_2 through another output terminal 175_3 of the path selection switch 175 to K times (K is current mirror ratio, to be set forth later).

Based on the frequency comparison result for each bit stored in the frequency comparison result storage units 172_1 and 172_2, the DA conversion units 174A_1 and 174A_2 generate the output current signals Iout_1 and Iout_2 (which are examples of the frequency control signal in order of bit) one by one with respect to each of the judging reference frequencies f1 and f2. In between bit order stages, the oscillation frequency fcco is not caused to be the judging reference frequencies f1 and f2. However, in the finally obtained output current signals Iout_1 and Iout_2, the oscillation frequency fcco is in a situation where it is substantially in agreement with the judging reference frequencies f1 and f2.

The current summing unit 176A sums the output current signal Iout_1 outputted from the DA conversion unit 174A_1 with respect to the judging reference frequency f1 and the output current signal Iout_2 outputted from the DA conversion unit 174A_2 with respect to the judging reference frequency f2 to find the final frequency control current Iosci (frequency control signal) and supplies it to the current summing unit 108A which is an example of the oscillation control signal generation unit.

The frequency comparison result storage unit 172_1 and the DA conversion unit 174A_1 are in relation to the judging reference frequency f1 which is the first target frequency, and they constitute the first frequency control signal acquisition unit together with the frequency comparison unit 170 and the current summing unit 176A, in which the output current signal Iout_1 that is a difference from the regulation signal In required for causing the oscillation frequency fcco of the output oscillation signal Vout outputted from the current control oscillation unit 101A to be the judging reference frequency f1 (first target frequency) is acquired as a first frequency control signal for the judging reference frequency f1.

The frequency comparison result storage unit 172_2 and the DA conversion unit 174A_2 are in relation to the judging reference frequency f2 which is the second target frequency, and they constitute the second frequency control signal acquisition unit together with the frequency comparison unit 170 and the current summing unit 176A, where the output current signal Iout_2 that is a difference from the signal obtained in such a way that the regulation signal In required for causing the oscillation frequency fcco of the output oscillation signal Vout outputted from the current control oscillation unit 101A to be the judging reference frequency f2 (second target frequency) is compensated by the output current signal Iout_1 (first frequency control signal) is acquired as the second frequency control signal for the judging reference frequency f2.

The path selection switch 175 supplies the output current signal Iout_2 outputted from the DA conversion unit 174A_2 with respect to the judging reference frequency f2 to the current summing unit 176A at the time of acquiring the compensation information, and in turn supplies it to the charge pump unit 104 side which is an example of the drive unit 104Z at the time of the usual phase synchronizing operation.

When "supplying it to the charge pump unit 104 side", as shown, it is possible to convert it into the control current Icpcnt through the current/current conversion unit 177, then to supply it. Alternatively, like a modification to be set forth later, by devising the structure of the DA conversion unit 174A_2, the output current signal Iout_2 can be directly supplied as the control current Icpcnt, not via the current/current conversion unit 177.

The current summing unit 176A supplies the summing result (Iout) of the output current signal Iout_1 and the output current signal Iout_2 to the current summing unit 108A as the frequency control current Iosci. Further, the current/current conversion unit 177 supplies current of K times the output current signal Iout_2 of the second DA conversion unit 174A_2, as the control current Icpcnt, to the control input terminal 105CPa of the current-value variable-type current source 105CP.

Here, the frequency comparison unit 170 compares magnitudes between the oscillation frequency fcco of the output oscillation signal Vout and the judging reference frequencies f1 and f2, and outputs the frequency comparison result fcomp by either "0" or "1", which are digital data. For example, "1" is outputted when the oscillation frequency fcco is higher than the judging reference frequencies f1 and f2, and "0" is outputted when the oscillation frequency fcco is lower than the judging reference frequencies f1 and f2. Therefore, as a comparison result, the N-bit digital data cannot be obtained simply by comparing magnitudes between the oscillation frequency fcco of the output oscillation signal Vout and the judging reference frequencies f1 and f2 in the frequency comparison unit 170.

As will be described later in detail, a frequency search by using binary search method is used in this embodiment so that the oscillation frequency fcco of the output oscillation signal Vout may approach the judging reference frequencies f1 and f2, the frequency control current Iosci which reflects the frequency comparison result fcomp in the frequency comparison unit 170 is supplied to the current control oscillation unit 101A, and the frequency comparison unit 170 compares again (finally N times) magnitudes between the oscillation frequency fcco of the output oscillation signal Vout and the judging reference frequencies f1 and f2 similarly. As a result, it is possible that weighting of the comparison result becomes small every time it is repeated (finally N repetitions).

Then, in the frequency comparison result storage units 172_1 and 172_2, the first frequency comparison result fcomp is stored at a higher bit in N bits in conjunction with N comparison processes in the frequency comparison unit 170, subsequently it is stored at a lower bit one by one. In other words, the frequency comparison result storage units 172_1 and 172_2 store the frequency comparison result fcomp by the frequency comparison unit 170 in order of bit-weighting for each bit one by one with respect to each of the judging reference frequencies f1 and f2.

Thus, finally the N-bit digital data is stored in the frequency comparison result storage units 172_1 and 172_2. By way of N searches, the N-bit digital data indicating the output current signals Iout_1 and Iout_2 which can gradually bring the oscillation frequency fcco of the output oscillation signal Vout close to the judging reference frequencies f1 and f2 are stored in order in the frequency comparison result storage units 172_1 and 172_2.

The current summing unit 108A sums the initial current Iini matched to the oscillation frequency fcco of the desired output oscillation signal Vout supplied from the regulation current source 109A, the loop filter output current Ilp outputted from the voltage/current conversion unit 166, and the frequency control current Iosci from the current summing unit 176A of the gain characteristic information obtaining unit 107A, to thereby find the oscillation control current Icnt supplied to the frequency control input terminal 101Ain of the current control oscillation unit 101A.

The current/current conversion unit 177 is an example of a signal conversion unit in which the control current Icpcnt to be supplied to the current source 105CP is obtained by taking K times (method for setting K will be described later) the output current signal Iout_2 outputted from the DA conversion unit 174A_2 based on the data obtained by the compensation processing in the gain characteristic information obtaining unit 107A and stored at the frequency comparison result storage unit 172_2.

In the phase synchronization unit 100 of the first embodiment of such a structure, the phase comparison unit 103 compares phases between the digital data sequence Din outputted from the AD conversion unit 54 and the output oscillation signal Vout from the current control oscillation unit 101A (or the frequency-divided oscillation signal Vout1 outputted from the frequency division unit 102).

The output voltage Vcomp (which is phase error information) of the phase comparison unit 103 is converted into the oscillation control current Icnt through the charge pump 104CP, the loop filter unit 106A, and the current summing unit 108A, and is supplied to the current control oscillation unit 101A. While the oscillation frequency (=oscillation frequency fcco) of the output oscillation signal Vout outputted from the current control oscillation unit 101A is controlled and a phase is locked to the digital data sequence Din of the output oscillation signal Vout. This output oscillation signal Vout is used as the AD clock CKad of the AD conversion unit 54, for example.

<Example of Structure of Oscillation Unit>

FIG. 5 is a diagram showing an example of a structure of the oscillation unit used in the phase synchronization unit 100. It should be noted that the example of the structure of the current control oscillation unit 101A of the first embodiment and the example of the structure of a voltage control oscillation unit 101B used in the phase synchronization unit 100 of the third embodiment to be described later can be similarly shown in terms of circuit structures. Here, the current control oscillation unit 101A and the voltage control oscillation unit 101B will be described collectively.

Figure 5A:
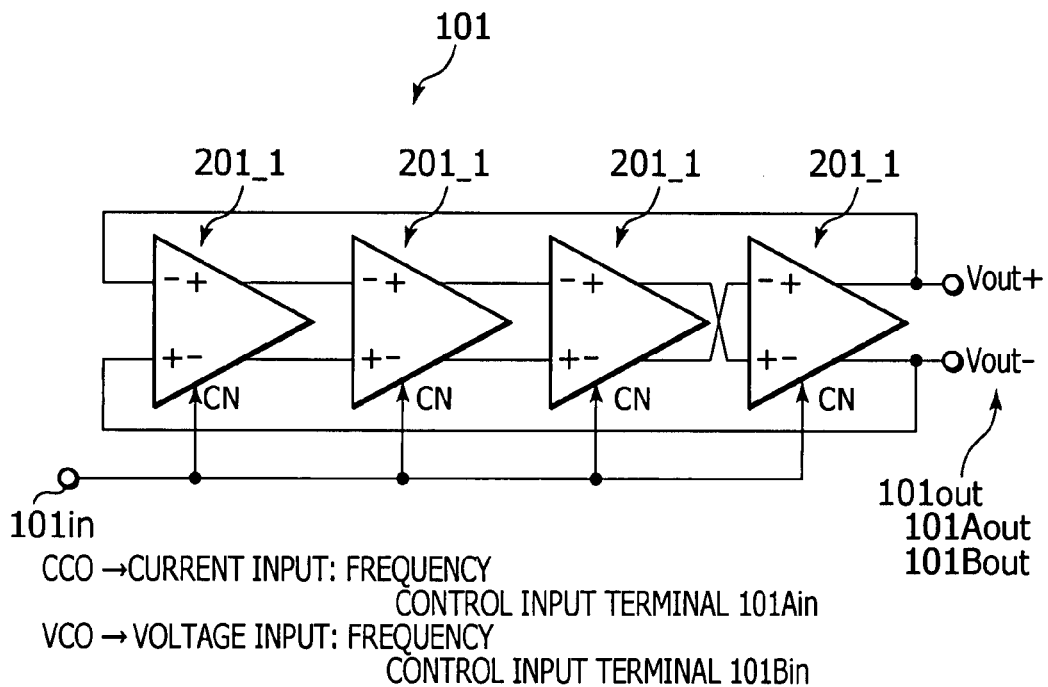
FIG. 5A is a diagram showing an example of a structure of an oscillation unit used in the phase synchronization unit.

As shown in FIG. 5A, the current control oscillation unit 101A and the voltage control oscillation unit 101B (collectively referred to as oscillation unit 101) are provided with a predetermined number (four stages in this example) of delay cells (also referred to as delay stage) 201 between a frequency control input terminal 101in (101Ain, 101Bin) and an output terminal 101out (101Aout and 101Bout).

The oscillation unit 101 serves as negative feedback in terms of connection so as to constitute a differential ring oscillator as a whole. At the time of operation, it serves as positive feedback because of phase shifts by internal RC. For example, cascade connection arrangement is carried out for each delay cell 201, further the output signal of the last-stage delay cell 201_4 is returned to the input of a first-stage delay cell 201_1.

In this example, non-inverted output (+) of the first delay cell 201_1 is connected with an inverse input (−) of a second delay cell 201_2, and inverse output (−) of the first delay cell 201_1 is connected to non-inverted input (+) of the second delay cell 201_2. Further, non-inverted output (+) of the second of delay cell 201_2 is connected with inverse input (−) of a third delay cell 201_3, and inverse output (−) of the second delay cell 201_2 is connected to non-inverted input (+) of the third delay cell 201_3.

On the other hand, non-inverted output (+) of the third delay cell 201_3 is connected with non-inverted input (+) of a fourth delay cell 201_4, and inverse output (−) of the third delay cell 201_3 is connected to inverse input (−) of the fourth delay cell 201_4. For this reason, in order to constitute positive feedback as a whole, non-inverted output (+) of the fourth delay cell 201_4 is connected with inverse input (−) of the first delay cell 201_1, and inverse output (−) of the fourth delay cell 201_4 is connected to non-inverted input (+) of the first delay cell 201_1.

Either of two output terminals 101out (non-inversed output (+) and inverse output (−) of the fourth delay cell 201) of the oscillation unit 101 is used as the output terminal 101Aout of the current control oscillation unit 101A, or an output terminal 101Bout of the voltage control oscillation unit 101B.

Figure 5B:
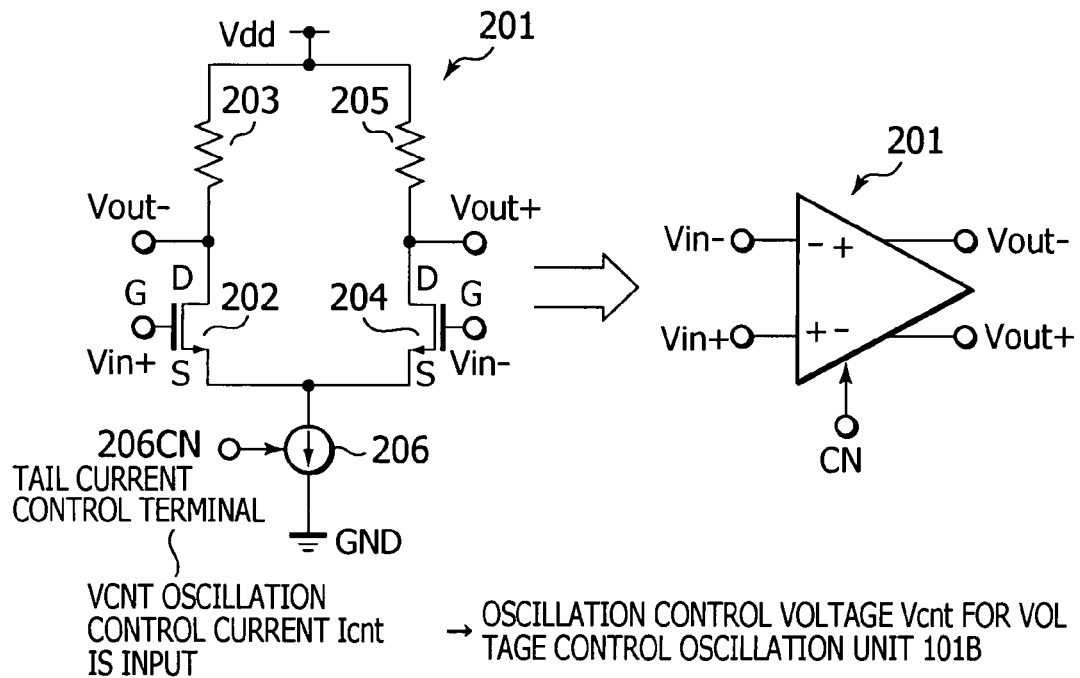
FIG. 5B is a diagram showing an example of details of cell of an oscillation unit used in the phase synchronization unit.

As shown in FIG. 5B, each delay cell 201 is constituted by a differential circuit using two transistors (here field effect transistors) 202 and 204. In particular, a gate G of one transistor 202 serves as non-inverted input (Vin+). Its drain D is connected to a power supply Vdd through a resistance element 203, and the drain D serves as inverse output (Vout−). Further, the gate G of the other transistor 204 serves as inverse input (Vin−). The drain D is connected to the power supply Vdd through a resistance element 205, and the drain D serves as non-inverted output (Vout+). Furthermore, sources S of the transistors 202 and 204 are commonly connected to the reference potential (grounding potential GND in this example) through a current source 206 of the current value variable type.

The current source 206 of current value variable type receives the oscillation control signal CN, to be supplied to a control input terminal 206CN, in the current mirror form (1:1 is sufficient as the current mirror ratio) and supplies bias current to the transistors 202 and 204.

The respective control input terminals 206CN of the respective delay cells 201 are connected to the frequency control input terminal 101in in common. The oscillation control signal CN supplied through the frequency control input terminal 101in to each control input terminal 206CN is the oscillation control current Icnt in the case of the current control oscillation unit 101A, and is the oscillation control voltage Vcnt in the case of the voltage control oscillation unit 101B.

Loop Characteristic of Phase Synchronization Unit

First Embodiment

Here, as for the analysis of the phase synchronization unit 100 of the first embodiment of operation, it is possible to use the linearized closed loop transfer function which is usual for analyzing the so-called charge pump PLL.

As for the phase synchronization unit 100 of the first embodiment, in the case of the charge pump current Icp of the charge pump 104CP, the input current-oscillation frequency conversion gain Kcco of the current control oscillation unit 101A, the loop filter resistance Rp of the resistance element 162, the loop filter capacitance Cp of the capacitor 164, and a frequency division ratio α of the frequency division unit 102, its zone (natural angle frequency or natural frequency, hereafter simply referred to as zone) ωn and damping factor ζ can be expressed by equation (2-1) and equation (2-2). In addition, it can be seen that there is a relationship as shown in equation (2-3) and equation (2-4) from comparison with equation (1). Further, equation (2-5) can be derived from equation (2-1) and equation (2-2).

$$\left.\begin{array}{ll}\omega n = \sqrt{\dfrac{Icp \cdot Kcco}{Cp \cdot \alpha}} & (2\text{-}1) \\ \zeta = \dfrac{Cp \cdot Rp}{2}\omega n & (2\text{-}2) \\ Klp = 1 & (2\text{-}3) \\ Flp = Rp & (2\text{-}4) \\ \omega n, \zeta \propto \sqrt{Icp \cdot Kcco} & (2\text{-}5)\end{array}\right\} \quad (2)$$

where, for example, in the case of applying the phase synchronization unit 100 to the optical disc apparatus 1, in order to set the zone ωn as a value specified in compliance with the standards of three types of optical discs PD (the next generation DVD, such as a blue-ray disc, the usual DVD, and CD) based on equation (2-1), when the phase synchronization unit 100 is IC, the resistance element 162 and the capacitor 164 are connected outside the IC, and the loop filter resistance Rp and loop filter capacitance Cp have constant values, therefore, the charge pump current Icp, the frequency division ratio α, or the input current-oscillation frequency conversion gain Kcco must be adjusted. It should be noted that, in the first embodiment, when the zone ωn is changed, as can be seen from equation (2-2), the damping factor ζ changes in proportion to the zone ωn.

However, even if a setup of the zone ωn is realized by the design to be matched with the optical discs PD by adjusting the charge pump current Icp, the frequency division ratio α, and the input current-oscillation frequency conversion gain Kcco, and when IC is actually manufactured, the parameters (such as the charge pump current Icp of the charge pump 104CP, the voltage current conversion gain Gm of the voltage/current conversion unit 166, the input current-oscillation frequency conversion gain Kcco of the current control oscillation unit 101A, etc.) which determine the zone ωn may vary from designed values. Therefore, it could be difficult to set the zone ωn to the desired value. Furthermore, considering that it is usually used in various places, since these parameters also change with temperatures, the zone ωn further shifts from a preset value.

Therefore, in order that neither the zone ωn nor the damping factor ζ is influenced by the manufacture variations or temperature characteristics, it is necessary to compensate for the manufacture variations and the temperature characteristics of the charge pump current Icp of the charge pump 104CP, the voltage current conversion gain Gm of the voltage/current conversion unit 166, the input current-oscillation frequency conversion gain Kcco of the current control oscillation unit 101A, etc.

For example, as a parameter having a manufacture variation or a temperature characteristic, attention will now be paid to the input signal-oscillation frequency conversion gain Kosci of the oscillation unit 101. The input signal-oscillation frequency conversion gain Kosci is the input current-oscillation frequency conversion gain Kcco at the time of the current control oscillation unit 101A, and is the input voltage-oscillation frequency conversion gain Kvco at the time of the voltage control oscillation unit 101B.

Figure 6:
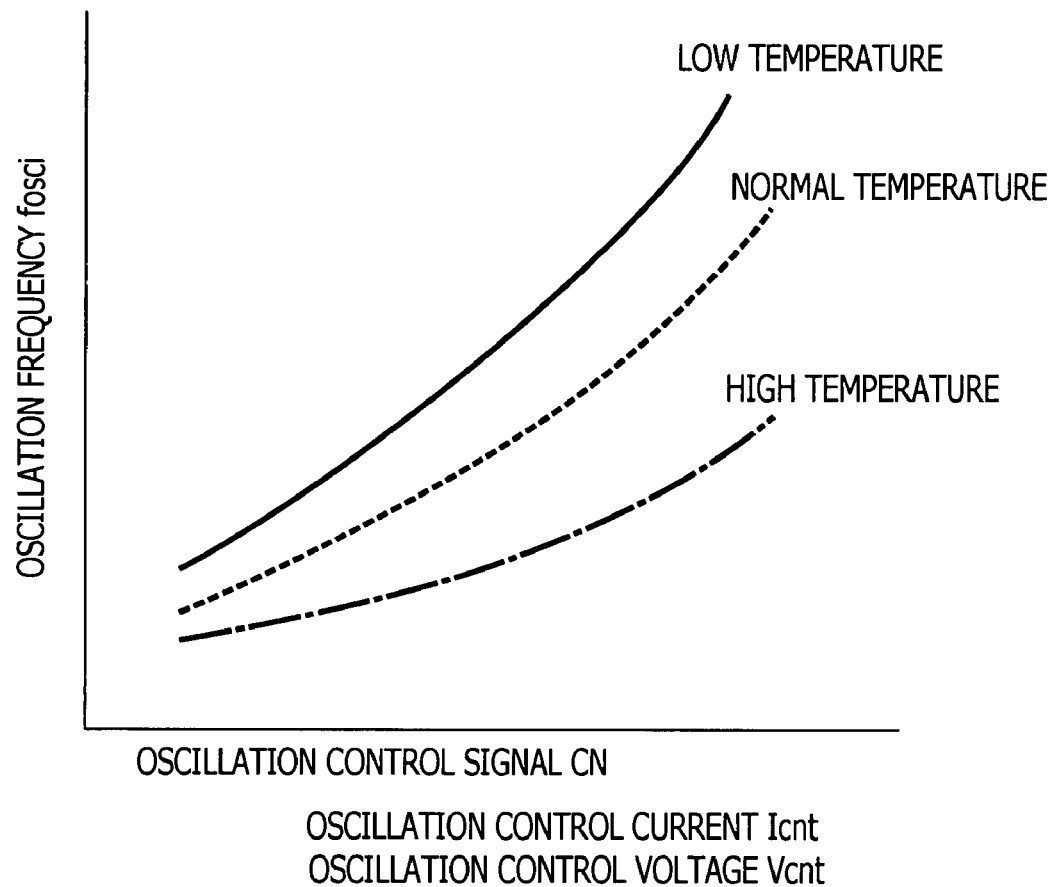
FIG. 6 is a graph showing an example of a characteristic of an input signal-oscillation frequency conversion gain Kosci of the oscillation unit as shown in FIG. 5.

FIG. 6 is a graph showing an example of the characteristic of the input signal-oscillation frequency conversion gain Kosci of the oscillation unit 101 as shown in FIG. 5.

Even if the oscillation control signal CN (i.e., the oscillation control current Icnt or the oscillation control voltage Vcnt) supplied to the frequency control input terminal 101in of the oscillation unit 101 is fixed, the value of the transconductance Gm of a differential pair of the delay cell 201 and a value of a load may change with the manufacture variation or temperature. Therefore, the input signal-oscillation frequency conversion gain Kosci (i.e., the input current-oscillation frequency conversion gain Kcco or the input voltage-oscillation frequency conversion gain Kvco) may be changed from half to twice the design value, for example, as shown in FIG. 6. According to equation (2), this means that the zone ωn and the damping factor ζ of the phase synchronization unit 100 (PLL) change from $1/\sqrt{2}$ to $\sqrt{2}$ times.

If the zone ωn shifts from the preset value considerably, since a period until the phase of the output oscillation signal Vout locks to the digital data sequence Din (i.e., acquisition time) also changes away from the preset value, it is difficult to design the system. Furthermore, if the zone ωn is shifted low, a jitter increases Here, what is understood from equation (2-5) is that the zone ωn and the damping factor ζ are proportional to root (route; square root) of a product (=Icp·Kosci) of the charge pump current Icp and the input signal-oscillation frequency conversion gain Kosci and that if the product (=Icp·Kosci) is constant, the zone ωn and the damping factor ζ remain unchanged.

Paying attention to this point, in the case of applying the phase synchronization unit 100 to the optical disc apparatus 1, when the zone ωn and the damping factor ζ are set as the values specified in compliance with the standard for each optical disc PD by adjusting the charge pump current Icp and the input signal-oscillation frequency conversion gain Kosci based on equation (2-1), if the manufacture variation and the temperature change rise in the input signal-oscillation frequency conversion gain Kosci, and if the charge pump current Icp is adjusted to offset the variation and change based on equation (2-5) and to cause Icp·Kosci to be constant, then the zone ωn and the damping factor ζ can be prevented from being influenced by the manufacture variations or the temperature characteristics.

In other words, by adjusting the charge pump gain Icp so that the shifts caused by the manufacture variations, the temperature change, etc. of the input signal-oscillation frequency conversion gain Kosci may be offset, it is possible to compensate for the manufacture variations or temperature characteristics of the input signal-oscillation frequency conversion gain Kosci and to cause the zone ωn and the damping factor ζ to be the desired constant values.

The gain characteristic information obtaining unit 107A of this embodiment is provided paying attention to this point, and is arranged such that the characteristic in the real operating situation of the input signal-oscillation frequency conversion gain Kosci of the oscillation unit 101 is measured in order to offset the shifts of the input signal-oscillation frequency conversion gain Kosci by means of the charge pump current Icp. Based on the measurement result, the manufacture variations and the temperature characteristics of the input signal-oscillation frequency conversion gain Kosci are compensated by adjusting the charge pump current Icp. Hereafter, the gain characteristic information obtaining unit 107A will be described in detail.

<Outline of Operation of Gain Characteristic Information Obtaining Unit>

Figure 7:
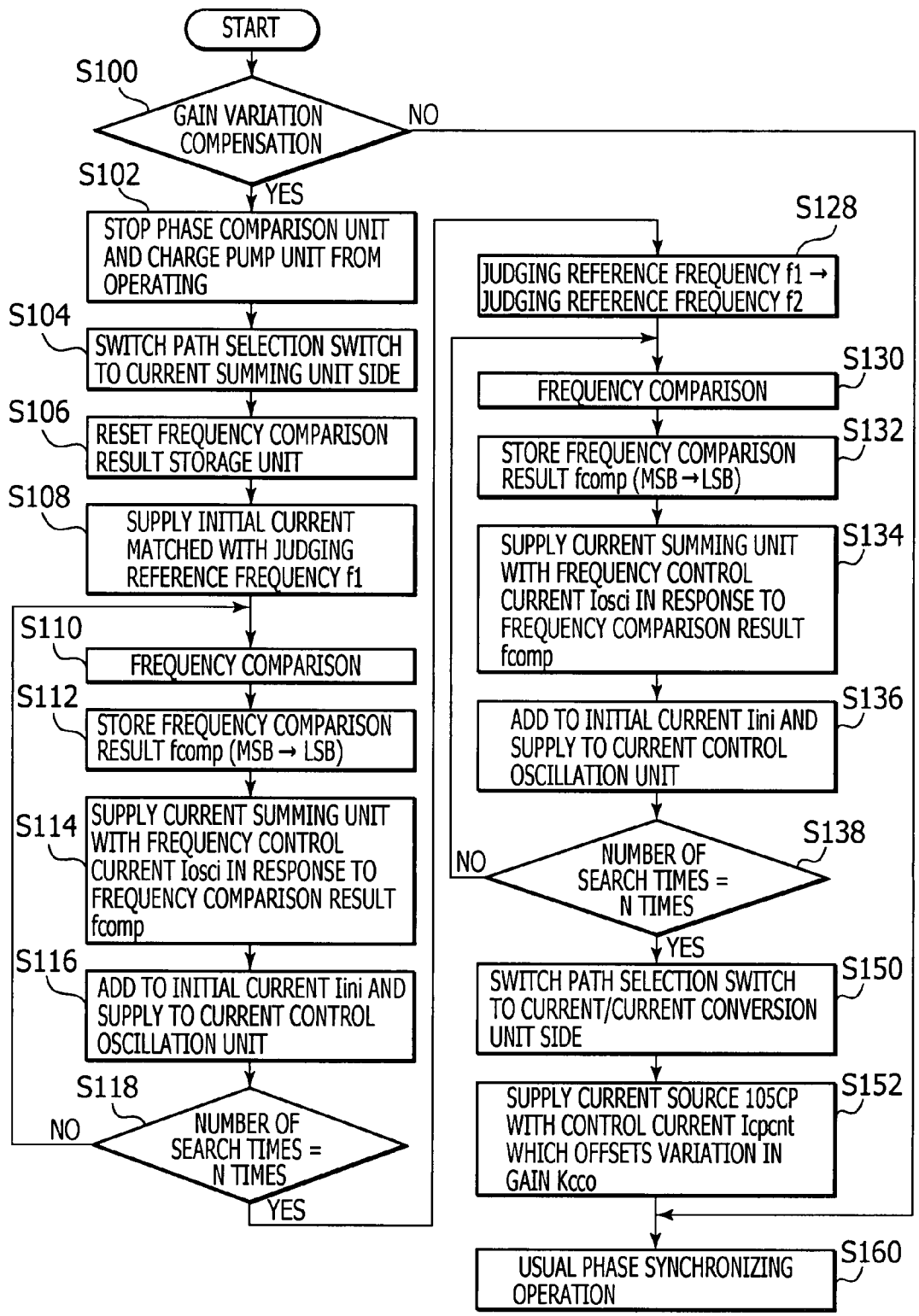
FIG. 7 is a flow chart showing an example of an operational procedure for the gain characteristic information obtaining unit.
Figure 8:
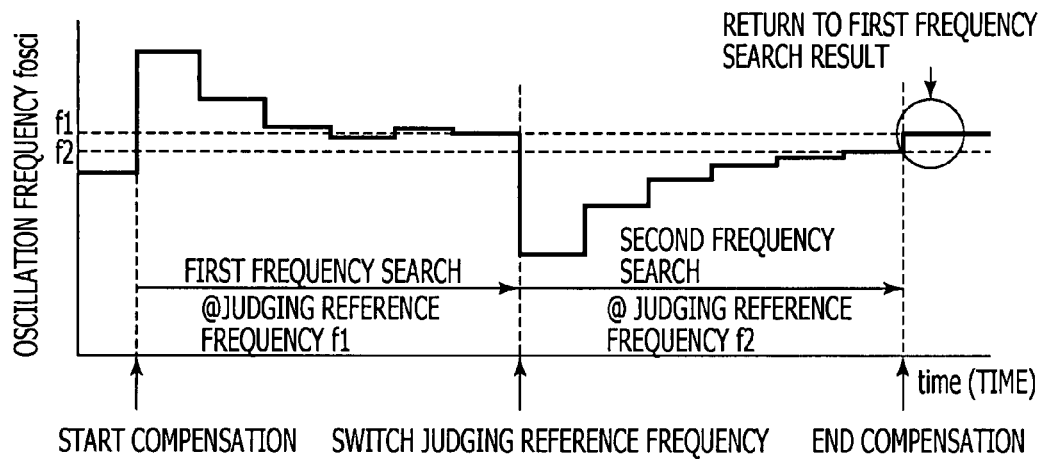
FIG. 8 is a timing chart (N=6, by way of example) of operation of the gain characteristic information obtaining unit.

FIGS. 7 and 8 are charts for explaining an outline of operation of the gain characteristic information obtaining unit 107A. FIG. 7 is a flow chart showing an example of a procedure for the gain characteristic information obtaining unit 107A, and FIG. 8 is a timing chart of operation of the gain characteristic information obtaining unit 107A. In addition, FIG. 8 shows a case where the number of times (=N) of the frequency search by using binary searches is 6.

Before carrying out the phase synchronizing operation with the digital data sequence Din, in the phase synchronization unit 100 of this embodiment, the compensation for the variations of the input current-oscillation frequency conversion gain Kcco of the current control oscillation unit 101A is performed according to the following procedures.

In this case, the gain characteristic information obtaining unit 107A has a feature that the input current-oscillation frequency conversion gain Kcco in the real operating situation is measured, and a drive capability (in particular, amount of the charge pump current Icp) of the charge pump unit 104 which drives the loop filter unit 106A is controlled based on the measurement result so that the variation in the input current-oscillation frequency conversion gain Kcco may be offset. Here by "the variation in the input current-oscillation frequency conversion gain Kcco may be offset" we mean that the product of the input current-oscillation frequency conversion gain Kcco and the charge pump current Icp is arranged to be constant. Hereafter, outline of a processing procedure will be described first.

First, when beginning compensation (S100—YES), operation of the phase comparison unit 103 and the charge pump 104CP is stopped (S102). The path selection switch 175 is turned to the output terminal 175_2 side (the current summing unit 176A side) (S104). The data of the frequency comparison result storage units 172_1 and 172_2 are reset to zero (S106). Further, the initial current Iini is supplied to the current summing unit 108A so that the initial current matched with the judging reference frequency f1 in the first frequency search by using binary search is given to the current control oscillation unit 101A to oscillate as the oscillation control current Icnt (S108).

The frequency comparison unit 170 compares the oscillation frequency fcco of the output oscillation signal Vout outputted from the current control oscillation unit 101A with the judging reference frequency f1 (S110). The frequency comparison result storage unit 172_1 stores the frequency comparison result fcomp with the digital data of N (in this example, N=6) bit (S112). Although it will be described later in detail, since the frequency search by using binary search method is adopted in this embodiment, the first frequency comparison result fcomp is stored in a higher bit in N-bits, after which it stores in a lower bit (finally least significant bit LSB) one by one.

The DA conversion unit 174A_1 operates the N-th bit according to the data stored at the N-th bit of the frequency comparison result storage unit 172_1, and supplies its output current signal Iout_1 to the current summing unit 176A. At this time, the output current signal Iout_2 from the DA conversion unit 174A_2 has neither sink-current nor source-current, and the output current signal Iout_1 is supplied through the current summing unit 176A to the current summing unit 108A as the frequency control current Iosci (S114).

The current summing unit 108A sums up the frequency control current Iosci (=the output current signal Iout_1) at this time and the initial current Iini, and supplies it (total) to the current control oscillation unit 101A as the oscillation control current Icnt (S116).

If the number of searches is less than N (in this example N=6) (S118—NO), the process returns to step S110 and similarly carries out frequency comparison and stores the result in the frequency comparison result storage unit 172_1. In this case, the storing is carried out at a lower bit one by one.

In this way, the frequency comparison unit 170 compares the oscillation frequency fcco of the current control oscillation unit 101A with the judging reference frequency f1, and stores the result sequentially from a higher bit in the frequency comparison result storage unit 172_1. The DA conversion unit 174A_1 is operated sequentially from a higher bit by means of the stored value, and the output current signal Iout_1 is added to the initial current Iini. In fact, since the DA conversion unit 174A_1 performs sink operation and source operation for each bit according to the data value for each bit of the frequency comparison result storage unit 172_1 (0/1), the addition to and subtraction from the initial current Iini are performed according to the data value with respect to a corresponding bit at every search.

When the number of searches reaches N (S118—YES), data in which the oscillation frequency fcco of the output oscillation signal Vout is mostly in agreement with the judging reference frequency f1 are stored at the frequency comparison result storage unit 172_1.

Next, the phase synchronization unit 100 leaves the path selection switch 175 on the output terminal 175_2 side, and switches to the judging reference frequency f2 (S128) so that the oscillation frequency fcco of the output oscillation signal Vout may be substantially matched with the judging reference frequency f2 in the same manner as described above.

In particular, the frequency comparison unit 170 compares the oscillation frequency fcco of the output oscillation signal Vout outputted from the current control oscillation unit 101A with the judging reference frequency f2 (S130). The frequency comparison result storage unit 172_2 stores the frequency comparison result fcomp with the N-bit digital data (S132). As described above, the first frequency comparison result fcomp is stored in a higher bit of N-bits.

The DA conversion unit 174A_2 operates the N-th bit according to the data stored at the N-th bit of the frequency comparison result storage unit 172_2, and supplies its output current signal Iout_2 to the current summing unit 176A. At this time, since there is the output current signal Iout_1 from the DA conversion unit 174A_1, the current summing unit 176A sums up the output current signal Iout_1 and the output current signal Iout_2, and supplies it (total) to the current summing unit 108A as the frequency control current Iosci (S134).

The current summing unit 108A sums up the frequency control current Iosci at this time (=the output current signal Iout_1+the output current signal Iout_2) and the initial current Iini, and supplies it (total) to the current control oscillation unit 101A as the oscillation control current Icnt (S136).

If the number of searches does not reach N (S138—NO), the process returns to step S130, and similarly carries out the frequency comparison and stores its result in the frequency comparison result storage unit 172_2. In this case, the storing is carried out at a lower bit one by one.

In this way, the frequency comparison unit 170 compares the oscillation frequency fcco of the current control oscillation unit 101A with the judging reference frequency f2. The result is stored sequentially from a higher bit in the frequency comparison result storage unit 172_2. The DA conversion unit 174A_2 is operated sequentially from a higher bit by means of the stored value, and the output current signal Iout_2 is added to "output current signal Iout_1+initial current Iini". In fact, since the DA conversion unit 174A_2 performs the sink operation and the source operation for each bit according to the data value for each bit of the frequency comparison result storage unit 172_2 (0/1), the addition to and subtraction from "output current signal Iout_1+initial current Iini" are performed according to the data value with respect to a corresponding bit at every search.

When the number of searches reaches N (S138—YES), data in which the oscillation frequency fcco of the output oscillation signal Vout is substantially matched with the judging reference frequency f2 are stored in the frequency comparison result storage unit 172_2.

In this way, when the processes with respect to the judging reference frequency f1 and the judging reference frequency f2 are completed (S138—YES), the path selection switch 175 switches to the output terminal 175_3 side, to thereby switch an output path of the DA conversion unit 174A_2 to the current/current conversion unit 177 side (150).

The current/current conversion unit 177 takes K times the output current signal Iout_2 of the DA conversion unit 174A_2, and supplies it to the control input terminal 105CPa of the current source 105CP of the charge pump 104CP as the control current Icpcnt (S152). When the current mirror ratio is 1:1, control current Icpcnt=bias current Icpbias.

In this way, when a series of compensation processes are completed, the phase synchronization unit 100 usually carries out the phase synchronizing operation by using the charge pump current Icp having an amount based on the measurement result of the input current-oscillation frequency conversion gain Kcco in the gain characteristic information obtaining unit 107A (S160).

In addition, as can be seen from the above description, when the judging reference frequency f1 is switched to the judging reference frequency f2, the difference required for switching the oscillation frequency fcco of the oscillation signal Vout (outputted from the current control oscillation unit 101A) from the judging reference frequency f1 to the judging reference frequency f2 is stored in the frequency comparison result storage unit 172_2.

Since the difference corresponding to the frequency difference between the judging reference frequency f1 and the judging reference frequency f2 is store, the digital data of N bits stored by this frequency comparison result storage unit 172_2 reflects the input current-oscillation frequency conversion gain Kcco of the current control oscillation unit 101A.

In addition, the charge pump 104CP outputs the charge pump current Icp of β times the bias current Icpbias, while the bias current Icpbias of the charge pump 104CP corresponds to K times the output current signal Iout_2 based on the data reflecting the input current-oscillation frequency conversion gain Kcco. Further, since the charge pump current Icp is dependent on the bias current Icpbias, by normalizing the setup of K times by means of the current/current conversion unit 177 so as to offset the variation in the input current-oscillation frequency conversion gain Kcco, it is possible to match Icp·Kcco with the designed value at every compensation process based on the measurement result of the input current-oscillation frequency conversion gain Kcco (as will be described later in detail).

As a result, the data reflecting the input current-oscillation frequency conversion gain Kcco of the current control oscillation unit 101A are stored in this way. Therefore, when the above-mentioned processes are completed, the environmental (of component variations and environmental temperature) influence on the input current-oscillation frequency conversion gain Kcco at the time can be compensated for, and the zone ωn and the damping factor ζ of PLL can be matched with the designed value. As long as there is no environmental change, it is possible to cause the zone ωn and the damping factor ζ of PLL to be constant.

When a temperature change arises, a compensation process similar to the above is performed. Thus, the environmental (of component variation and environmental temperature) influence on the input current-oscillation frequency conversion gain Kcco can be compensated for again, and the zone ωn and the damping factor ζ of PLL can be matched with the designed value.

Further, when the process with respect to the judging reference frequency f1 and the judging reference frequency f2 is completed (S138—YES), the path selection switch 175 switched to the output terminal 175_3 side. Thus, there is not the output current signal Iout_2 from the DA conversion unit 174A_2 in the current summing unit 176A. As shown in FIG. 8, the oscillation frequency fcco of the output oscillation signal Vout outputted from the current control oscillation unit 101A at the end of compensation process is matched with the judging reference frequency f1.

Therefore, if this judging reference frequency f1 is matched with the data rate of the digital data sequence Din inputted into the phase comparison unit 103 (that is, a frequency of the AD clock CKad needed in the AD conversion unit 54), the phase synchronization unit 100 can cause the output oscillation signal Vout and the digital data sequence Din of the current control oscillation unit 101A to be in the same phase in a short time upon completion of the compensation process.

On the other hand, in the data recovery type phase synchronization unit 100A of the comparative example as shown in FIG. 4, since an input range of the voltage/current conversion unit 166 (transconductance) is limited, a frequency synthesizer unit 180 is prepared separately. The oscillation frequency fcco of the output oscillation signal Vout outputted from the current control oscillation unit 101A is matched with the data rate of the digital data sequence Din, then, the phase of the output oscillation signal Vout is locked to the phase of the digital data sequence Din.

As can be seen from the comparison between the phase synchronization unit 100 of the first embodiment as shown in FIG. 3 and the phase synchronization unit 100A as shown in FIG. 4, the phase synchronization unit 100 of the first embodiment requires the gain characteristic information obtaining unit 107A, but does not require the frequency synthesizer unit 180.

Further, since the phase synchronization unit 100 performs the phase synchronizing operation, while fixing and using the information at the time when the compensation process is ended in the gain characteristic information obtaining unit 107A until next compensation process is performed (that is, as in DC), the operation is not continued as in AC, and it is possible to realize a low noise and a low jitter. This point considerably differs from performing the phase synchronizing operation, while applying the compensation process continuously (i.e., operating in AC).

<Example of Structure of Frequency Comparison Unit and Operation>

Figure 9:
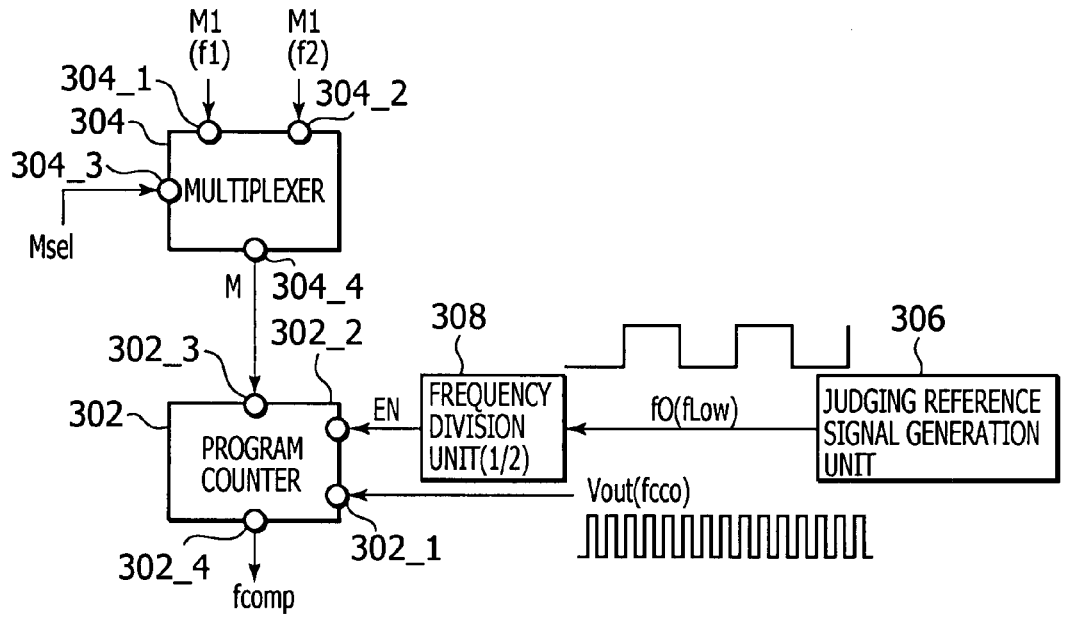
FIG. 9 is a diagram showing a detailed example of a structure of a frequency comparison unit.
Figure 10:
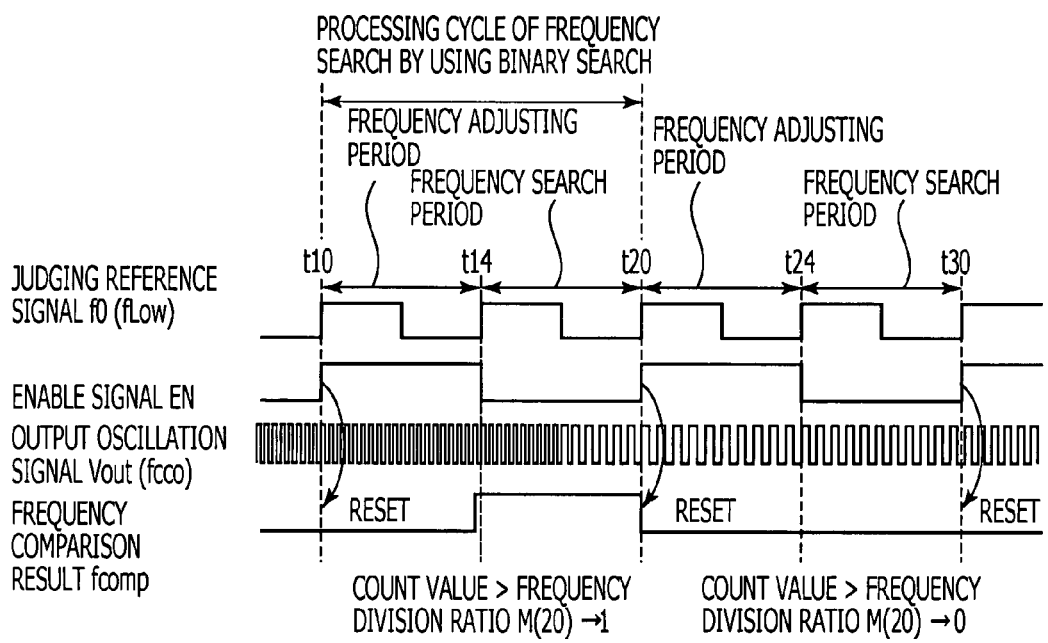
FIG. 10 is a timing chart for explaining operation of a programmable counter used for the frequency comparison unit.
Figure 11:
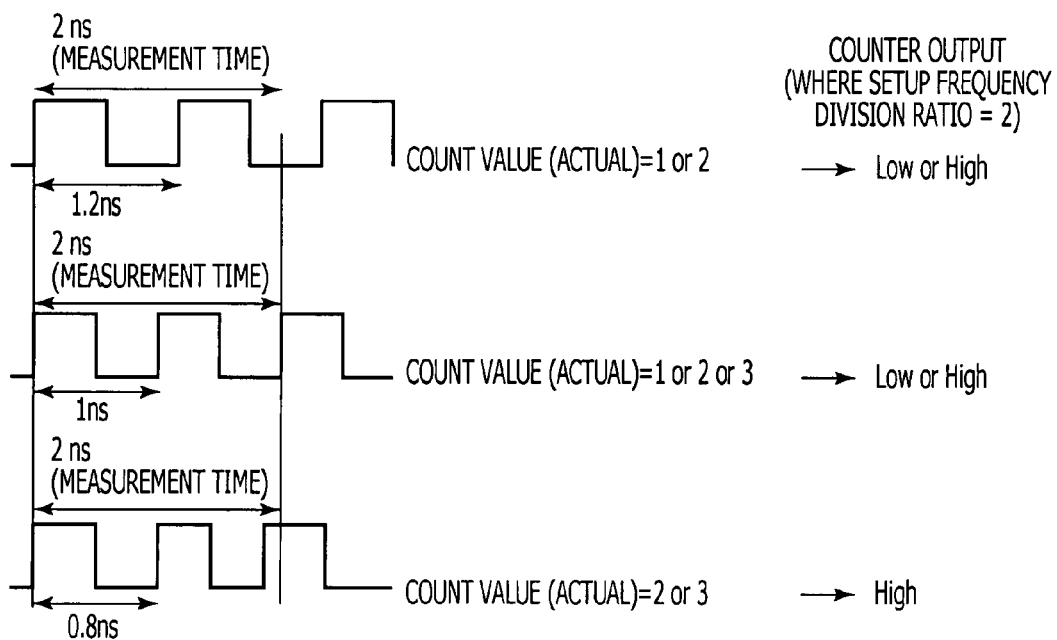
FIG. 11 is a chart for explaining a relationship between measurement time and output of the programmable counter.

FIGS. 9 to 12 are a diagram and charts for explaining the details of the frequency comparison unit 170, where, FIG. 9 is a diagram showing a detailed example of a structure of the frequency comparison unit 170; FIG. 10 is a timing chart for explaining operation of a programmable counter (Programmable Counter) used for the frequency comparison unit 170; FIG. 11 is a chart for explaining a relationship between measurement time and output of the programmable counter; and FIG. 12 is a chart for explaining malfunction in the programmable counter.

First, as shown in FIG. 9, the frequency comparison unit 170 includes a program counter 302 which can change a frequency division ratio arbitrarily, a multiplexer (Multiplexer) 304 with 2 input—1 output, a judging reference signal generation unit 306 for generating a judging reference signal f0 with a frequency fLow, and a frequency division unit 308 for dividing a frequency of the judging reference signal f0 having the frequency fLow supplied from the judging reference signal generation unit 306.

Here, it is assumed that the frequency fLow of the judging reference signal f0 is a value with which the oscillation frequency fcco reflecting the output current signal Iout from DA conversion unit 174A based on the last search result is stable for one frequency search period (for more detail, see the description of FIG. 10 or the setup signal generation unit 410) in the frequency search by using binary search. The reason for this is that if this is not filled, a judgment result when the frequency comparison unit 170 compares the oscillation frequency fcco of the current control oscillation unit 101A with the judging reference frequency f1 is incorrect in next search.

The frequency division unit 308 divides the frequency fLow of the inputted judging reference signal f0 into one half. Here, it is assumed that the judging reference signal f0 is a lower speed clock (Low Speed Clock) than the oscillation frequency fcco of the output oscillation signal Vout outputted from the current control oscillation unit 101A as shown in FIG. 9.

A frequency division ratio M1 corresponding to the information for specifying the judging reference frequency f1 is inputted into one input terminal 304_1 (corresponding to 170_2) of a multiplexer 304. A frequency division ratio M2 corresponding to the information for specifying the judging reference frequency f2 is inputted into the other input terminal 304_2 (corresponding to 170_3). According to a frequency division ratio switching signal Msel (substantially equivalent to a judging reference frequency switching signal) inputted into a switch control terminal 304_3, the multiplexer 304 chooses either the frequency division ratio M1 inputted into an input terminal 304_1 or the frequency division ratio M2 inputted into an input terminal 304_2, and outputs it as a frequency division ratio M to be set up through an output terminal 304_4.

In this embodiment, after frequency search by using binary searching with the first judging reference frequency f1, a signal indicative of its end (for example, signal for switching from L level to H level) is inputted as the frequency division ratio switching signal Msel, so that the judging reference frequency is switched from the judging reference frequency f1 to the judging reference frequency f2.

As for the program counter 302, the output oscillation signal Vout of the oscillation frequency fcco outputted from the current control oscillation unit 101A is supplied to the clock input terminal 302_1 (equivalent to 170_1), and a frequency-division output obtained by dividing the judging reference frequency (flow) into a half by means of the frequency division unit 308 is supplied to an enable terminal 302_2 as an enable signal EN. Further, the frequency division ratio M (either the frequency division ratio M1 or the frequency division ratio M2) from the output terminal 304_4 of the multiplexer 304 is supplied to a frequency division ratio setting terminal 302_3. Furthermore, the program counter 302 outputs the frequency comparison result fcomp through an output terminal 302_4 (equivalent to 170_4).

FIG. 10 illustrates an example in which the program counter 302 counts a rising edge of the output oscillation signal Vout in the case of the frequency division ratio M=20. Here, as shown in FIG. 10, an internal state of the program counter 302 is reset at the same time as the enable signal EN rises, and the enable signal EN becomes effective (H level, in this example), then the program counter 302 begins to count the edges of the output oscillation signal Vout outputted from the current control oscillation unit 101A (t10, t20, t30). In other words, in the case of this embodiment, a period when the enable signal EN is at H level corresponds to one frequency search period in the frequency search by using binary search.

At the same time as the enable signal EN falls (t14, t24), the program counter 302 stops the count operation, keeps on holding and outputting the count result at the time until the next rising edge of the enable signal EN. Then, the enable signal EN changes the oscillation frequency fcco within the period of L level (referred to as frequency adjusting period). Subsequently, the internal state of the program counter 302 is reset at the same time as the enable signal EN rises, so that it begins the next count.

In order to perform the frequency comparison with sufficient accuracy, it is required for the oscillation frequency fcco of the output oscillation signal Vout to be in a stable state during the frequency search period (count period when the enable signal EN is at H level). This means that when the enable signal EN with which the count is started rises, that is, during the frequency adjusting period when the enable signal EN is at L level, the oscillation frequency fcco of the output oscillation signal Vout based on the oscillation control current Icnt reflecting the last frequency search by using binary search result is required to have reached the stable state.

By way of this example, it is required for the oscillation frequency fcco to have reached the stable state within the frequency adjusting period when the enable signal EN before t10 is at L level under control of the oscillation frequency fcco based on the last frequency comparison result fcomp before t10. Further, it is required for the oscillation frequency fcco to have reached the stable state within the frequency adjusting period when the enable signal EN before t20 is at L level under control of the oscillation frequency fcco based on the frequency comparison result fcomp of the first frequency search by way of count operation of t10-t14.

In this example, the enable signal EN is used such that one processing cycle of the frequency search by using binary search in which the frequency adjusting period is synthesized with the frequency search period may correspond to two clocks of the judging reference signal f0, however, this is only an example.

Fundamentally, how many clocks of the judging reference signal f0 there are in one processing cycle of the frequency search by using binary search may only be determined according to a response speed at which the oscillation frequency fcco of the current control oscillation unit 101A is stable. For example, let an L level period of the judging reference signal f0 be the frequency adjusting period, and let an H level period of the judging reference signal f0 be the frequency search period, one processing cycle of the frequency search by using binary search may be one clock of the judging reference signal f0, and the whole processing cycle may also be three clocks or more, equalizing the frequency adjusting period and the frequency search period.

Further, the frequency adjusting period and the frequency search period may not be always equalized but they may be unequal. In this case, it is possible to determine the frequency adjusting period according to the response speed at which the oscillation frequency fcco is stable, leaving the frequency search period constant. For example, leaving the whole processing cycle for three clocks of the judging reference signal f0, two clocks of the first half period may be assigned to the frequency adjusting period, and one clock for the second half period may be assigned to the frequency adjusting period.

Incidentally, an output signal indicative of the frequency judging result of the program counter 302 which carries out such operation is as follows. In other words, assuming that the frequency of the judging reference signal f0 is fLow, a width of the enable signal EN inputted into the program counter 302 is 1/fLow. Since the output oscillation signal Vout outputted from the current control oscillation unit 101A is the oscillation frequency fcco, an edge is inputted into the program counter 302 for every oscillator period 1/fcco. Therefore, a value (count value) counted during the period (referred to as enable signal width) when the enable signal EN of the program counter 302 is effective (at H level) is equivalent to one period of the enable signal width=judging reference signal f0. Accordingly, it is expressed by equation (3-1), assuming that oscillation frequency fcco=oscillation frequency fosci.

When the frequency division ratio M is inputted, the program counter 302 outputs "1: H level" (equation (3-2)) through the output terminal 302_4 in the case where the count value as shown by equation (3-1) is larger than the frequency division ratio M, and outputs "0: L level" (equation (3-3)) in the case it is smaller than the frequency division ratio M. When the count value is larger than the frequency division ratio M, the output of the program counter 302 becomes H before the enable signal EN falls (for example, before t14).

This means that the program counter 302 judges the magnitude of the oscillation frequency fcco of the output oscillation signal Vout (=oscillation frequency fosci) outputted from the current control oscillation unit 101A, and it can be seen that M·fLow is the judging reference frequency. Therefore, the judging reference frequency can be switched to either the judging reference frequency f1 or the judging reference frequency f2 by switching the frequency division ratio M to either the frequency division ratio M1 or the frequency division ratio M2. Thus, when the oscillation frequency fcco is higher than the judging reference frequencies f1 and f2, the program counter 302 outputs "1: H level" as the frequency comparison result fcomp. When the oscillation frequency fcco is lower than the judging reference frequencies f1 and f2, the program counter 302 outputs "0: L level" as the frequency comparison result fcomp.

$$\left. \begin{array}{l} \text{Count value} = \dfrac{\text{Enable signal width}}{\text{Oscillation frequency}} = \dfrac{1/fLow}{1/fosci} = \dfrac{fosci}{fLow} \quad (3\text{-}1) \\ \text{if } \left[ \dfrac{1/fosci}{1/fLow} > M \right] \; fcomp = \text{``1''} \Rightarrow fosci > M \cdot Low \quad (3\text{-}3) \\ \text{if } \left[ \dfrac{1/fosci}{1/fLow} < M \right] \; fcomp = \text{``0''} \Rightarrow fosci < M \cdot Low \quad (3\text{-}3) \end{array} \right\} \quad (3)$$

Where, the frequency division with the frequency division ratio M to the program counter 302 is performed such that the multiplexer 304 switches between the frequency division ratio M1 corresponding to the judging reference frequency f1 and the frequency division ratio M2 corresponding to the judging reference frequency f2, as can be seen from FIG. 9.

This is because, as described above with reference to FIGS. 7 and 8, the gain characteristic information obtaining unit 107A is required to switch between the judging reference frequencies f1 and f2 during the compensation processing by means of the multiplexer 304 in order to match the oscillation frequency fcco to two types of judging reference frequencies f1 and f2.

Incidentally, as described above, the program counter 302, as shown in FIG. 10, determines whether the value counted during the effective measurement of the enable signal EN (frequency searching time) it is larger or smaller than the frequency division ratio M, and outputs the result.

However, with respect to the relationship between the measurement time and the output of the program counter 302 as shown in FIG. 11, even if the oscillation frequency fcco has reached the stable state, the program counter 302 may make a mistake in the judgment in the case where the edge of the current control oscillation unit 101A overlaps the time when the enable signal EN rises or the time when it falls.

For example, assuming that fLow=5 MHz, and the oscillation frequency fcco of the current control oscillation unit 101A is around 800 MHz, the program counter 302 takes a count value as shown in FIG. 12. Here, FIG. 12A shows a relationship between a judgment mistake section of the program counter 302 when frequency division ratio M=160 and the judging reference frequency. FIG. 12B shows a relationship between the judgment mistake section of the program counter 302 when frequency division ratio M=161 and the judging reference frequency.

In particular, in the case of setting up the judging reference frequency of the program counter 302 to 800 MHz, fLow=5 MHz, thus it is assumed that the frequency division ratio M=160. As shown in FIG. 12A, it is understood that when the oscillation frequency fcco is 795 MHz, or 795 MHz<fcco<800 MHz, the program counter 302 counts 160 or may make the wrong judgment when it is 800 MHz or more. On the contrary, it may count 159 in the case of 800 MHz, and it may judge that it is lower than 800 MHz. This can be considered that the actual judging reference frequency of the program counter 302 has moved to 795 MHz.

Further, let the frequency division ratio M=161, as shown in FIG. 12B, a section in which the program counter 302 may make the wrong judgment moves to 800 MHz-805 MHz, and does not make a mistake in judgment when the oscillation frequency fcco is smaller than 800 MHz. Thus, it is similarly considered that the judging reference frequency is 800 MHz.

Therefore, in the case of setting up the frequency division ratio M with respect to the program counter 302 by means of the multiplexer 304 of the frequency comparison unit 170, it is necessary to set up the frequency division ratio M according to equation (4), assuming that the judging reference frequency is a threshold frequency fth (threshold).

$$M = \frac{fth}{fLow} + 1 \qquad (4)$$

<Example of Structure of Comparison Result Storage Unit and Operations>

Figure 13:
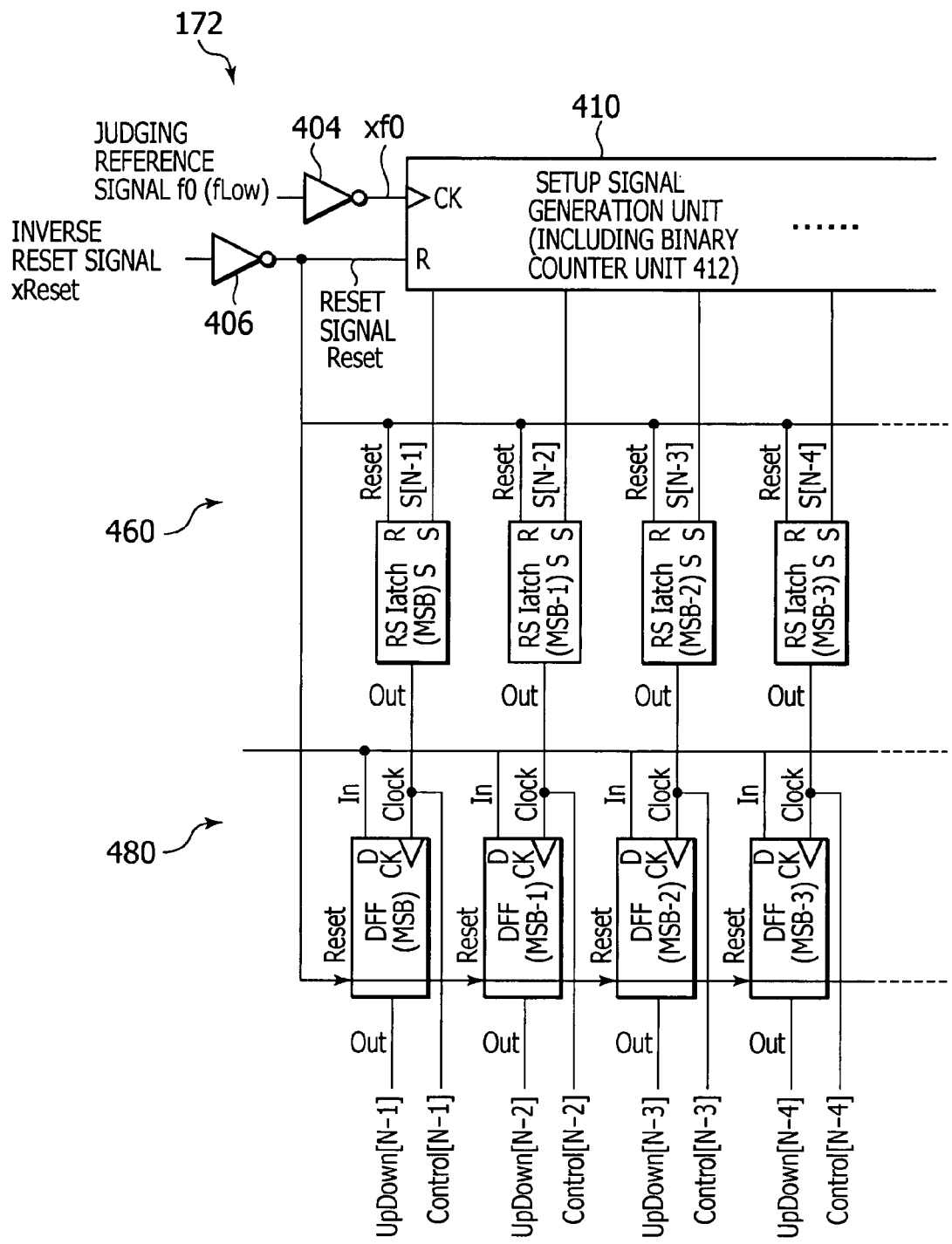
FIG. 13 is a diagram showing a detailed example of a structure of a frequency comparison result storage unit.
Figure 14:
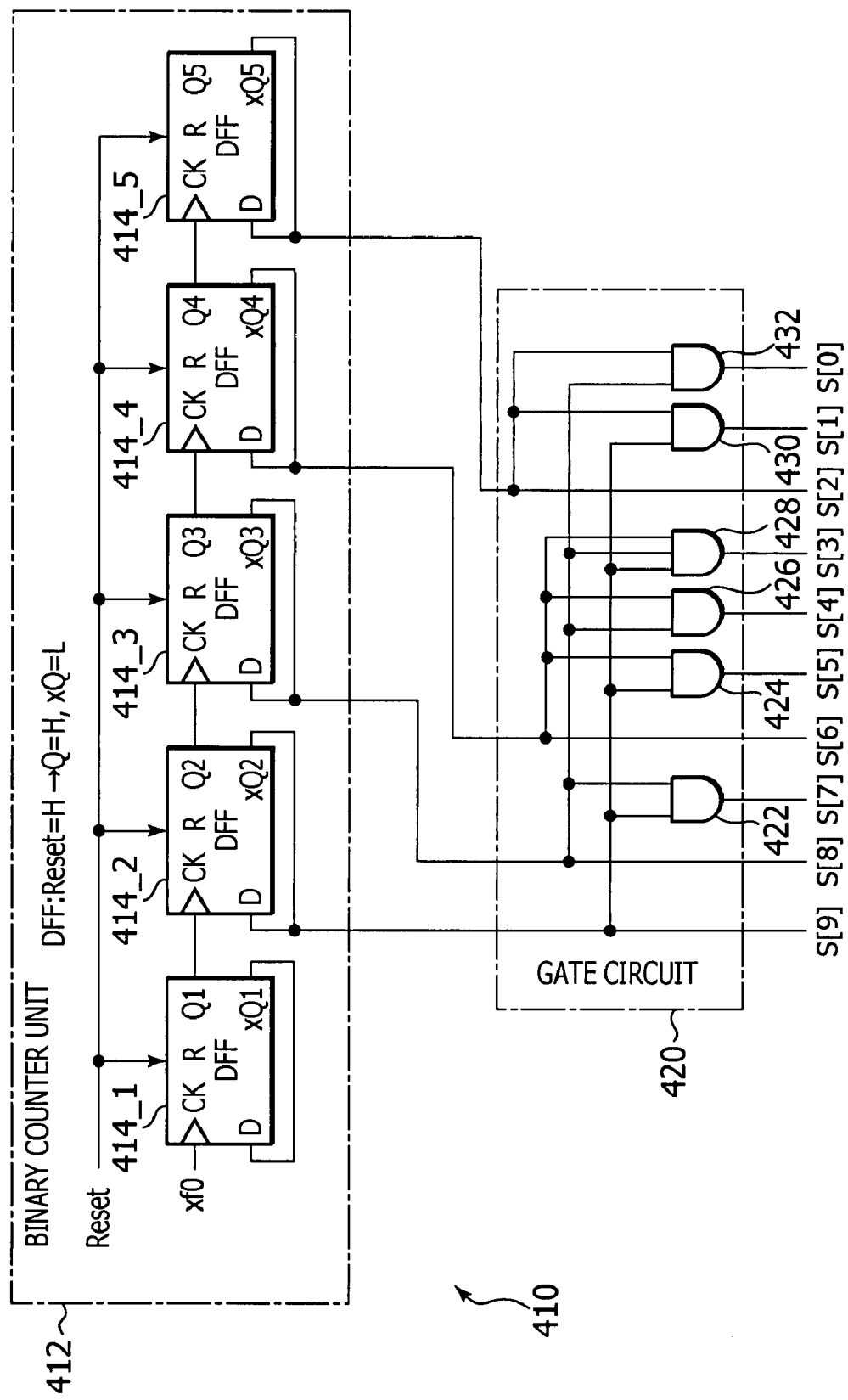
FIG. 14 is a diagram showing a detailed example of a structure of a setup signal generation unit which constitutes the frequency comparison result storage unit.
Figure 15:
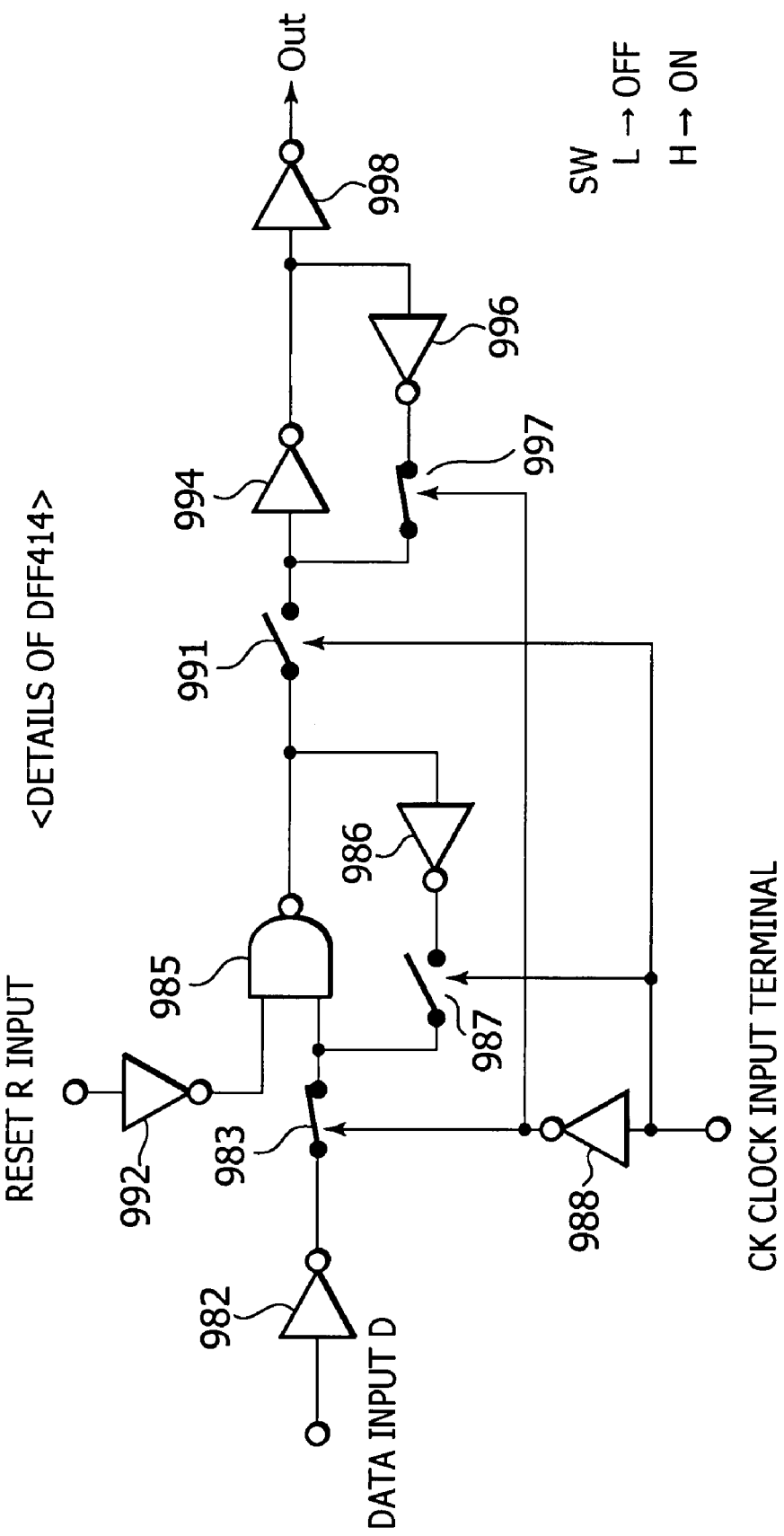
FIG. 15 is a diagram showing an example of a structure of DFF used in the detailed example of the structure of the setup signal generation unit 410 as shown in FIG. 14.
Figure 16:
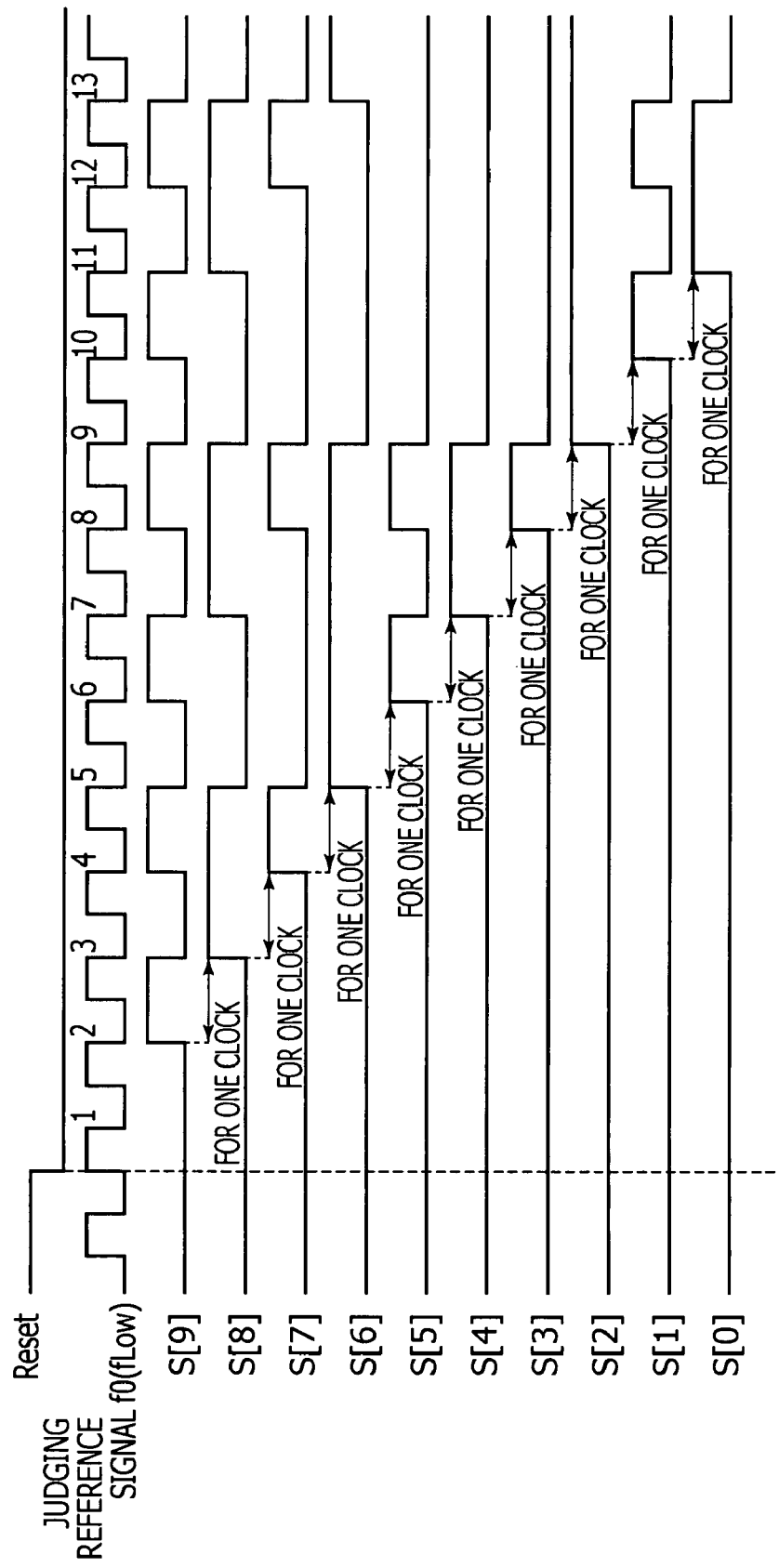
FIG. 16 is a timing chart (N=10, by way of example) for explaining operation of the setup signal generation unit when a processing cycle of a frequency search by using binary search is assumed to be equivalent to one clock of a judging reference signal.
Figure 17:
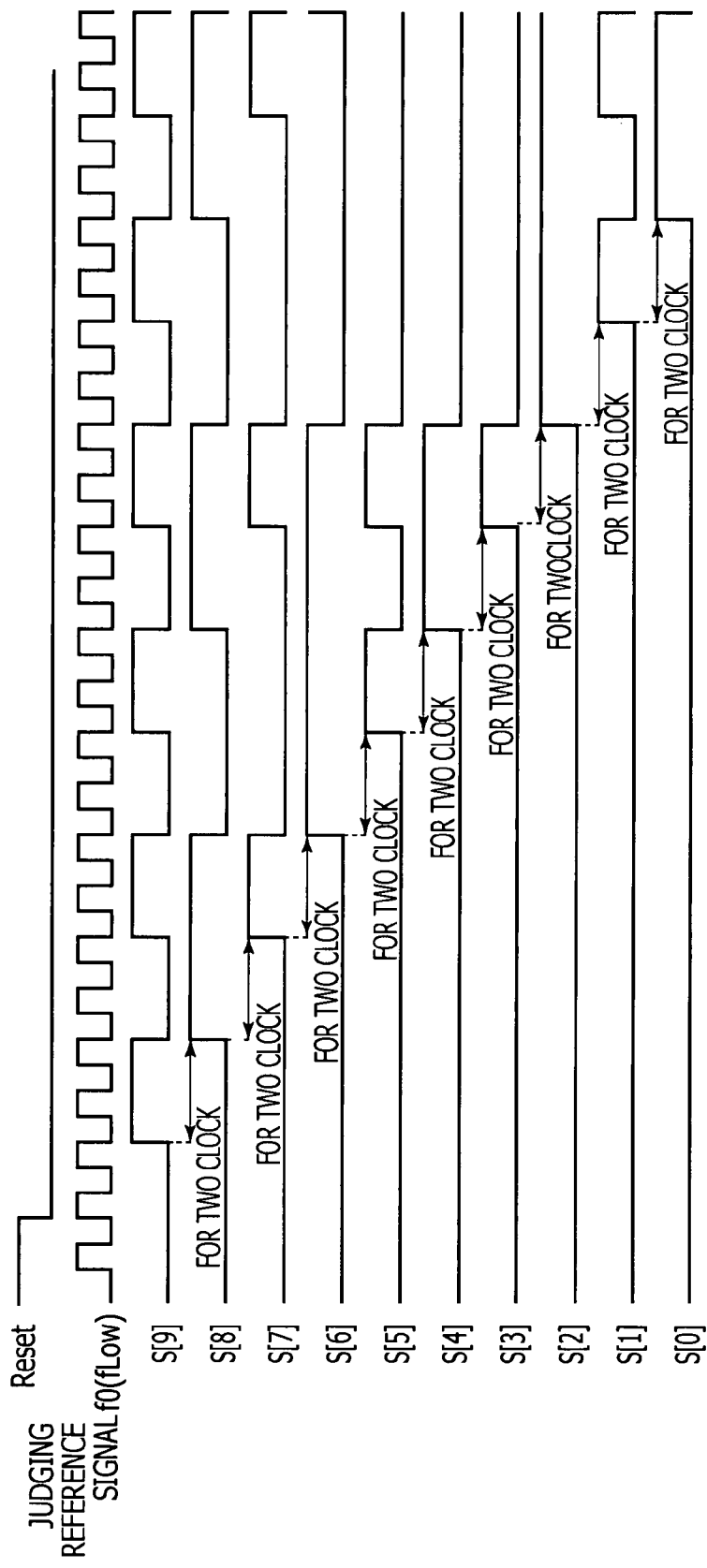
FIG. 17 is a timing chart (N=10, by way of example) for explaining operation of the setup signal generation unit of the structure as shown in FIG. 14, when the processing cycle of the frequency search by using binary search is assumed to be equivalent to two clocks of the judging reference signal.

FIGS. 13-19 are diagrams and charts for explaining an example of a structure and operation of the frequency comparison result storage units 172_1 and 172_2 (collectively denoted with 172), where FIG. 13 is a diagram showing a detailed example of a structure of the frequency comparison result storage unit 172; FIG. 14 is a diagram showing a detailed example of a structure of the setup signal generation unit 410 which constitutes the frequency comparison result storage unit 172; FIG. 15 is a diagram showing an example of a structure of a D-type flip-flop (hereafter also referred to as DFF) used in the detailed example of the structure of the setup signal generation unit 410 as shown in FIG. 14;

FIG. 16 is a timing chart (illustrated when N=10) for explaining operation of the setup signal generation unit 410 in the case where the processing cycle of the frequency search by using binary search is assumed to be equivalent to one clock of the judging reference signal f0; FIG. 17 is a timing chart (illustrated when N=10) for explaining operation of the setup signal generation unit 410 of the structure as shown in FIG. 14, in the case where the processing cycle of the frequency search by using binary search is assumed to be equivalent to two clocks of the judging reference signal f0;

FIGS. 18A and 18C are diagrams showing the details of constituent elements for one (1) bit of the data storage units 460 and 480 which constitute the frequency comparison result storage unit 172; and FIG. 19 is a timing chart for explaining the whole operation of the frequency comparison unit 170 and the frequency comparison result storage unit 172, in the case where the processing cycle of the frequency search by using binary search is assumed to be equivalent to two clocks of the judging reference signal f0.

As shown in FIG. 13, the frequency comparison result storage unit 172 includes inverters 404 and 406, and the setup signal generation unit 410 for generating a setup signal, for each bit, which is an origin of a signal for specifying a switch timing of bit-weighting. The setup signal generation unit 410 includes a binary counter unit 412 for counting an inputted clock signal, and is arranged to generate the setup signal for each bit one by one by using count output of the binary counter unit 412. When generating the setup signal for each bit by using the count output, a combination of gate circuits, a shift register arrangement, and other logic circuits may be used.

Further, the frequency comparison result storage unit 172 includes a first data storage unit 460 provided for each bit for taking in and storing a setup signal S outputted from the setup signal generation unit 410, and a second data storage unit 480 provided for each bit which uses the output data of the first data storage unit 460 as a bit switch signal for specifying the switch timing of bit-weighting, and takes in and stores the frequency comparison result fcomp from the frequency comparison unit 170 in synchronization with the switch timing of bit-weighting of the bit switch signal.

The output data outputted from the first data storage unit 460 is used as the bit switch signal for specifying the switch timing of bit-weighting. In other words, in the structure of the frequency comparison result storage unit 172 of the first example, a bit switch signal generation unit for generating, one by one, the bit switch signal for each bit which specifies the switch timing of bit-weighting is constituted by the data storage unit 460 and the setup signal generation unit 410 having the binary counter unit 412 and a gate circuit 420. The data storage unit 460 has the function of a pulse signal shaping unit in which the setup signal S is taken and is stored in at the rising edge of the beginning of the setup signal S outputted from the setup signal generation unit 410, and the bit switch signal is generated one by one by disregarding the rising edge of the subsequent setup signal S.

The judging reference signal f0 of the frequency fLow supplied from the judging reference signal generation unit (not shown) is inputted into the inverter 404. A signal (referred to as inversion judging reference signal xf0) obtained by logically inverting the inputted signal (f0) is supplied to the setup signal generation unit 410. An inverse reset signal xReset as an external signal supplied from the control unit (not shown) which controls compensation processing operation is inputted into the inverter 406. A signal (referred to as reset signal Reset) obtained by logically inverting the inputted signal (xReset) is supplied to the setup signal generation unit 410 or the data storage units 460 and 480. In addition, it is assumed that transition from L level to H level of the inverse reset signal xReset is in synchronization with the rising edge of the judging reference signal f0.

The data storage units 460 and 480 are respectively provided with N pieces thereof to correspond to N frequency search by using binary searches for every judging reference frequencies. Here, in the frequency comparison result storage unit 172 of this embodiment, an RS latch is used as the first data storage unit 460, and a D-type flip-flop (DFF) is used as the second data storage unit 480.

<Details of Setup Signal Generation Unit>

As the example of the structure is shown in FIG. 14, the setup signal generation unit 410 has, for example, the binary counter unit 412, and the gate circuit 420 for generating each setup signal S [N–#] (# is 1, 2, 3, . . . : 1 is on MSB side) supplied to the data storage unit 460 for each bit by carrying out logical operation of the count output of the binary counter unit 412.

In the binary counter unit 412, as shown, D-type flip-flops (DFF) 414 are connected to give a cascade connection arrangement, and connection between the stages is carried out to allow down count operation. The number of DFF 414 in the cascade connection arrangement is determined according to the number N of bits. For example, when N=10, it is arranged to have five stages as illustrated.

In particular, firstly, the inverse output terminal xQ is directly connected with the data input terminal D in DFF 414 of each stage. The inversion judging reference signal xf0 obtained by logically inverting the judging reference signal f0 of the frequency fLow by means of the inverter 404 is inputted into the clock input terminal CK of a first DFF 414. After the first stage, the count output outputted from the non-inversion output terminal Q of the preceding DFF414 is arranged to be supplied to the clock input terminal CK of the following DFF414. Each DFF414 outputs a state of the data input terminal D to the non-inversion output terminal Q at the rising edge of the clock input terminal CK, and outputs the logically inverted state of the data input terminal D via the inverse output terminal xQ. This point is the same as that of a general DFF.

The inverse reset signal xReset is inputted through the inverter 406 into the reset terminal R of each DFF414 as the reset signal Reset. When the reset signal Reset inputted into the reset terminal R is at H level, each DFF414 causes the non-inversion output terminal Q to be at H level, and the inverse output terminal xQ to be at L level (it resets). This point differs from that of the general DFF in that the non-inversion output terminal Q is caused to be at L level and the inverse output terminal xQ is caused to be at H level at the time of resetting.

As the example of detailed structure is shown in FIG. 15, each DFF414 includes, for example, an inverter 982 for inverting an input data D, an inverter 984 for inverting a reset signal, a two-input type NAND gate 985, an inverter 988 for inverting a clock signal CK, and ON/OFF switches (hereafter simply referred to as switches) 983 and 987.

An output of the inverter 984 is connected to one input of the NAND gate 985. The other input of the NAND gate 985 is connected with an output of the inverter 982 through the switch 983, and connected to an output of the inverter 986 through the switch 987. Further, an output of the NAND gate 985 is connected to an input of the inverter 986.

In a situation where the input on the inverter 984 side of the NAND gate 985 is at H level and the switch 987 is turned on, it is arranged that a memory circuit (latch) is constituted by the NAND gate 985 and the inverter 986.

Further, each DFF414 includes inverters 994, 996, and 998 and ON/OFF switches 991 and 997. An output of the inverter 994 is connected to each input of the inverters 996 and 998. An output of the inverter 996 is connected to an input of the inverter 994 through the switch 997. An output of the inverter 998 is connected to a non-inversion output terminal Out. In a situation where the switch 997 is turned on, a memory circuit (latch) is constituted by the inverters 994 and 996.

The clock input terminal CK is directly connected to control terminals of the switches 987 and 991 and connected with control terminals of the switches 983 and 997 through the inverter 988. Here, each of the switches 983, 987, 991, and 997 is a switch of a type which is tuned off when the control terminal is at L level (that is, the clock input terminal CK is at L level), and is turned on when the control terminal is at H level (that is, the clock input terminal CK is at H level).

Each of the switches 983, 987, 991, and 997 may be a switch of a type which is turned on when the control terminal is at L level (that is, the clock input terminal CK is at L level) and is turned off when the control terminal is at H level (that is, the clock input terminal CK is at H level). In this case, although not shown, with respect to the structure illustrated in FIG. 15, the clock input terminal CK may only be connected with the control terminals of the switches 983 and 997 directly and be modified to be connected with the control terminals of the switches 987 and 991 through the inverter 988 (see the structure as shown in FIG. 18A as will be explained later).

In DFF414 of such a structure, firstly, if the reset signal R to the inverter 984 is at H level, then the output of the inverter 984 (i.e., one input of the NAND gate 985) is at L level, whereby its output is at H level irrespective of the other input of the NAND gate 985. If the switch 991 turns on when the clock signal CK is at H, then the non-inversion output terminal Out is caused to be at H level through the inverters 994 and 998. In other words, a data output is reset to H level.

After this, the switch 991 is turned off when the clock input terminal CK moves to L level. Thus, supply of the reset H level stops, however the reset H level is taken into the inside of the inverters 984 and 9962. In other words, when the switch 997 turns on, the data obtained such that the immediately preceding reset H level is inverted by the inverter 994 and further inverted by the inverter 996 is transmitted to the inverter 994 through the switch 997. In other words, the immediately preceding reset H level is logically inverted and returned through the inverters 994 and 996 to the input in the original logic state. As a result, the immediately preceding reset H level is held by the inverters 994 and 996.

After this, when the reset signal R to the inverter 984 is at H level, the output (i.e., the other input of the NAND gate 985) of the inverter 984 is at H level, whereby the output of the NAND gate 985 reflects the other input of the NAND gate 985.

For example, if the clock input terminal CK is at L level at this time, the input data D is taken into the inside on the input side. In other words, when the switch 983 turns on, the data obtained by inverting the input data D by means of the inverter 982 is transmitted through the switch 983 to the other input of the NAND gate 985. The data is logically inverted by the NAND gate 985, and transmitted to the output of the NAND gate 985. At this time, since the switch 991 is turned off, the immediately preceding reset H level is held by the inverters 994 and 996 as described above, leaving the non-inverted output Out reset.

Furthermore, when the clock input terminal CK is switched to H level, the switches 983 and 997 are turned off and the switches 987 and 991 are turned on. Thus, supply of the input data D through the inverter 982 and switch 983 to the inverter 984 stops. However, when the switch 987 turns on, output of the immediately preceding inverter 984 (i.e., logical level of the immediately preceding input data D) is logically inverted and returned to the input through the inverter 986. As a result, the logical level of the immediately preceding input data D is held by the inverters 984 and 986.

Further, since the switch 991 is ON, the logical level of the immediately preceding input data D which is the output of the inverter 984 is supplied to the one input of the NAND gate 985. As a result, the logical level of the immediately preceding input data D is logically inversed by the NAND gate 985 and further logically inversed by the inverter 998, whereby the logical level of the immediately preceding input data D transparently appears in the non-inverted output Out.

After this, when the clock input terminal CK is switched to L level, the switches 983 and 997 are turned on and the switches 987 and 991 are turned off. Thus, supply of the logical level of the input data D to the other input of the NAND gate 985 stops. However, at this time, the switch 987 turns on, so that the inverter 986 inverts an output state of the immediately preceding NAND gate 985, and supplies it to the other input of the NAND gate 985. Therefore, the output of the NAND gate 985 is left to maintain the output state of the immediately preceding NAND gate 985.

At this time, since the switch 991 is ON and the switch 997 is OFF, the immediately preceding output state of the NAND gate 985 transparently appears at the non-inverted output Out through the inverters 994 and 998 further. Therefore, the logical level of the data input held by the NAND gate 985 and the inverter 989 transparently appears at the non-inverted output Out.

After this, when the clock input terminal CK is switched to L level, the switch 991 is turned off and the switch 997 is turned off. Thus, supply of the output state of the NAND gate 985 to the inverter 994 stops. However, at this time, the switch 997 turns on, so that the inverter 996 inverts the output state of the immediately preceding inverter 994, and supplies it to the input of the inverter 994. Therefore, the output of the inverter 994 is left to maintain the output state of the immediately preceding inverter 994. Therefore, even if the clock input terminal CK is switched to L level, the logical level of the immediately preceding data input held by the NAND gate 985 and the inverter 989 continues to appear in the non-inverted output Out as it is.

Therefore, DFF414 of such a structure takes in the input data D in synchronization with the edge formed such that the clock input terminal CK changes from L level to H level, and continues to hold the data until the reset signal Reset to the reset terminal R reaches H level.

The gate circuit 420 has AND gates 422, 424, 426, 428, 430, and 432. The AND gates 422, 424, 426, 430, 432 are two-input type. The AND gate 428 is three-input type.

Taking the judging reference signal f1 of frequency fLow inputted into the frequency comparison result storage unit 172 as a count clock, the setup signal generation unit 410 carries out binary count operation at the falling edge (rising edge of the inversion judging reference signal xf0) of the judging reference signal f1 by means of the binary counter unit 412. According to the count result, it generates the setup signal S [N–#] (# is 1, 2, 3, . . . : 1 is on MSB side) supplied to each setup input terminal S of each of the following data storage unit 460.

Synchronizing with the falling edge (rising edge of the inversion judging reference signal xf0) of the judging reference signal f0, the non-inverted output xQ is caused to be at H level in order from a higher bit by a predetermined number of clocks of the judging reference signal f0 of frequency fLow in the data storage unit 460.

Thus, in the setup signal generation unit 410, by means of the output of each DFF414, the first active level (H level, in this example) of the setup signal S [N–#] (# is 1, 2, 3, . . . : 1 is on MSB side) to each setup input terminal S of each data storage unit 460 for each bit is arranged to shift by a predetermined number of clocks of the judging reference signal f0 with frequency fLow.

Here, the predetermined number of clocks as in "to shift by a predetermined number of clocks" is set up according to how many clocks one processing cycle (where the frequency adjusting period is synthesized with the frequency search period in the frequency search by using binary search) has. For example, in the case where one processing cycle of the frequency search by using binary search corresponds to one clock of the judging reference signal f0, the shifting is carried out by one clock at a time. In the case where one processing cycle of the frequency search by using binary search corresponds to two clocks of the judging reference signal f0 (in the case of the example shown in FIG. 10), the shifting is carried out by two clocks at a time.

As an example, as shown in the timing chart (N=10 in the figure) of FIG. 16, when the reset signal Reset moves to L level, in synchronization with the "1+#"th falling edge of the judging reference signal f0 after the reset has been canceled, in order for the signal S [N–#] supplied to the setup input terminal S of a data storage unit 460_N–# to move to H level, a timing at which the setup signal S [N–#] reaches H level first is shifted by one clock at a time.

Here, according to the processing cycle which performs the frequency search by using binary search, the gain characteristic information obtaining unit 107A of this embodiment may only match the timing at which the setup signal S [N–#] reaches H level first (in the example shown in FIG. 16, it is shifted by one clock of the judging reference signal f0). Even if there is a pulse which reaches H after it, there is not any inconvenience.

However, in this embodiment, as shown in FIG. 10, the frequency comparison unit 170 judges whether the frequency is high or low at the falling edge of the enable signal EN (obtained by dividing the judging reference signal f0 into one half). According to the result, it is necessary to control the current control oscillation unit 101A so as to be a target frequency, and to judge whether a frequency of the control result is high or low at the falling edge of the enable signal EN in the following cycle.

Based on this, it is preferable that one cycle in which the frequency search by using binary search is carried out is for one cycle of the enable signal EN instead of one cycle of the judging reference signal f0. After all, it is thought that it is preferable that it is for two cycles of the judging reference signal f0. In order to cope with this, it is thought that it is necessary for the setup signal generation unit 410 to shift the timing at which the setup signal S [N–#] reaches H level first by two clocks at a time instead of one clock at a time.

In order to cope with this, an arrangement is such that, in the setup signal generation unit 410 as shown in FIG. 14, the gate circuit 420 transparently outputs first an inverse output xQ2 of the second DFF 414_2 as the setup signal S [N–1; 9 in this example]. Further, an inverse output xQ3 of the third DFF 414_3 is transparently outputted as the setup signal S [N–2; 8 in this example]. Furthermore, a logical product of the inverse output xQ2 of the second DFF 414_2 and the inverse output xQ3 of the third DFF 414_3 by means of the AND gate 422 is outputted as the setup signal S [N–3; 7 in this example].

Further, an inverse output xQ4 of the fourth DFF 414_4 is transparently outputted as the setup signal S [N–4; 6 in this example]. Furthermore, a logical product of the inverse output xQ2 of the second DFF 414_2 and the inverse output xQ4 of the fourth DFF 414_4 by means of AND gate 424 is outputted as the setup signal S [N–5; 5 in this example]. Still further, a logical product of the inverse output xQ3 of the third DFF 414_3 and the inverse output xQ4 of the fourth DFF 414_4 by means of the AND gate 426 is outputted as the setup signal S [N–6; 4 in this example]. Furthermore, a logical product of the inverse output xQ2 of the second DFF 414_2 and the inverse output xQ3 of the third DFF 414_3 and the inverse output xQ4 of the fourth DFF 414_4 by means of the AND gate 428 is outputted as the setup signal S [N–7; 3 in this example].

Further, an inverse output xQ5 of the fifth DFF 414_5 is transparently outputted as the setup signal S [N–8; 2 in this example]. Furthermore, a logical product, by means of the AND gate 430, of the inverse output xQ2 of the second DFF 414_2 and the inverse output xQ5 of the fifth DFF 414_5 is outputted as the setup signal S [N–9; 1 in this example]. Still further, a logical product of the inverse output xQ3 of the third DFF 414_3 and an inverse output xQ5 of the fifth DFF 414_5 by means of the AND gate 432 is outputted as the setup signal S [N–10; 0 in this example].

Since the gate circuit 420 of such a structure is provided, as shown in the timing chart (N=10 in the figure) of FIG. 17, the reset signal Reset is at L level, whereby the timing at which the setup signal S [N–#] first reaches H level is shifted by two clocks, so that the set signal S [N–#] to be supplied to the setup input terminal S of the data storage unit 460_N–# may move to H level in synchronization with the "1+#"th falling edge of the judging reference signal f0 after reset has been canceled.

<Details of First Data Storage Unit>

As for the data storage unit 460 constituted by an RS latch for each bit, the N-bit setup signal of the setup signal generation unit 410 is inputted into the setup input terminal S so that it may correspond to each bit. For example, the setup signal of the most significant bit (MSB) of the setup signal generation unit 410 is inputted into the setup input terminal S of the data storage unit 460 which takes charge of the most significant bit (MSB). Hereafter, the setup signal of the lower bit (MSB-% where % is 1, 2, . . . ) of the setup signal generation unit 410 is inputted in order into the setup input terminal S of the data storage unit 460 which takes charge of the lower bit (MSB-% where % is 1, 2, . . . ). Further, in each data storage unit 460, the inverse reset signal xReset is caused to be the reset signal Reset through the inverter 406, then inputted into each reset input terminal R in common.

As shown in FIG. 18A, the RS latch used as the first data storage unit 460 has an inverter 462 for inverting the setup signal S, an inverter 464 for inverting the reset signal R, and two two-input type NAND gates 466 and 468.

As for the NAND gate 466, the output (i.e., an inversion signal xS, inverted setup signal S) of the inverter 462 is inputted into one input, and the output (i.e., an inversion signal xQ, inverted setup output) of the NAND gate 468 is inputted into the other input. As for the NAND gate 468, the output (i.e., an inverse output signal xR) of the inverter 464 is inputted into one input, and the output (i.e., non-inverted output signal Q) of the NAND gate 466 is inputted into the other input.

The data (set output) outputted from each output terminal Out of each data storage unit 460 for each bit is used as a clock signal to each clock input terminal CK of each data storage unit 480 for each corresponding bit, and is used as each control signal Control [N-#] (# is 1, 2, 3, . . . : 1 is on the MSB side) for each bit to which each of the DA conversion units 174A_1 and 174A_2 (collectively referred to as 174A) corresponds.

A truth table in operation of the data storage unit 460 of such a structure is as shown in FIG. 18B. For example, when both the setup signal S and the reset signal R are "0; L levels", the inverse output terminal and the output terminal Out which is a non-inversion output terminal maintain the immediately preceding state (that is, the output data do not change). Further, if the reset signal S reaches "1; H level" when the setup signal S is at "0; L level", then the output terminal Out which is the non-inversion output terminal moves to "0; L level" and the inverse output terminal reaches "1; H level". Thus an output logic state is reset.

Further, if the setup signal S reaches "1; H level" when the reset signal S is "0; L level", then the output terminal Out which is the non-inversion output terminal reaches "1; H level", and the inverse output terminal moves to "0; L level". Thus, the output logic state is set up. When both the setup signal S and the reset signal R are "1; H levels", both the inverse output terminal and the output terminals Out that is the non-inversion output terminal move to "1; H level". However, this state is usually considered as a prohibition state.

Therefore, as the reset input terminal R is moved to H level, each data storage unit 460 which is at the first stage and constituted by such an RS latch causes the set output terminal Out to be at L level (that is, it is reset). In a situation where the reset input terminal R is at L level, the output terminal Out is moved to H level by taking the output (H level) for each bit of the binary counter unit 412 into the corresponding setup input terminal S. As a result, a timing at which the control signal Control [N-#] which is an example of the bit switch signal matches a timing at which the setup signal S [N-#] first becomes active (H level in this example) after reset.

<Details of Second Data Storage Unit>

As for the data storage unit 480 for each bit constituted by DFF, the output data of the first data storage unit 460 is inputted into the clock input terminal CK for each bit as a clock signal Clock. For example, the data output of the data storage unit 460 which takes charge of the most significant bit (MSB) is inputted into the clock input terminal CK of the data storage unit 480 which takes charge of the most significant bit (MSB). Hereafter, the data output of the data storage unit 460 which takes charge of a lower bit (MSB-% where % is 1, 2, . . . ) is inputted into the clock input terminal CK of the data storage unit 480 which takes charge of a lower bit (MSB-% where % is 1, 2, . . . ) in order.

Further, as for each data storage unit 480 constituted by DFF, the frequency comparison result fcomp from the frequency comparison unit 170 is inputted into the data input terminal D in common. Further, as for each data storage unit 480, the inverse reset signal xReset is caused to be the reset signal Reset through the inverter 406, then inputted into each reset terminal R in common.

The data (reflecting the frequency comparison result fcomp) outputted from each output terminal Out of each data storage unit 480 for each bit is used as each corresponding up-and-down signal UpDown of the DA conversion unit 174A for each bit [N-#] (# is 1, 2, 3, . . . : 1 is on the MSB side).

As shown in FIG. 18A, DFF used as the second data storage unit 480 includes an inverter 482 for inverting the frequency comparison result fcomp, inverters 485, 486, and 488, and ON/OFF switches (hereafter simply referred to as switches) 483 and 487.

The switch 483 is provided between an output of the inverter 482 and an input of the inverter 485. The output of the inverter 485 is connected to an input of the inverter 486. The output of the inverter 486 is connected to the input of the inverter 485 through the switch 487.

A memory circuit (latch) is constituted by the inverters 485 and 486 in a situation where the switch 487 is ON.

Further, the data storage unit 480 includes an inverter 492 for inverting the reset signal R, a two-input type NAND gate 494, inverters 496 and 498, and ON/OFF switches (hereafter simply referred to as switches) 491 and 497.

An output of the inverter 492 is connected to one input of the NAND gate 494. The other input of the NAND gate 494 is connected with the output of the inverter 485 through the switch 491 and connected to the output of the inverter 496 through the switch 497. Further, an output of the NAND gate 494 is connected to each input of the inverters 496 and 498. The output of the inverter 498 is connected to the data output terminal Out.

The memory circuit (latch) is constituted by the NAND gate 494 and the inverter 496 in a situation where an input on the inverter 492 side of the NAND gate 494 is at H level and the switch 497 is ON.

The clock input terminal CK is directly connected with control terminals of the switches 483 and 497 and connected to control terminals of the switches 487 and 491 through an inverter 488. Here, each of the switches 483, 487, 491, and 497 is a switch of a type which is turned on when the control terminal is at L level (that is, the clock input terminal CK is at L level) and is turned off when the control terminal is at H level (that is, the clock input terminal CK is at H level).

Each of the switches 483, 487, 491, and 497 may be a switch of a type which is turned off when the control terminal is at L level (that is, the clock input terminal CK is at L level) and is turned on when the control terminal is at H level (that is, the clock input terminal CK is at H level). In this case, as shown in FIG. 18C, with respect to the structure shown in FIG. 18A, the clock input terminal CK may only be connected with the control terminals of the switches 487 and 491 directly and be modified to be connected with the control terminals of the switches 483 and 497 through the inverter 488.

In the data storage unit 480 of such a structure, firstly, if the reset signal R to the inverter 492 is at H level, then the output of the inverter 492 (i.e., one input of the NAND gate 494) is at L level, whereby its output is at H level irrespective of the other input of the NAND gate 494. Thus, the data output terminal Out is caused to be at L level through the inverter 498. In other words, the data output is reset.

After this, if the reset signal R to the inverter 492 moves to L level, the output (i.e., one input of the NAND gate 494) of the inverter 492 reaches H level, whereby the output of the NAND gate 494 comes to reflect the other input it the NAND gate 494.

For example, when the clock input terminal CK is at L level at this time, the switches 483 and 497 are ON and the switches 487 and 491 are OFF. Therefore, the inverter 496 first inverts the output (H level) of the NAND gate 494 at the time of reset to supply L level to the other input of the NAND gate 494. Therefore, the output of the NAND gate 494 is left to maintain H level and the data output remains reset.

At this time, the frequency comparison result fcomp is taken into the inside of the input side. In other words, the switch 483 is turned on, so that the data obtained by inverting the frequency comparison result fcomp by means of the inverter 482 is transmitted to the inverter 485 through the switch 483. Since the switches 487 and 491 are OFF, the logical level of the frequency comparison result fcomp is in a situation where it appears transparently at the output of the inverter 485.

When the clock input terminal CK is switched to H level next, the switches 483 and 497 are turned off and the switches 487 and 491 are turned on. Thus, supply of the frequency comparison result fcomp via the inverter 482 and switch 483 to the inverter 485 stops. However, when the switch 487 is turned on, the output of the immediately preceding inverter 485 (i.e., logical level of the immediately preceding frequency comparison result fcomp) is logically inverted via the inverter 486 and returned to the input. As a result, the logical level of the immediately preceding frequency comparison result fcomp is held by the inverters 485 and 486.

Further, since the switch 491 is ON, the logical level of the immediately preceding frequency comparison result fcomp which is the output of the inverter 485 is supplied to the one input of the NAND gate 494. As a result, the logical level of the immediately preceding frequency comparison result fcomp is logically inverted by the NAND gate 494 and further logically inverted by the inverter 498, whereby the logical level of the immediately preceding frequency comparison result fcomp appears in the data output terminal Out as it is.

After this, when the clock input terminal CK is switched to L level, the switches 483 and 497 are turned on and the switches 487 and 491 are turned off, whereby supply to the one input of the NAND gate 494 of the logical level of the frequency comparison result fcomp stops. However, at this time, if the switch 497 is turned on, then the inverter 496 inverts the output state of the immediately preceding NAND gate 494 to supply it to the other input of the NAND gate 494. Therefore, the output of the NAND gate 494 is left to maintain the output state of the immediately preceding NAND gate 494. Thus, even if the clock input terminal CK is switched to L level, the logical level of the immediately preceding frequency comparison result fcomp continues to appear in the data output terminal Out as it is.

Therefore, each second data storage unit 480 constituted by such DFF considers the edge at which the set output of the data storage unit 460 moves from L level to H level as a switch timing of bit-weighting, takes in the frequency comparison result fcomp from the frequency comparison unit 170, and continues to hold the data until the reset signal Reset to the reset terminal R is at H level. The data held by the data storage unit 480 is outputted through the data output terminal Out.

In this way, in the frequency comparison result storage unit 172 of this embodiment, DFF used as the second data storage unit 480 is a circuit of a type which uses a static latch (a memory circuit constituted by the inverters 482 and 485 and a memory circuit constituted by the NAND gate 494 and the inverter 496) as shown in FIG. 18A. The frequency comparison result fcomp of the frequency comparison unit 170 stored in the memory circuit for every bit is arranged to continue to be held until the reset signal R is inputted again.

Considering the processing cycle of frequency search by using binary search as two clocks of the judging reference signal f0, FIG. 19 shows a timing chart which corresponds to FIG. 10 and illustrates the whole operation of the frequency comparison unit 170 and the frequency comparison result storage unit 172. As can be seen from FIG. 19, the up-and-down signal UpDown for each bit showing the frequency comparison result fcomp is arranged to be outputted sequentially from the MSB side.

Here, since the frequency comparison unit 170 and the frequency comparison result storage unit 172 are arranged to operate upon input of the judging reference signals f0 of the same frequency FLow, they operate completely in synchronization with each other. In addition, as described above, since the frequency comparison unit 170 is arranged to operate according to the enable signal EN which operates in synchronization with the rising edge of the judging reference signal f0, it operates according to the rising edge of the judging reference signal f0. On the other hand, the frequency comparison result storage unit 172 is arranged to operate according to the falling edge of the judging reference signal f0.

Thus, as shown in FIG. 19, after the frequency comparison result fcomp is secured by means of the falling edge of the enable signal EN which is in synchronization with the rising edge of the judging reference signal f0, it is possible to take in the logic state of the frequency comparison result fcomp by means of the edge of the bit switch signal emitted from the data storage unit 460, in synchronization with the falling edge of the judging reference signal f0, so as to avoid malfunction due to a timing with respect to incorporation of the frequency comparison result fcomp.

The example as shown here is an example in which the processing cycle of the frequency search by using binary search is equivalent to two clocks of the judging reference signal f0. However, even if the processing cycle of the frequency search by using binary search is equivalent to one clock of the judging reference signal f0, a timing at which the setup signal reaches H level may be somewhat delayed compared to the falling edge of the judging reference signal f0, for example, by means of gate delay, thus being able to prevent malfunction due to the timing with respect to the incorporation of the frequency comparison result fcomp.

Example of Structure of DA Conversion Unit and Operation

First Embodiment

Figure 20:
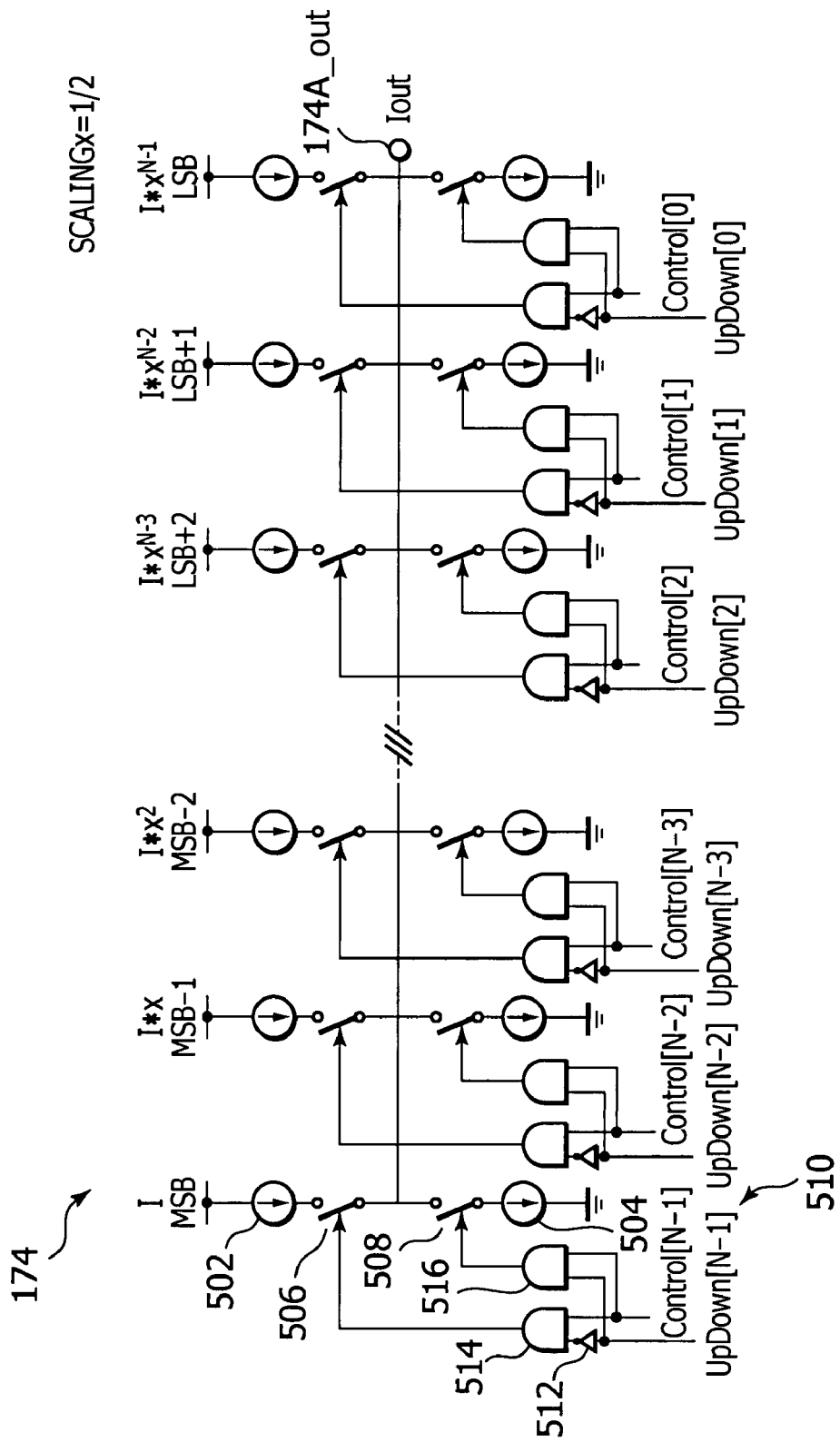
FIG. 20 is a diagram showing a detailed example of a structure of a current output type DA conversion unit (basic form).

FIG. 20 is a diagram showing a detailed example of a structure of the current output type DA conversion unit 174A. Although a basic form is shown here, it is preferable to refer to what is shown FIG. 24.

As shown in FIG. 20, the DA conversion unit 174A includes N source-current source 502 (N corresponds to N frequency search by using binary searches) corresponding to the respective bits, N sink-current supplies 504, output switches 506 and 508 for selectively synthesizing output of the respective current supplies 502 and 504, and a switching unit 510 for switching between a source mode and a sink mode in which a 1-bit current source 501 may be by controlling ON/OFF operation of the output switches 506 and 508 of the respective current supplies 502 and 504 (reference numerals are used only for the most significant bit MSB in the figure). Here, each of the output switches 506 and 508 is a switch of a type which turns off when the control terminal is at L level and turns on when the control terminal is at H level.

In each source-current source 502, one side is connected to the power supply side and the source side of the other side is connected to the output switch 506. In each sink-current source 504, one side is connected to the reference potential (grounding potential GND), and the sink side of the other side is connected to the output switch 508.

Each output switch 506 for each bit is connected to each corresponding output switch 508 for each bit at the opposite side of the source-current source 502 and at the opposite side of the sink current source 504. A connection point is connected with a current output terminal 174A_out in common in every bit. A current summing result of each bit is outputted through the current output terminal 174A_out as a DA output signal. In the case of the DA conversion unit 174A_1, the DA output signal is the output current signal Iout_1. Further, in the case of the DA conversion unit 174A_2, it is the output current signal Iout_2.

Each switching unit 510 for each bit controls ON/OFF operation of the output switches 506 and 508 according to the data stored in the frequency comparison result storage units 172_1 and 172_2, so that the switching is carried out to allow the 1-bit current source 501 to generate either the source-current or the sink-current.

As a structure for this, the switching unit 510 has an inverter 512 for logically inverting the up-and-down signal UpDown [N–#] (# is 1, 2, 3, . . . : 1 is on MSB side) for the corresponding bit outputted from the data storage unit 480 of the frequency comparison result storage unit 172, and two two-input type AND gates 514 and 516.

In an AND gate 514, a signal obtained by logically inverting the up-and-down signal UpDown [N–#] by means of the inverter 512 is inputted into one input terminal, and the control signal Control [N–#] (# is 1, 2, 3, . . . : 1 is on MSB side) for the corresponding bit of the frequency comparison result storage unit 172 is inputted into the other input terminal. The output is supplied to the control terminal of the output switch 506 on the source-current source 502 side. In an AND gate 516, the up-and-down signal UpDown [N–#] is inputted into one input terminal, and the control signal Control [N–#] is inputted into the other input terminal. The output is supplied to the control terminal of the output switch 508 on the sink current source 504 side.

The source-current source 502 and the sink-current source 504 are arranged to source or sink the same amount of current corresponding to the bit-weighting for each bit. For example, the most significant bit is provided with the maximum current amount I, the lower bit is provided with half the current amount (or more than half) and so on. The lower the bit, the less the current amount. Preferably, I for MSB, $I/\{2^\&\}$ (& is 1, 2, . . . , N–2, and N–1) for lower bits in order. In this example, scaling x is set to one half and the bit-weighting is carried out by the "power".

Further, by pairing the source-current source 502 and the sink-current source 504 of the same amount of current into one pair and by controlling the output switches 506 and 508 based on the control signal Control and the up-and-down signal UpDown, the pair of current sources 502 and 504 (also referred to as 1-bit current source 501) perform current input-and-output operation of either source-current or sink-current based on the up-and-down signal UpDown outputted from the frequency comparison result storage units 172_1 and 172_2 only when the control signal Control is effective (at H level).

In particular, when the up-and-down signal UpDown is at H level or when the oscillation frequency fcco is higher than the judging reference frequencies f1 and f2, then the output of AND gate 514 is at L level and the output of AND gate 516 is at H level. Thus, the output switch 506 is turned off when the control terminal moves to L level, and the output switch 508 is turned on when the control terminal reaches H level, whereby each of the pair of the current supplies 502 and 504 performs the sink operation.

On the other hand, when the up-and-down signal UpDown is at L level or when the oscillation frequency fcco is lower than the judging reference frequencies f1 and f2, then the output of AND gate 514 reaches H level, and the output of AND gate 516 moves to L level. Thus, the output switch 506 is turned on when the control terminal is at H level, and the output switch 508 is turned off when the control terminal is at L level, whereby each of the pair of the current supplies 502 and 504 performs the source operation.

Further, as can be seen from FIG. 19 as shown previously, the up-and-down signal UpDown for each bit showing the frequency comparison result fcomp is outputted sequentially from the most significant bit (MSB) side. The DA conversion unit 174A also operates the 1-bit current source 501 (pair of current supplies 502 and 504) in order from the most significant bit (MSB) according to the frequency comparison result fcomp of the frequency comparison unit 170.

<Details of Operation of Oscillation Gain Compensation Unit>

Figure 21:
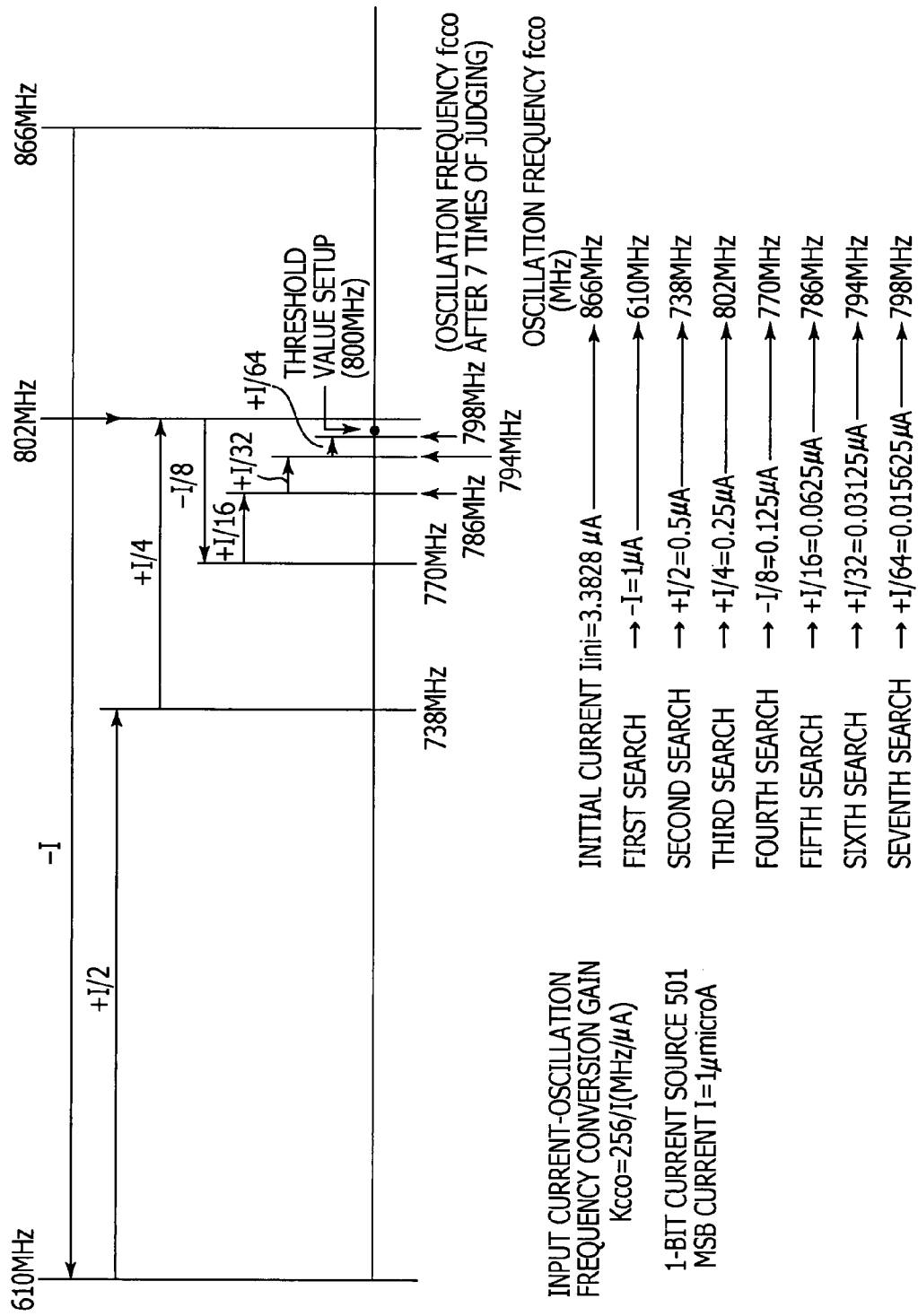
FIG. 21 is a chart for explaining the whole operation of the gain characteristic information obtaining unit.

FIG. 21 is a chart for explaining the whole operation of the gain characteristic information obtaining unit 107A. Here, FIG. 21 shows an example of a situation of convergence of the oscillation frequency fcco of the current control oscillation unit 101A when operating according to the timing chart as shown in FIG. 19.

Circuit operation of the frequency comparison unit 170, the frequency comparison result storage unit 172, and the DA conversion unit 174A is summarized as follows. Namely, at first, every time frequency comparison is performed by the frequency comparison unit 170, the 1-bit current source 501 operates sequentially from the higher bit of the DA conversion unit 174A. Based on the frequency comparison result fcomp by the frequency comparison unit 170, the source or the sink of the frequency control current Iosci is carried out to adjust the oscillation control current Icnt supplied to the frequency control input terminal 101Ain of the current control oscillation unit 101A, so that the oscillation frequency fcco of the current control oscillation unit 101A may be lowered if it is higher than the judging reference frequencies f1 and f2, or alternatively it may be raised if it is lower. Thus, the oscillation frequency fcco of the current control oscillation unit 101A converges towards the judging reference frequencies f1 and f2 determined by the frequency division ratios M1 and M2.

Such a frequency adjustment technique will be referred to as the frequency search by using binary search method. There is the following non-patent document 4 as a conventional example of frequency search by way of binary search. Although the frequency search by using binary search (or binary search) of the present embodiment is fundamentally the same as that of the non-patent document 4, there are differences in particular arrangements.

Kun-Seok Lee, Eun-Yung Sung, In-Chul Hwang, and Byeong-Ha Park, "Fast AFC technique using a code estimation and binary search algorithm for wideband frequency synthesis", Proceedings of ESSCIRC, Grenoble, France, 2005, and p.p 181-184 (non-patent document 4)

For example, in the structure of the present embodiment, as shown in FIG. 21, it is assumed first that the current control oscillation unit 101A has a characteristic that the more the oscillation control current Icnt supplied to the frequency control input terminal 101Ain is, the higher the oscillation frequency fcco is.

Further, ideally, it should be a frequency (for example, 800 MHz) found under the conditions of regulation current In (=initial current Iini in FIG. 3) from the regulation current source 109A as will be described later. However, it is assumed that because of the variation in the input current-oscillation frequency conversion gain Kcco of the current control oscillation unit 101A, it is oscillating at, for example, 866 MHz (initial frequency) only with the regulation current In (the initial current Iini). The oscillation frequency fcco of the current control oscillation unit 101A as described above will be converged towards a target frequency of 800 MHz.

In addition, it is assumed that the input current-oscillation frequency conversion gain Kcco of the current control oscillation unit 101A does not have a nonlinear characteristic within a control range of interest to the oscillation control current Icnt. As an example, it is assumed to be 256/I [MHz/µA]. Further, it is assumed that the current value I of the most significant bit of the 1-bit current source 501 for each bit is 1 µA.

The current value of this regulation current source 109A is an input current value whose oscillation frequency of CCO corresponds with the clock frequency or a frequency of a reception data rate under the conditions of an ideal state (ideal; 25° C. (room temperature)) which is an example of a normal state.

It is, for example, assumed that the judging reference frequency f1 of the frequency comparison unit 170 is the oscillation frequency fcco=800 MHz, (the convergence value). The oscillation frequency fcco=866 MHz (initial frequency) with the regulation current In (initial current Iini in FIG. 3) is naturally higher than the oscillation frequency fcco=800 MHz, (the convergence value). Therefore, as for the output current signal Iout from the DA conversion unit 174A in the first search, the current I with respect to the 1-bit current source 501 for MSB is sank first, the oscillation control current Icnt supplied to the frequency control input terminal 101Ain of the current control oscillation unit 101A is "In–I", and the oscillation frequency fcco is 610 MHz.

Since 610 MHz is lower than the oscillation frequency fcco=800 MHz, (the convergence value); as in the output current signal Iout from the DA conversion unit 174A in the second search, the current I/2 by means of the 1-bit current source 501 for "MSB-1" is sourced, the oscillation control current Icnt supplied to the frequency control input terminal 101Ain of the current control oscillation unit 101A becomes "In–I+I/2", and the oscillation frequency fcco becomes 738 MHz.

Since 738 MHz is lower than the oscillation frequency fcco=800 MHz, (the convergence value); as in the output current signal Iout from the DA conversion unit 174A in the third search, the current I/4 by means of the 1-bit current source 501 for "MSB-2" is sourced, the oscillation control current Icnt supplied to the frequency control input terminal 101Ain of the current control oscillation unit 101A becomes "In–I+I/2+I/4", and the oscillation frequency fcco becomes 802 MHz.

Since 802 MHz is higher than the oscillation frequency fcco (=800 MHz, the convergence value); as in the output current signal Iout from the DA conversion unit 174A in the fourth search, the current I/8 by means of the 1-bit current source 501 for "MSB-3" is sank, the oscillation control current Icnt supplied to the frequency control input terminal 101Ain of the current control oscillation unit 101A becomes "In–I+I/2+I/4–I/8", and the oscillation frequency fcco becomes 770 MHz.

Repeating such operation seven times, the oscillation control current Icnt supplied to the frequency control input terminal 101Ain of the current control oscillation unit 101A after 7 times judging becomes "In–I+I/2+I/4–I/8+I/16+I/32+I/64". The oscillation frequency fcco becomes 798 MHz, which is quite close to the oscillation frequency (=800 MHz) of the convergence value (=the judging reference frequency). Repeating the judgment more than seven times may bring the oscillation frequency fcco as close as possible to 800 MHz.

Furthermore, the output current signal Iout (=–I+I/2+I/4–I/8+I/16+I/32+I/64+(judgment result of the 8th henceforth)) supplied from the DA conversion unit 174A to the frequency control input terminal 101Ain at this time is stored in the data storage unit 480 constituted by DFF of the DA conversion unit 174A as digital data (in this case, 1001000 . . . ). Therefore, this means that the frequency comparison result storage unit 172 of the gain characteristic information obtaining unit 107A has stored the output current signal Iout indicating the compensation for the initial current Iini for oscillating the current control oscillation unit 101A at 800 MHz after the frequency search by using binary search.

The above description illustrates the example in which the current value of the 1-bit current source 501 constituting the current output type DA conversion unit 174A is halved for each bit in order from the most significant bit. However, if the current value of the 1-bit current source 501 varies in such a case, frequency search accuracy may be worsened considerably and gain compensation accuracy may also be worsened. In order to avoid this, it is necessary to make current source scaling larger than one half. It is preferable to determine a value of this current source scaling in consideration of change of the input current-oscillation frequency conversion gain Kcco due to the manufacture variation and the temperature change of the current control oscillation unit 101A.

<About Current Source Scaling>

Figure 22:
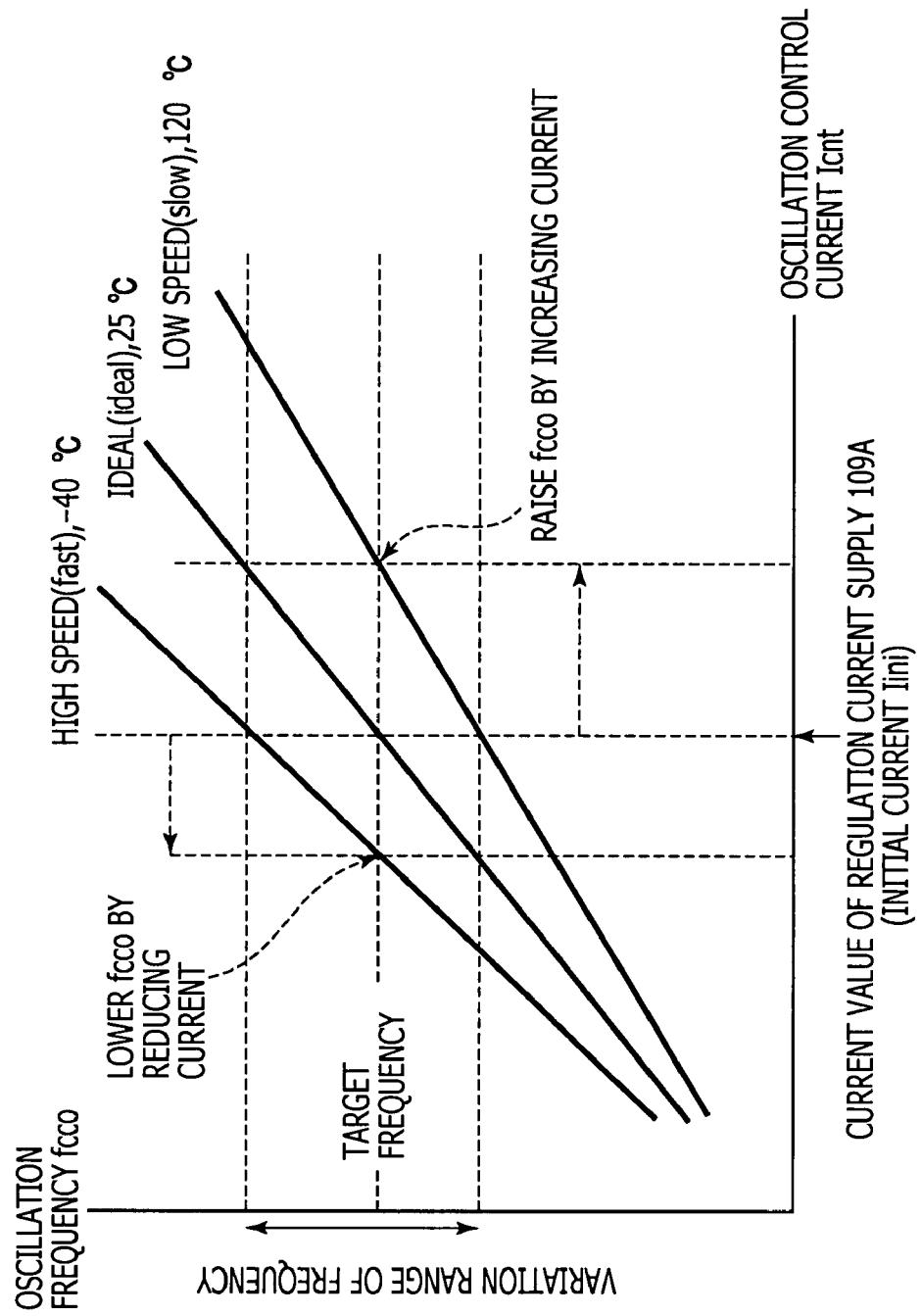
FIG. 22 is a graph showing an example in which an input current-oscillation frequency conversion gain Kcco changes with manufacture variations and temperature changes of the current control oscillation unit.
Figure 23:
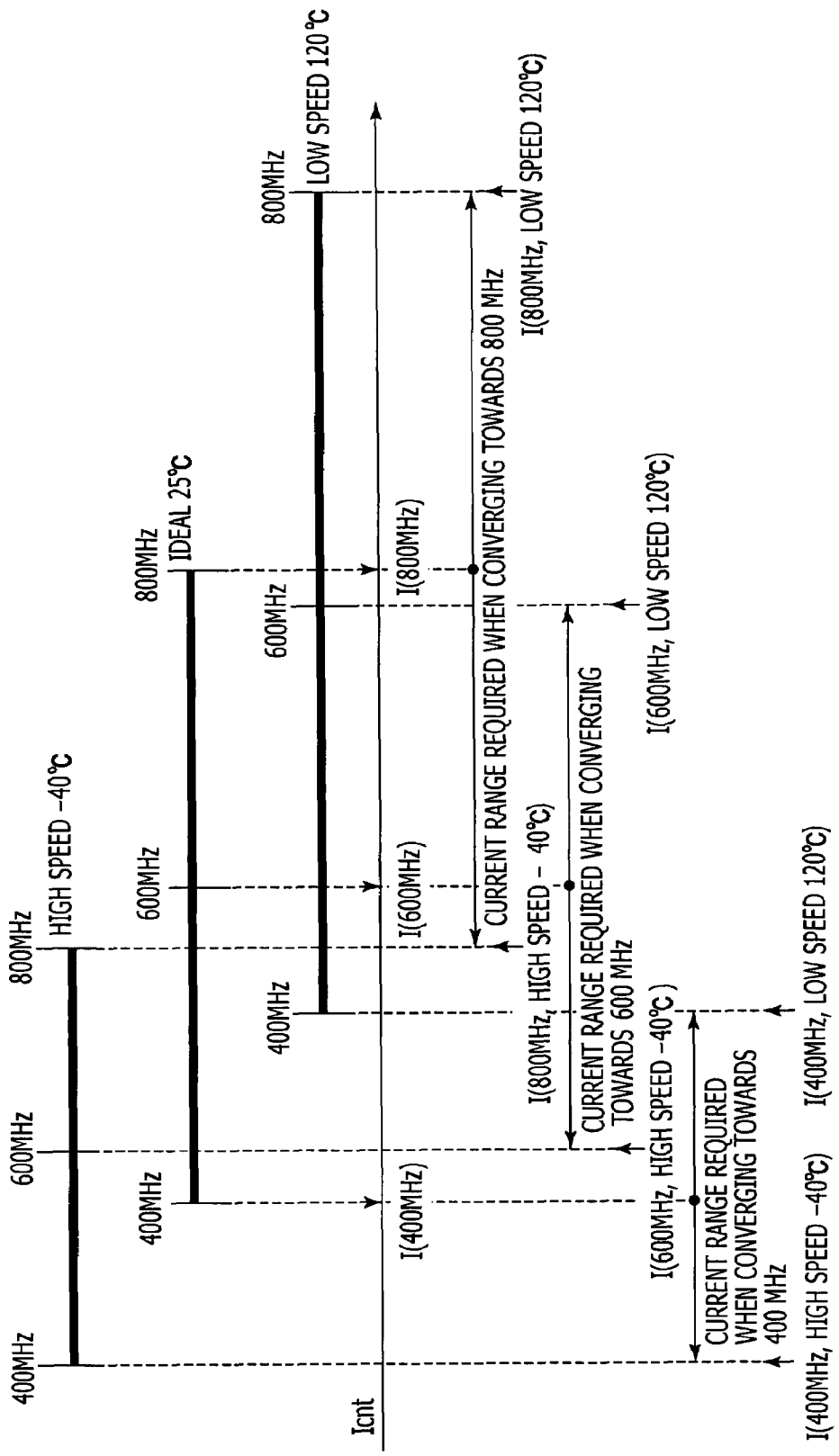
FIG. 23 is a chart for explaining a required output current range of the DA conversion unit.
Figure 24:
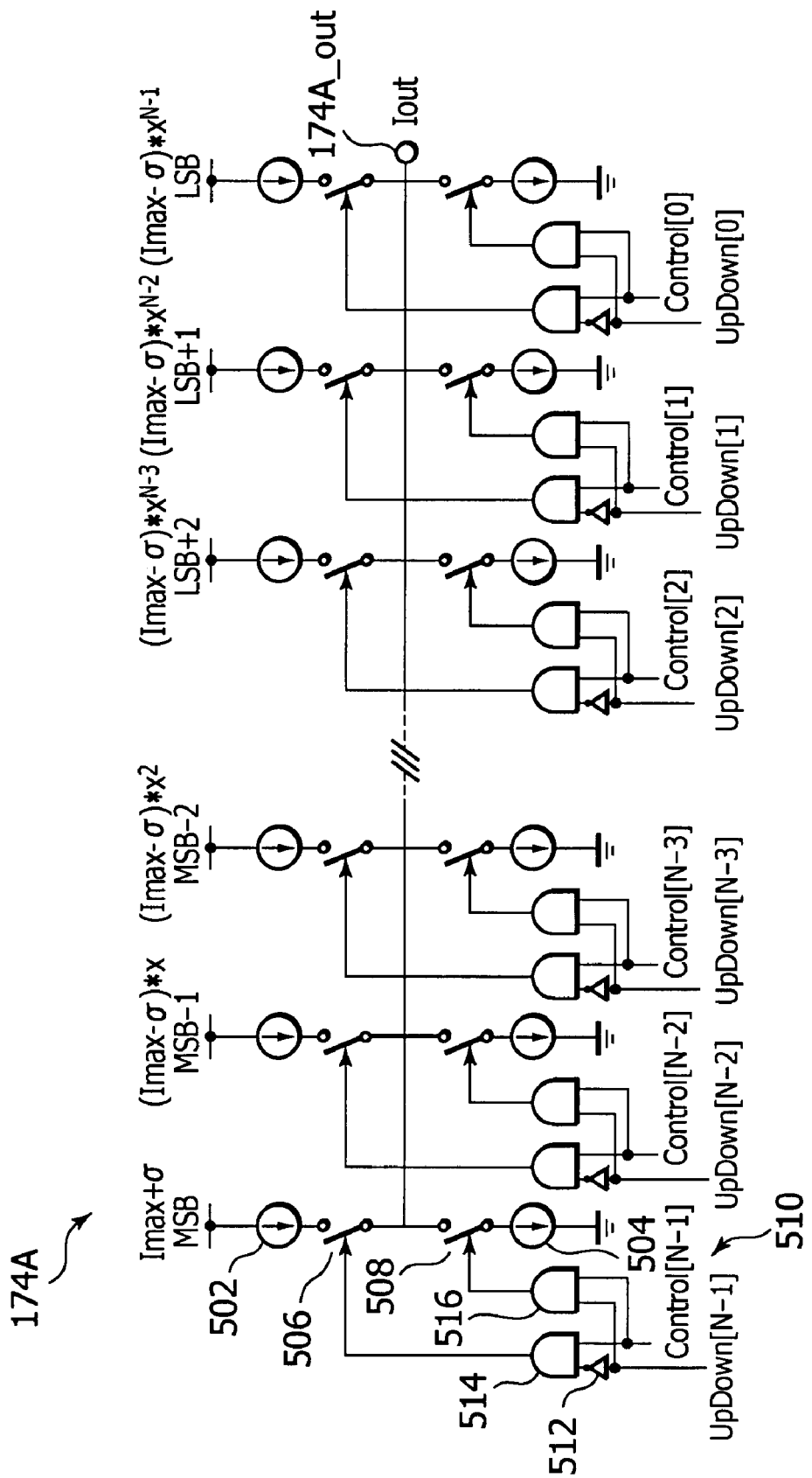
FIG. 24 is a diagram showing a structure of the DA conversion unit when scaling is set to x.
Figure 25:
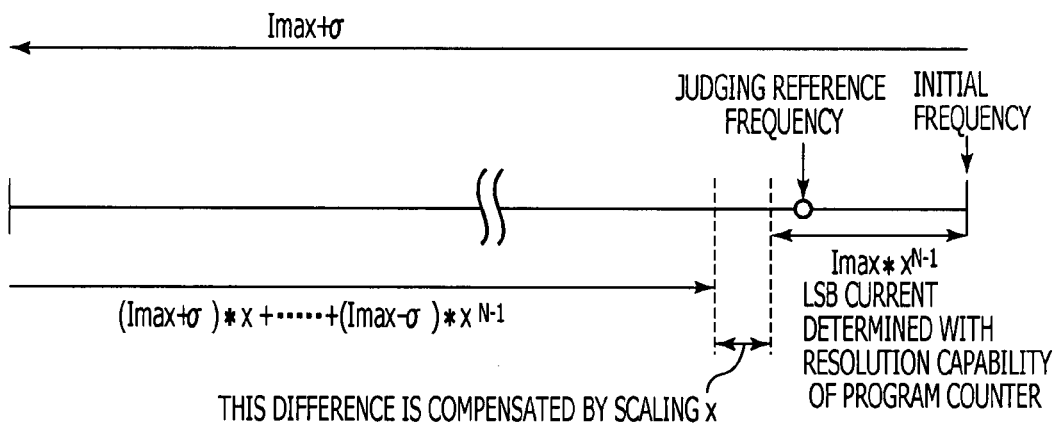
FIG. 25 is a chart showing an example in which the frequency search accuracy is most worsened in the case where the scaling is x.

FIGS. 22-25 are a graph, charts, and a diagram for explaining a method for determining the current source scaling indicative of weighting to be set for the current value of each 1-bit current source 501 which constitutes the DA conversion unit 174A; where, FIG. 22 is a graph showing an example in which the input current-oscillation frequency conversion gain Kcco changes with the manufacture variation and the temperature change of the current control oscillation unit 101A; FIG. 23 is a chart for explaining a required output current range of the DA conversion unit 174A; FIG. 24 is a diagram showing a structure of the DA conversion unit 174A when the scaling is set to x; and FIG. 25 is a chart showing an example in which the frequency search accuracy is most worsened in scaling x.

First, in FIG. 22, the ideal state (ideal) shows a characteristic of the current control oscillation unit 101A at the time of design, a high speed (fast) shows a characteristic when the performance of the transistor constituting the current control oscillation unit 101A after manufacture becomes higher than that at the time of the design, and a low speed (slow) shows a characteristic when the performance of the transistor constituting the current control oscillation unit 101A after the manufacture becomes lower than that at the time of the design.

Further, in FIG. 22 the characteristics are shown in consideration of the temperature change in addition to the states at time of the design and after the manufacture. Let the ideal state (ideal) be 25° C. (room temperature), the temperature characteristics are shown at −40° C. as a temperature in a direction of further increasing the high speed (fast) after the manufacture, and 120° C. as a temperature in a direction of further decreasing the low speed (slow) after the manufacture.

As shown, the regulation current In (fcco, ideal, 25° C.) (hereafter referred to as In (fcco)) from the regulation current source 109A in the characteristic of the ideal state at 25° C. (room temperature) is a current value for obtaining the oscillation frequency fcco which is needed under the conditions.

In this case, as can be seen from the chart, taking into consideration the temperature change also, the characteristic of the input current-oscillation frequency conversion gain Kcco of the current control oscillation unit 101A easily considerably shifts from the characteristic of the ideal state at 25° C. (room temperature) which is a reference at the time of the design. Therefore, the oscillation frequency fcco of the output oscillation signal Vout outputted from the current control oscillation unit 101A with the current value In (initial current Iini) of the regulation current source 109A varies. When this is taken into consideration, it is preferable to apply as follows.

First, it is assumed that a current value I_N−1 of the 1-bit current source 501_N−1 that takes charge of the most significant bit (MSB) which determines the maximum of the output current signal Iout outputted by the DA conversion unit 174A is Imax, and a current value of the regulation current source 109A is In. Considering both the case where every 1-bit current source 501 is sank and the case where it is sourced, one 1-bit current source 501 and the regulation current source 109A can change current within a range from "−2Imax+In: all being sank" to "2Imax+In: all being sourced" approximately. Imax is an example of the value S for specifying the frequency control signal (output current signals Iout_1 and Iout_2) of the most significant bit.

Here, as can be seen from FIG. 22, the regulation current In (fcco), which is from the regulation current source 109A in the characteristic of the ideal state at 25° C. (room temperature), which should be supplied to the frequency control input terminal 101Ain of the current control oscillation unit 101A, and which is needed to provide the oscillation frequency fcco, does not provide the oscillation frequency fcco under other conditions. Therefore, it is naturally necessary to have a current value different from the regulation current In in order to provide the oscillation frequency fcco. For example, under high speed (fast) and −40° C. conditions, it is necessary to match the target frequency (for example, judging reference frequency f1) by providing less current I (fcco, fast, −40° C.) than the regulation current In. Further, under low speed (slow) and 120° C. conditions, it is necessary to match the target frequency by providing more current I (fcco, slow, 120° C.) than the regulation current In.

In the DA conversion unit 174A, it is necessary to secure a range in which the gain can be compensated corresponding to this. Further, in order to correspond to a plurality of types of the oscillation frequencies fcco, the same DA conversion unit 174A must naturally be able to compensate for the gain with respect to the plurality of types of the oscillation frequencies fcco.

For example, FIG. 23 illustrates the case where the oscillation frequency fcco corresponds to three types, which are 400 MHz, 600 MHz, and 800 MHz, in the same the DA conversion unit 174A.

Although described above, in the phase synchronization unit 100 of the present embodiment, under the standard or ideal condition (under the characteristic of the ideal state at 25° C. (room temperature) in this example), in order to obtain the oscillation frequency fcco having the same frequency as the desired frequency only with the initial current Iini (=regulation current In), "the initial current Iini matched to the oscillation frequency fcco of the desired output oscillation signal Vout" (=the regulation current In) for each desired frequency (=oscillation frequency fcco) is set.

Therefore, for example, in the case where there are three types of data rates of the digital data sequence Din (400 MHz, 600 MHz, and 800 MHz), the regulation current In (fcco) from the regulation current source 109A corresponding to the characteristic of the ideal state at 25° C. (room temperature) may be three types, In (400 MHz), In (600 MHz), and In (800 MHz), for each of which the current I under the high speed (fast) and −40° C. conditions (fcco, fast, −40° C.) and the current I under the low speed (slow) and 120° C. conditions (fcco, slow, 120° C.) are taken into consideration. With respect to this, it is necessary to fit the compensation range of the DA conversion unit 174A. These relationships are expressed with equation (5).

$$\begin{aligned}
-2I_{max} + I_n(800 \text{ MHz}) < I(800 \text{ MHz, fast, } -40deg) & \quad (5\text{-}1) \\
I(800 \text{ MHz, slow, } 120deg) < 2I_{max} + I_n(800 \text{ MHz}) & \quad (5\text{-}2) \\
-2I_{max} + I_n(600 \text{ MHz}) < I(600 \text{ MHz, fast, } -40deg) & \quad (5\text{-}3) \\
I(600 \text{ MHz, slow, } 120deg) < 2I_{max} + I_n(600 \text{ MHz}) & \quad (5\text{-}4) \\
-2I_{max} + I_n(400 \text{ MHz}) < I(400 \text{ MHz, fast, } -40deg) & \quad (5\text{-}5) \\
I(400 \text{ MHz, slow, } 120deg) < 2I_{max} + I_n(400 \text{ MHz}) & \quad (5\text{-}6)
\end{aligned} \quad (5)$$

Therefore, in the example as shown in FIG. 23, as the current value I_N−1 of the 1-bit current source 501 which takes charge of the most significant bit (MSB), the current Imax must be selected which can satisfy all equations (5-1) through (5-6).

Thus, after the current value I_N−1 (=Imax) of the 1-bit current source 501_N−1 which takes charge of the most significant bit (MSB) is determined, a current value I_N−# set for each 1-bit current source 501_N−# (# is 2, 3, . . . , N) on the lower bit side and the number N of bits to be required are determined.

With respect to each current value I_N−#, basically the weighting corresponding to the weighting of each bit may only be carried out on the basis of the current value I_N−1 of the 1-bit current source 501_N−1.

On the other hand, it is necessary to determine the number N of bits to be required, in view of resolution to be required. For example, the frequency judging resolution of the program counter 302 of the frequency comparison unit 170 is determined by counted time. The counted time is a period (=1/fLow) of the enable signal EN. Thus, the frequency judging resolution of the program counter 302 is 2·fLow.

Here, it is assumed that an allowable maximum of the input current-oscillation frequency conversion gain Kcco due to the manufacture variation and the temperature change of the current control oscillation unit 101A is Kcco max, the current source scaling is x, and the number of bits of the DA conversion unit 174A is N. In order that the oscillation frequency fcco of the current control oscillation unit 101A converges at the frequency judging resolution (or less) of the program counter 302 after the frequency search by using binary search, the current value I_0 of a 1-bit current source 501_0 which takes charge of the least significant bit needs to satisfy equation (6).

$$x^{N-1} I_{max} < \frac{2 f_{Low}}{K_{cco\,max}} \quad (6)$$

Here, the right-hand side of equation (6) is a current value specified in view of resolution. The left side of equation (6) becomes the current value I_0 of the 1-bit current source 501_0 which takes charge of the least significant bit when carrying out scaling by x.

As shown in FIG. 20, the bit-weighting (scaling x) may usually be considered as one half. If there is no variation in the current value I of the 1-bit current source 501, the number N of bits can be determined based on equation (6).

However, since there are variations in the current value I of the 1-bit current source 501 in fact, it is necessary to determine the scaling x and the number N of bits, considering the variations.

For example, FIG. 24 corresponds to FIG. 20 and is the diagram showing the structure of the DA conversion unit 174A in the case where the scaling is set to x and there is a variation a in the current value I of the 1-bit current source 501. In this example, it is assumed that an amount of the manufacture variation of the 1-bit current source 501_N−1 for the most significant bit is σ. It is also assumed that with respect to the variations of the 1-bit current supplies 501_N−2, 501_N−3, . . . , 501_0 for the lower bits, the scaling is carried out like current value I_N−2, I_N−3, . . . , I_0 of each 1-bit current source 501 as the bit is lowered.

In this case, as shown in FIG. 24, the amount of the manufacture variations of the 1-bit current source 501_N−1 for the most significant bit is a plus error. The amount of the variations of the 1-bit current supplies 501_N−2, 501_N−3, . . . , 501_0 for the lower bits is a minus error. In the case where the frequency search by using binary search is as shown in FIG. 25, the frequency search accuracy is most worsened.

FIG. 25 shows the case where the oscillation frequency fcco (referred to as initial frequency) of the current control oscillation unit 101A in the regulation current In is higher than the judging reference frequency (i.e., target oscillation frequency). The amount of shift between the initial frequency and the judging reference frequency in the case where the frequency search accuracy is most worsened is smaller than the current value I_0 of the 1-bit current source 501_0 for the least significant bit as shown in the left side of equation (6) determined with the resolution of the program counter 302 of the frequency comparison unit 170.

In this case, by way of the first search, the 1-bit current source 501_N−1 for the most significant bit serves as the sink operation so that the oscillation frequency fcco of the current control oscillation unit 101A may fall. In response to this result, the oscillation frequency fcco of the current control oscillation unit 101A falls. Therefore, by way of the second search, the 1-bit current source 501_N−2 for the following bit serves as the source operation so as to raise the oscillation frequency fcco of the current control oscillation unit 101A.

When the amount of shift between the initial frequency and the judging reference frequency is smaller than the current value I_0 of the 1-bit current source 501_0 for the least significant bit as shown in the left side of equation (6), also in subsequent search, each of the 1-bit current supplies 501_N−3, . . . , 501_0 serves as the source operation so as to raise the oscillation frequency fcco of the current control oscillation unit 101A, and the final oscillation frequency fcco (referred to as the last frequency) of the current control oscillation unit 101A is determined.

In such a situation, in order to avoid worsening the frequency search accuracy, the remaining error when the amount of current (Imax+σ) of the sink operation by the 1-bit current source 501_N−1 for the most significant bit is offset by the total amount of current (including variation errors) for the source operation by the 1-bit current source 501_N−2, . . . , 501_0 for the remaining lower bits, is required to be smaller than the current value I_0 of the 1-bit current source 501_0 for the least significant bit as shown in the left side of equation (6), and it is necessary to satisfy equation (7-1).

The right-hand side of equation (7-1) may be calculated like equation (7-2). If this equation (7-2) is substituted for the right-hand side of equation (7-1), it can be transformed to equation (7-3). This equation (7-3) can further be transformed to equation (7-4) and equation (7-5). Finally equation (7-6) is obtained.

$$\left.\begin{aligned}
I_{max} + \sigma - x^{n-1} I_{max} &< x(I_{max} - \sigma) + \cdots + x^{n-1}(I_{max} - \sigma) \quad &(7\text{-}1)\\
x(I_{max} - \sigma) + \cdots + x^{n-1}(I_{max} - \sigma) &= (I_{max} - \sigma)\sum_{k=1}^{n-1} x^k \quad &(7\text{-}2)\\
&= (I_{max} - \sigma)\frac{x(1 - x^{n-1})}{1 - x}\\
&= (I_{max} - \sigma)\frac{x - x^n}{1 - x}\\
I_{max} + \sigma - x^{n-1} I_{max} &< (I_{max} - \sigma)\frac{x - x^n}{1 - x} \quad &(7\text{-}3)\\
\sigma\left(1 + \frac{x - x^n}{1 - x}\right) &< I_{max}\left(\frac{x - x^n}{1 - x} - 1 + x^{n-1}\right) \quad &(7\text{-}4)\\
\sigma\left(\frac{1 - x^n}{1 - x}\right) &< I_{max}\left(\frac{2x - 2x^n + x^{n-1} - 1}{1 - x}\right) \quad &(7\text{-}5)\\
\frac{\sigma}{I_{max}} &< \frac{2x - 2x^n + x^{n-1} - 1}{1 - x^n} \quad &(7\text{-}6)
\end{aligned}\right\} \quad (7)$$

Therefore, the scaling x and the number N of bits which do not worsen the frequency search accuracy can be determined from equation (6) and equation (7-6).

What can be seen from equation (7-6) is that when taking into consideration the variation σ in the current value I of the 1-bit current source 501, it is at least desirable that the scaling x is not ½ but a denominator is a little smaller.

About Gain Compensation

First Embodiment

Figure 26:
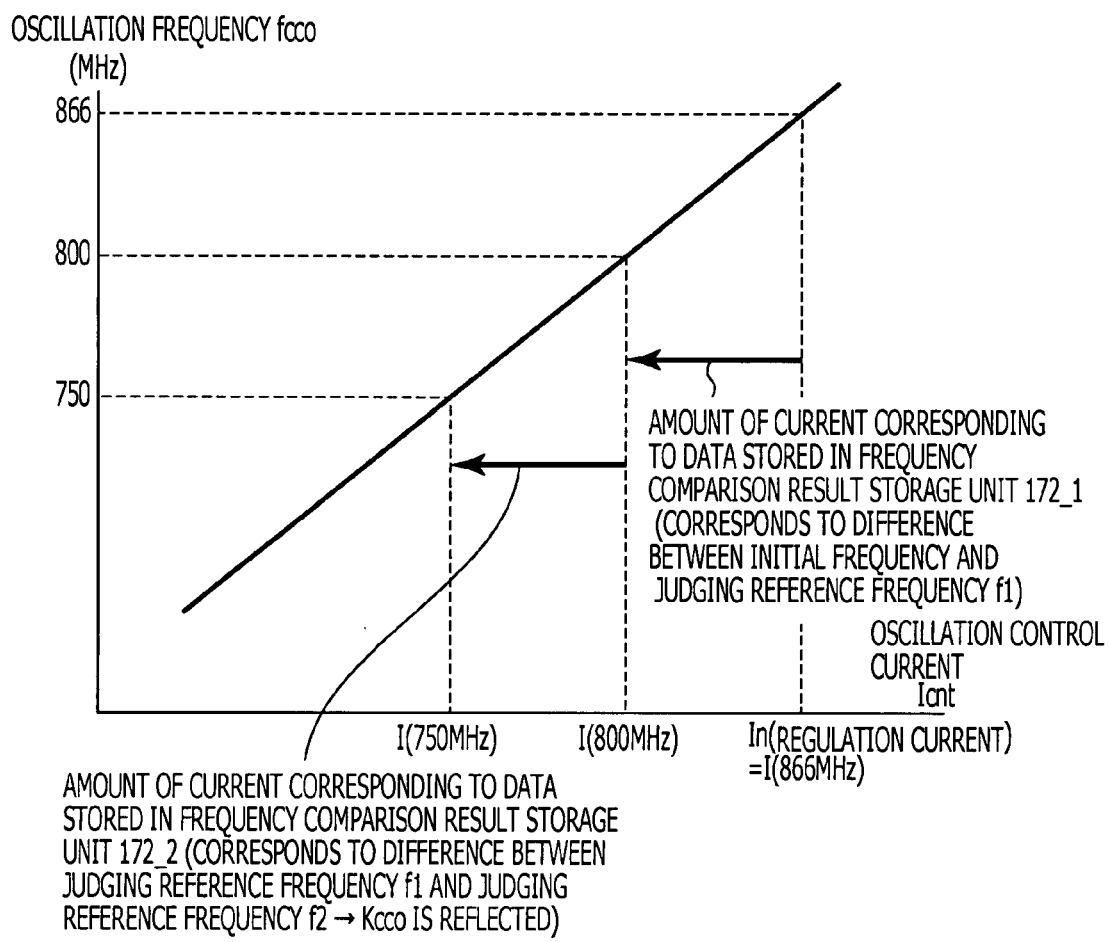
FIG. 26 is a graph for explaining transition of an oscillation frequency by way of the frequency search by using binary search and data corresponding to current values which provide judging reference frequencies in the first embodiment.
Figure 27:
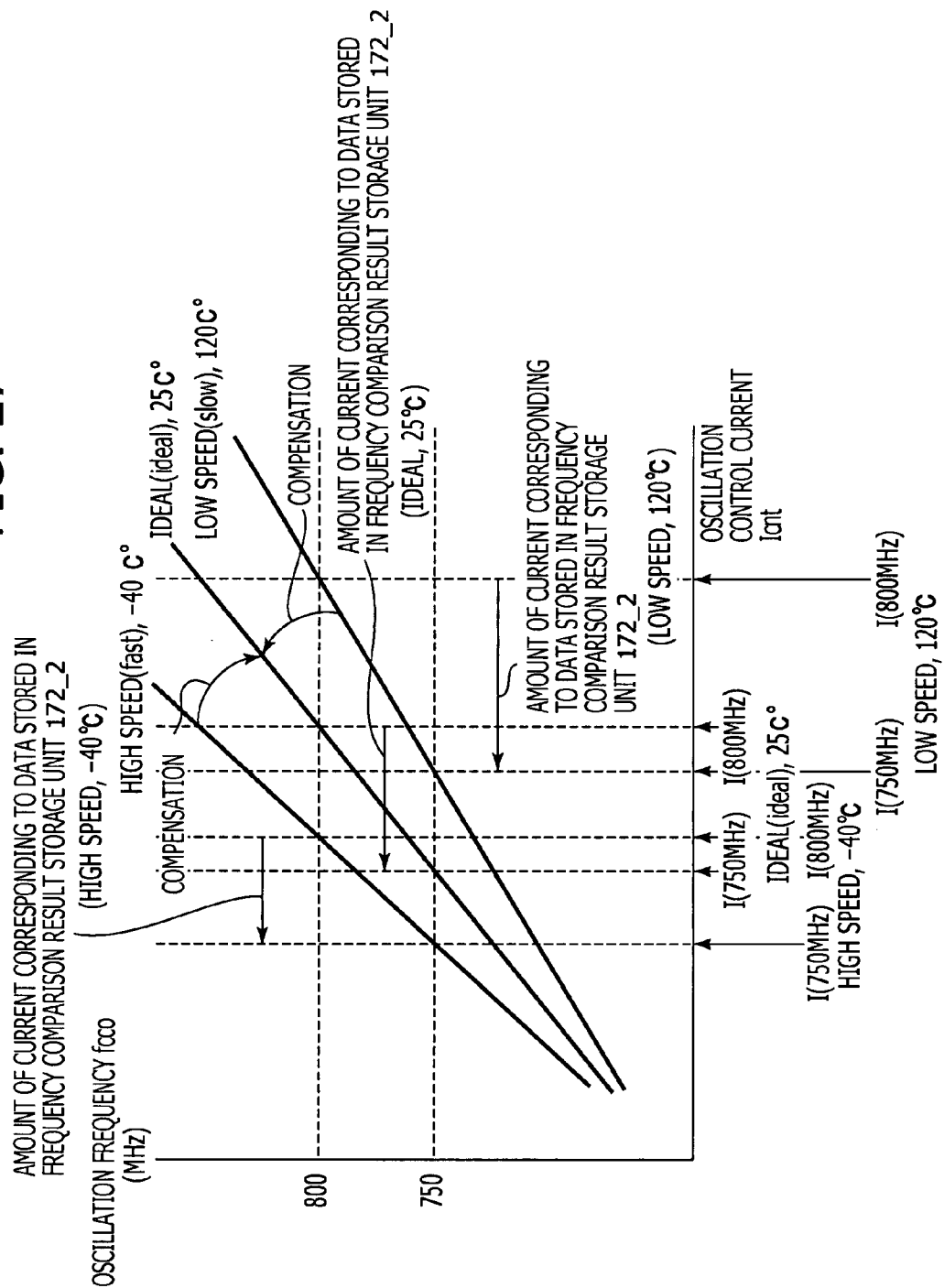
FIG. 27 is a graph for explaining an example in which a frequency conversion gain characteristic changes with the manufacture variations or the temperature changes and explaining data corresponding to a current value which provides the judging reference frequency.
Figure 28:
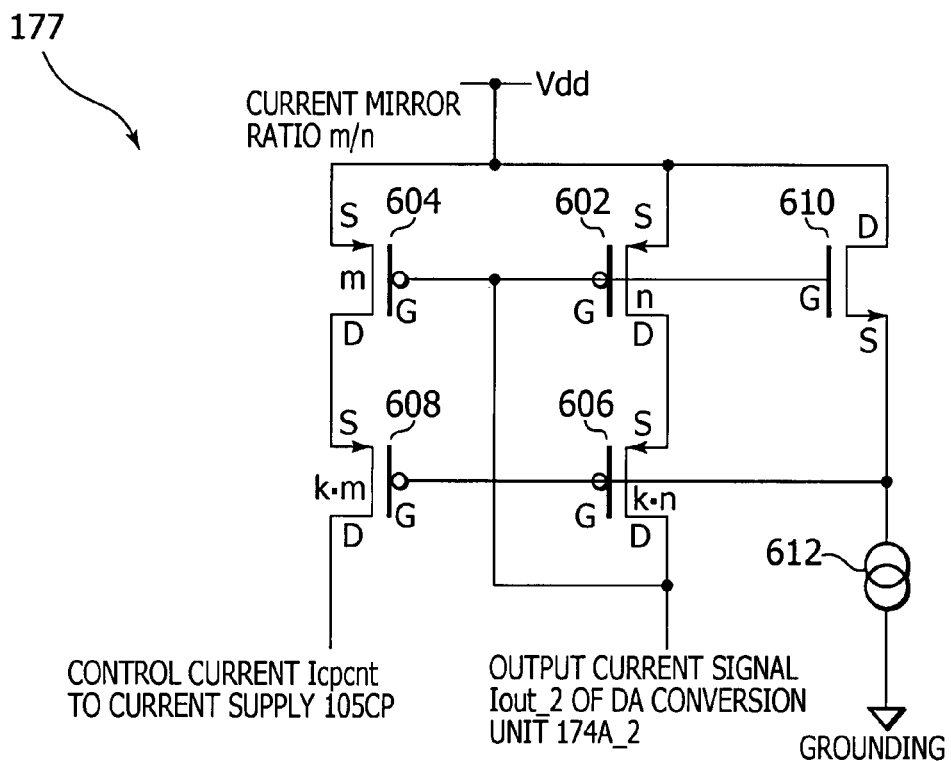
FIG. 28 is a diagram showing an example of a circuit structure of a current/current conversion unit of the first embodiment.
Figure 29:
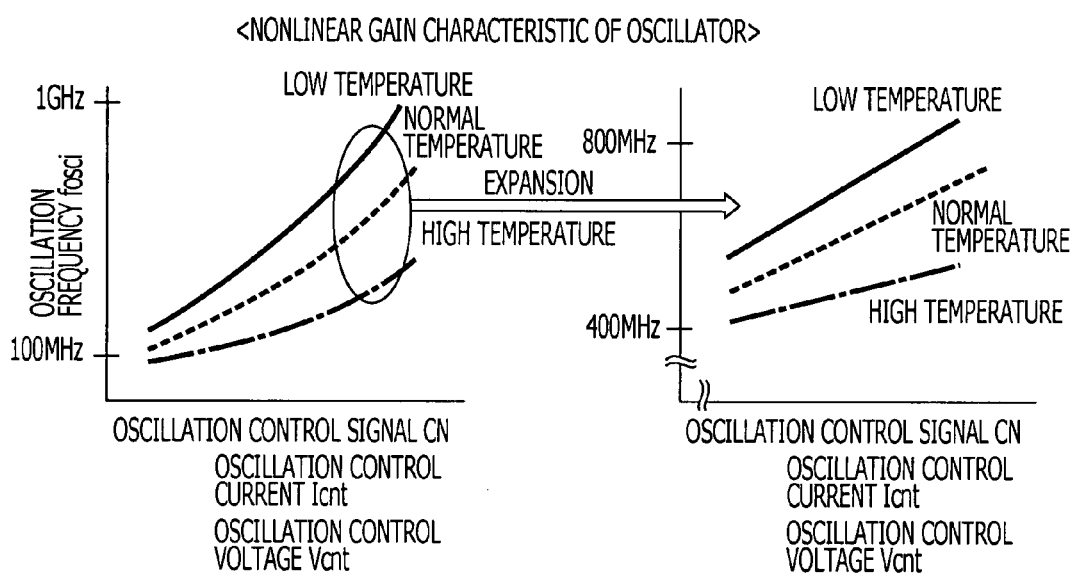
FIG. 29 is a graph for explaining linearity of gain compensation.

FIGS. 26-29 are graphs and a diagram for explaining a method of compensating for the input current-oscillation frequency conversion gain Kcco in the gain characteristic information obtaining unit 107A, where FIG. 26 is a graph for explaining transition of the oscillation frequency fcco by way of the twice frequency search by using binary searches for every target oscillation frequency and the data D(f1) and D(f2) corresponding to the current values I(f1) and I(f2) which provide the judging reference frequencies f1 and f2 stored in the corresponding frequency comparison result storage units 172_1 and 172_2; FIG. 27 is a graph for explaining an example in which the characteristic of the input current-oscillation frequency conversion gain Kcco of the current control oscillation unit 101A changes with the manufacture variation or temperature changes, and the data D(f2) corresponding to the current value I(f2) which provides the judging reference frequency f2 then stored in the frequency comparison result storage unit 172_2; FIG. 28 is a diagram showing an example of a circuit structure of the current/current conversion unit 177 of the first embodiment; and FIG. 29 is a graph for explaining linearity of gain compensation.

In the gain characteristic information obtaining unit 107A of this embodiment, the frequency search by using binary searches are carried out with two types of judging reference frequencies f1 and f2 for each target oscillation frequency, and the result is stored in the separate frequency comparison result storage units 172_1 and 172_2. In the present embodiment, the frequency search by using binary search result by means of the first judging reference frequency f1 is stored in the frequency comparison result storage unit 172_1, and the frequency search by using binary search result by means of the second judging reference frequency f2 is stored in the frequency comparison result storage unit 172_2.

At this time, the frequency division ratio switching signal Msel supplied to the switch control terminal 304_3 of the multiplexer 304 is caused to be at L level at the time of frequency search by using binary search by means of the first judging reference frequency f1. After the frequency search by using binary search with the first judging reference frequency f1, the frequency division ratio switching signal Msel is switched from L level to H level as a signal indicative of the end, whereby the judging reference frequency is switched from the judging reference frequency f1 to the judging reference frequency f2, and frequency search by using binary search with the second judging reference frequency f2 is performed.

The transition of the oscillation control current Icnt supplied to the frequency control input terminal 101Ain of the current control oscillation unit 101A at that time, the measurement result data D(f1) and D(f2) stored in the respective frequency comparison result storage units 172_1 and 172_2, and the corresponding current values I(f1) and I(f2) are as shown in FIG. 26.

The example as shown in FIG. 26 illustrates the case where the judging reference frequency f1=800 MHz and the judging reference frequency f2=750 MHz are for converging the frequency, when the current control oscillation unit 101A is oscillating at 866 MHz with the regulation current In (=initial current Iini).

In this case, with the regulation current In, it is first oscillating at the initial frequency=866 MHz. By way of the frequency search by using binary search process at the judging reference frequency f1=800 MHz, the oscillation frequency fcco is gradually converged towards the judging reference frequency f1=800 MHz. As a result, the frequency comparison result storage unit 172_1 first stores therein the data D (800 MHz) which shows the difference in current "In−I (800 MHz)" between the regulation current In and the current I (800 MHz) required for the current control oscillation unit 101A to oscillate at 800 MHz. The difference in current "In−I (800 MHz)" corresponds to a difference between the initial frequency=866 MHz and the judging reference frequency f1=800 MHz.

In the example as shown in FIG. 26, with the regulation current In, the current control oscillation unit 101A is oscillating at a frequency (866 MHz in this example) higher than the judging reference frequency f1=800 MHz. Thus, a polarity of the difference in current is negative. If the current control oscillation unit 101A is oscillating with the regulation current In at a frequency lower than the judging reference frequency f1=800 MHz, the polarity of the difference in current becomes positive. This information may be seen from the first judgment result (i.e., data of the data storage unit 480_N−1 which takes charge of MSB of the frequency comparison result storage unit 172_1) of the frequency comparison unit 170 at the judging reference frequency f1. It is negative if it is "H".

Further, after the convergence is completed on the judging reference frequency f1=800 MHz, if the frequency search by using binary search is performed at the judging reference frequency f2=750 MHz, then the frequency comparison result storage unit 172_2 stores therein the data D (750 MHz) indicating the current required to lower the oscillation frequency fcco of the current control oscillation unit 101A from 800 MHz to 750 MHz i.e., the difference in current "I (800 MHz)−I (750 MHz)" between the current I (800 MHz) required for the current control oscillation unit 101A to oscillate at 800 MHz) and the current I (750 MHz) required for the current control oscillation unit 101A to oscillate at 750 MHz. The difference in current "I (800 MHz)−I (750 MHz)" corresponds to a difference between the judging reference frequency f1=800 MHz and the judging reference frequency f2=750 MHz.

Here, if the input current-oscillation frequency conversion gain Kcco is a positive characteristic (characteristic that the frequency increases if there is much current), the polarity of the difference in current "I (800 MHz)−I (750 MHz)" is always negative. This information may be seen from the first judgment result (i.e., data of the data storage unit 480_N−1 which takes charge of MSB of the frequency comparison result storage unit 172_2) of the frequency comparison unit 170 at the judging reference frequency f2. At the time of the first judgment (at the time of the judgment immediately after switching to the judging reference frequency f2), oscillation frequency fcco=800 MHz (=judging reference frequency f1)>judging reference frequency f2, therefore it can be seen that it is always "H" and negative.

As shown in equation (8), the input current-oscillation frequency conversion gain Kcco can be found by dividing the frequency difference "800 MHz−750 MHz" by the difference in current "I (800 MHz)−I (750 MHz)" as shown with the data D (750 MHz) stored in the frequency comparison result storage unit 170_2.

$$K_{cco} = \frac{800 \text{ MHz} - 750 \text{ MHz}}{I(800 \text{ MHz}) - I(750 \text{ MHz})} \quad (8)$$

$$= \frac{\text{Judging reference frequency } f1 - \text{Judging reference frequency } f2}{\text{Current in accordance with data stored in frequency comparison result storage unit } 172\_2}$$

Since a value of a numerator in equation (8) can be arbitrarily set up by the judging reference frequencies f1 and f2, it is given before the twice frequency search by using binary searches. Therefore, this means that the result of measuring the input current-oscillation frequency conversion gain Kcco of the current control oscillation unit 101A is substantially stored in the frequency comparison result storage unit 172_2.

In the gain characteristic information obtaining unit 107A, based on the measurement result of the input current-oscillation frequency conversion gain Kcco of the current control oscillation unit 101A substantially stored in the frequency comparison result storage unit 172_2, the bias current Icpbias supplied by the current source 105CP of the charge pump 104CP is adjusted so that the shift of the input current-oscillation frequency conversion gain Kcco due to the manufacture variation of the current control oscillation unit 101A and the temperature change may be offset, to thereby adjust the charge pump current Icp (substantial charge pump gain) of the charge pump 104CP.

For example, FIG. 27 illustrates a relationship between an example in which the characteristic of the input current-oscillation frequency conversion gain Kcco resulting from the manufacture variation of the current control oscillation unit 101A and the temperature change, and the information then stored in the frequency comparison result storage unit 172_2.

If there is neither the manufacture variation nor the temperature change in the current control oscillation unit 101A, the data D(f2) stored in the frequency comparison result storage unit 172_2 indicates the input current-oscillation frequency conversion gain Kcco (ideal, 25° C.) in the ideal state (ideal) at 25° C. (room temperature). On the other hand, when there is the shift in the direction (fast, −40° C.) of raising the oscillation frequency fcco due to the manufacture variation or the temperature change, the data D(f2) stored in the frequency comparison result storage unit 172_2 indicates the input current-oscillation frequency conversion gain Kcco (fast, −40° C.) at that time. Similarly, when there is the shift in the direction (slow, 120° C.) of reducing the oscillation frequency fcco, the data D(f2) stored in the frequency comparison result storage unit 172_2 indicates the input current-oscillation frequency conversion gain Kcco (slow, 120° C.) at that time. In any case, it indicates the characteristic in the real operating situation faithfully.

Here, the zone ωn and the damping factor ζ are usually set up on the basis of the ideal state (ideal; room temperature (25° C.)). As shown in FIG. 27, therefore, it is necessary to compensate for the input current-oscillation frequency conversion gains Kcco (fast, −40° C.) and Kcco (slow, 120° C.), i.e., inclination of the straight line in FIG. 27 shifted due to the manufacture variation and the temperature change into a value of the ideal state (ideal; room temperature (25° C.)).

In the gain characteristic information obtaining unit 107A, after the twice frequency search by using binary searches using the judging reference frequencies f1 and f2 are completed, the path selection switch 175 is controlled to switch the output path of the DA conversion unit 174A_2 from the current summing unit 176A side to the charge pump 104CP side (current/current conversion unit 177 side at the preceding stage).

In the current/current conversion unit 177, constant times (K times) the output current signal Iout_2 outputted from the DA conversion unit 174A_2 is taken to determine the bias current Icpbias of the current source 105CP (i.e., the charge pump 104CP).

Here, as shown in FIG. 28, the current/current conversion unit 177 may be realized by a current mirror circuit. In the characteristic (positive characteristic) of the input current-oscillation frequency conversion gain Kcco as shown in FIG. 27, the polarity of the output current signal Iout_2 of the DA conversion unit 174A_2 is always negative, as described above, and it operates to draw current. As shown in FIG. 28, the current mirror circuit is realized using PMOS transistors.

In particular, the current/current conversion unit 177 having a current mirror circuit structure as shown in FIG. 28 is a cascode current mirror circuit for low voltages, and includes four PMOS transistors which constitute the principal part of the current mirror circuit (mirror transistors 602, 604, 606, and 608), and an NMOS transistor 610 and a current source 612 as a reference current source circuit which specifies reference current of the current mirror.

A drain of the NMOS transistor 610 is connected to the power supply Vdd and its source is connected to the reference potential (=grounding potential GND) through the current source 612. Sources of the mirror transistors 602 and 604 are connected to the power supply Vdd. A drain of the mirror transistor 602 is connected to a source of the mirror transistor 606. A drain of the mirror transistor 604 is connected to a source of the mirror transistor 608.

Gates of the mirror transistors 602 and 604 are connected to a gate of the NMOS transistor 610 in common, and connected with a drain of the mirror transistor 606. It is assumed that the current mirror ratio (current of the mirror transistor 604/current of mirror transistor 602) between the mirror transistors 602 and 604 is m/n. In addition, as for the current mirror ratio m/n, m or n in the figure may be the number of the fingers of the transistors or the number of the transistors, whereby it can be realized without mirror resistors.

Gates of the mirror transistors 606 and 608 are connected to a connection point between a source of the NMOS transistor 610 and the current source 612 in common. It is assumed that a current gain of the mirror transistors 606 and 608 with respect to the input current from the mirror transistors 602 and 604 is k times (suitable value is sufficient as k). As a result, the current mirror ratio (current of the mirror transistor 608/current of the mirror transistor 606) between the mirror transistors 606 and 608 is k·m/k·n (=m/n).

The drain of the mirror transistor 606 is connected to the current output terminal 174A_out of the DA conversion unit 174A_2, and a drain of the mirror transistor 608 is connected with the control input terminal 105CPa of the current source 105CP. The current outputted from the drain of the mirror transistor 608 is used as source-current (control current Icpcnt) to the current source 105CP for the charge pump 104CP.

In this way, by means of a source follower using the NMOS transistor 610, a gate voltage at the mirror transistors 606 and 608 changes with a value of a gate-source voltage at the mirror transistors 602 and 604, and the mirror transistors 602 and 604 are always operated in a saturated state, to thereby realize an exact current mirror ratio.

Here, by determining the current mirror ratio (=m/n) in the current/current conversion unit 177 by way of a relational expression to be set forth later, the shift, with respect to the ideal state (ideal; room temperature (25° C.)) of the input current-oscillation frequency conversion gain Kcco, due to the manufacture variation and the temperature change of the current control oscillation unit 101A is compensated for, and therefore the zone ωn and the damping factor ζ can be maintained at the value of the ideal state (ideal; room temperature (25° C.)).

In other words, in the case of the phase synchronization unit 100 of the first embodiment, zone ωn and the damping factor ζ are expressed by equation (2). However, this can be transformed as shown in equation (9).

$$\omega n = \sqrt{\frac{Icp \cdot Kcco}{Cp \cdot \alpha}} = K1 \times \sqrt{Icp \cdot Kcco} \quad (9\text{-}1)$$

$$\zeta = \frac{Cp \cdot Rp}{2} \omega n = K2 \times K1 \times \sqrt{Icp \cdot Kcco} \quad (9\text{-}2)$$

$$\text{where } K1 = \sqrt{\frac{1}{Cp \cdot \alpha}} \quad K2 = \frac{Cp \cdot Rp}{2}$$

(9)

In real operating situation (real, T) at an environmental temperature of T° C., in order that Icp (real, T)·Kcco in the real operating situation at temperature T (real, T) is kept constant at the value of the ideal state (ideal; room temperature (25° C.)), it is required to be Icp (ideal, 20° C.) Kcco (ideal, 20° C.) which is an example of the product of the standard input current-oscillation frequency conversion gain Kcco and the standard charge pump current Icp (an example of the drive signal). For that purpose, it is necessary to satisfy equation (10).

$$I_{cp}(\text{real}, T) \cdot K_{cco}(\text{real}, T) = \frac{I_{cp}(\text{ideal}, 25 \text{ deg}) \cdot}{K_{cco}(\text{ideal}, 25 \text{ deg})} \quad (10\text{-}1)$$

$$I_{cp}(\text{real}, T) = \frac{I_{cp}(\text{ideal}, 25deg) \cdot K_{cco}(\text{ideal}, 25 \text{ deg})}{K_{cco}(\text{real}, T)} \quad (10\text{-}2)$$

(10)

where Icp (real, T) and Kcco (real, T) are the values of the charge pump current Icp and the input current-oscillation frequency conversion gain Kcco of the current control oscillation unit 101A at the time of the temperature of T° C. of the actually manufactured circuit. Similarly Icp (ideal, 25 deg) and Kcco (ideal, 25 deg) are the values at room temperature (25° C.) at the time of the design.

Kcco (real, T) of a denominator of equation (10-2) is the input current-oscillation frequency conversion gain Kcco of the manufactured current control oscillation unit 101A, and therefore is the value itself of Kcco measured by the gain characteristic information obtaining unit 107A, and is the same as that shown in equation (8).

Then, if we substitute equation (8) into equation (10-2), equation (10-2) can be transformed to equation (11-1). Further, it is possible to express Icp(ideal, 25 deg)=βIcpbias (ideal, 25 deg) and Icp(real, T)=βIcpbias (real, T) (where β is magnification of the charge pump current Icp with respect to the bias current Icpbias). If we substitute this into equation (11-1), equation (11-1) can be transformed to equation (11-2).

$$I_{cp}(\text{real}, T) = \frac{I_{cp}(\text{ideal}, 25 \text{ deg}) \cdot K_{cco}(\text{ideal}, 25 \text{ deg})}{\text{Judging reference frequency } f1 -} \times \\ \text{Judging reference frequency } f2 \\ I\begin{pmatrix} \text{Frequency comparison} \\ \text{result storage} \\ \text{unit } 172\_2 \end{pmatrix} \quad (11\text{-}1)$$

$$I_{cpbias}(\text{real}, T) = \frac{I_{cpbias}(\text{ideal}, 25 \text{ deg}) \cdot K_{cco}(\text{ideal}, 25 \text{ deg})}{\text{Judging reference frequency } f1 -} \times \\ \text{Judging reference frequency } f2 \\ I\begin{pmatrix} \text{Frequency comparison} \\ \text{result storage} \\ \text{unit } 172\_2 \end{pmatrix} \quad (11\text{-}2)$$

The output current signal Iout_2 is an output current signal outputted from the DA conversion unit 174A_2 based on the data D(f2) stored in the frequency comparison result storage unit 172_2. Further, the judging reference frequency f1 is the judging reference frequency (of two types of judging reference frequencies) used in the first frequency search by using binary search. The judging reference frequency f2 is the judging reference frequency used in the frequency search by using binary search after switching the frequency. There is a relationship, the judging reference frequency f1>the judging reference frequency f2.

Here, since Icpbias (ideal, 25 deg) and Kcco (ideal, 25 deg) are the values at room temperature (25° C.) at the time of the design, they are given. Since the judging reference frequency f1—the judging reference frequency f2 are also set up before operating the gain characteristic information obtaining unit 107A, they are given.

From these given values, the current mirror ratio (m/n) indicating the current/current conversion gain of the current/current conversion unit 177 having the current mirror circuit structure as shown in FIG. 28 is determined like equation (12) in the gain characteristic information obtaining unit 107A. This current mirror ratio (m/n) is referred to as a Kcco compensation current mirror ratio.

$$\begin{matrix} K_{cco} \\ \text{Compensation} \\ \text{current} \\ \text{mirror} \\ \text{ratio } (m/n) \end{matrix} = \frac{I_{cpbias}(\text{ideal}, 25 \text{ deg}) \cdot K_{cco}(\text{ideal}, 25 \text{ deg})}{\text{Judging reference frequency } f1 -} \\ \text{Judging reference frequency } f2 \quad (12)$$

For example, assuming that Icpbias (ideal, 25 deg)=10 μA, Kcco (ideal, 25 deg)=0.3 MHz/μA, judging reference frequency f1=800 MHz, and judging reference frequency f2=750 MHz, the current mirror ratio (m/n) is 3/50.

If we substitute equation (12) into equation (11-2), equation (11-2) can be transformed to equation (13).

$$I_{cpbias}(\text{real},T)=K_{cco}^{Compensation\ current\ mirror\ ratio} \\ (m/n) \times I(^{Frequency\ comparison\ result\ storage\ unit} \\ 172\_2) \quad (13)$$

As can be seen from equation (13), the gain characteristic information obtaining unit 107A which compensates for the input current-oscillation frequency conversion gain Kcco of the current control oscillation unit 101A passes the information on the measured Kcco (real, T), to the current/current conversion unit 177 (drain of the mirror transistor 602 thereof) having the current mirror circuit structure, as the output current signal Iout_2 outputted from the DA conversion unit 174A_2. Based on the information, the control current Icpcnt is generated in the current/current conversion unit 177 so that the zone con may become constant, whereby the bias current Icpbias for the charge pump 104CP is controlled.

As a result, even when the manufacture variation and the temperature change arise in the input current-oscillation frequency conversion gain Kcco, the charge pump current Icp can be adjusted so that Icp-Kosci may become constant, in order to offset the change. Further, it is possible to prevent the zone ωn and the damping factor from being influenced by the manufacture variation or the temperature characteristics of the input current-oscillation frequency conversion gain Kcco.

Further, unlike the arrangement disclosed in non-patent document 1, it is not necessary to devise a structure of the delay stage (or delay cell). Furthermore, unlike the arrangement disclosed in non-patent document 2, the circuit which produces the current independent of the temperature or the manufacture variation is not required either. The circuitry design of the current control oscillation unit 101A is not complicated, and a usual circuit structure can be employed as the current control oscillation unit 101A.

Still further, unlike the arrangement disclosed in non-patent document 3, a highly precise bias circuit which does not depend on the temperature change for causing the charge pump current to be constant and the gain control amplifier which adjusts the gain with respect to the oscillation control signal CN before the input of the voltage controlled oscillator are not required.

Further, it is possible to cope with the shifts by setting up the current mirror ratio. As the management of an absolute value is unnecessary unlike the arrangement disclosed in non-patent document 3, it is easy to design the compensation circuit (the gain characteristic information obtaining unit 107A and the current source 105CP of this example) and the manufacture variation of compensation is very small. With the device characteristic or circuit structure, it is substantially impossible to avoid the variation by way of the management of the absolute value. This is because management of the ratio (current mirror ratio of the current/current conversion unit 177 or the current source 105CP in this example) is simple to avoid the variation.

In this embodiment, when performing variation compensation for the input current-oscillation frequency conversion gain Kcco of the current control oscillation unit 101A, the Kcco compensation current mirror ratio is set up by the current/current conversion unit 177 so that equation (12) may be satisfied. However, this value is determined by Icpbias (ideal, 25 deg), Kcco (ideal, 25 deg), and the judging reference frequencies f1 and f2. According to Icpbias (ideal, 25 deg) and Kcco (ideal, 25 deg) which are physically determined from the element characteristic, a structure in which the current/current conversion unit 177 is removed can also be employed, if the difference between the judging reference frequencies f1 and f2 is adjusted so that the current mirror ratio (m/n) may be "1/power of 2".

In particular, in the usual phase synchronizing operation after completion of the measurement by means of the gain characteristic information obtaining unit 107A, i.e., when the path selection switch 175 is returned to the current summing unit 176A side after completion of the measurement, the input of the control signal Control [N−#] from the data storage unit 460 and the up-and-down signal UpDown [N−#] from the data storage unit 480 into the current output type DA conversion unit 174A_2 is bit shifted towards the lower bit side. Thus, it is substantially possible to cope with the management that the current mirror ratio (m/n) is "1/power of 2".

In order to bit shift the input of Control [N−#] and UpDown [N−#] into the DA conversion unit 174A_2, the path selection switch therefore may only be provided. In such a structure, K times the output current signal Iout_2 is taken by means of the DA conversion unit 174A_2 and the path selection switch for carrying out the bit shift, to thereby constitute the signal conversion unit for acquiring the control current Icpcnt.

For example, when Icpbias (ideal, 25 deg)=10 μA, Kcco (ideal, 25 deg)=0.3 MHz/μA, and the judging reference frequency f1=800 MHz, let the judging reference frequency f2=752 MHz, then the current mirror ratio (m/n) is 3/48=1/16. Therefore, the path selection switch may be switched so that the input of Control [N−#] and UpDown [N−#] into the DA conversion unit 174A_2 may be carried out to be inputted in the lower side by 4 bits. Here, the reason for adjusting the setup of the judging reference frequency f2 instead of the judging reference frequency f1 side is that the judging reference frequency f1 is set as the target frequency in the usual phase synchronizing operation.

Of course, if the structure provided with the current/current conversion unit 177 is employed, there is an advantage that flexibility of the setup of the judging reference frequency f2 increases.

In the arrangement of the present embodiment, the input signal-oscillation frequency conversion gain Kosci (the input current-oscillation frequency conversion gain Kcco in the first embodiment, and the input voltage-oscillation frequency conversion gain Kvco in the third embodiment) is measured by using two types of judging reference frequencies f1 and f2. Therefore, it is possible to reduce the difference between the judging reference frequencies f1 and f2 used when measuring the gain Kosci (i.e., the current difference and voltage difference which give the frequency difference).

As a result, as shown in FIG. 29, even if the oscillation unit 101 (the current control oscillation unit 101A in the first embodiment, the voltage control oscillation unit 101B in the third embodiment) has the nonlinear gain characteristic, when the difference in the oscillation control current Icnt between the judging reference frequencies f1 and f2 inputted in the case of performing the gain measurement is reduced, the gain characteristic can substantially be considered as linear within the range, and the nonlinear gain characteristic can be compensated without inconvenience.

For this reason, the usual circuit structure can be employed as the current control oscillation unit 101A. Further, as with the arrangements disclosed in non-patent documents 1 and 2, when the input current-oscillation frequency conversion gain Kcco is nonlinear, it may not be unable to compensate completely.

As described above, according to the phase synchronization unit 100 of the first embodiment, the oscillation frequency fcco of the current control oscillating circuit (the current control oscillation unit 101A in the above example) in PLL (phase synchronization circuit) is matched with the digital data sequence Din before operating it as a phase synchronization circuit, and the acquisition time of the phase synchronization circuit is shortened, as well as the nonlinear characteristic of the input current-oscillation frequency conversion gain Kcco can be compensated for. After completion of the compensation, DC operation (static operation using the value after compensation) is carried out, it is not a noise source to the phase synchronization circuit. Thus, it is possible to prevent jitter due to the addition of the gain characteristic information obtaining unit 107A from increasing and realize low power consumption. In addition, as can be seen from comparison with FIG. 4, the frequency synthesizer unit 180 is not required for clock reproduction based on the digital data sequence Din.

Phase Synchronization Unit

Second Embodiment

Figure 30:
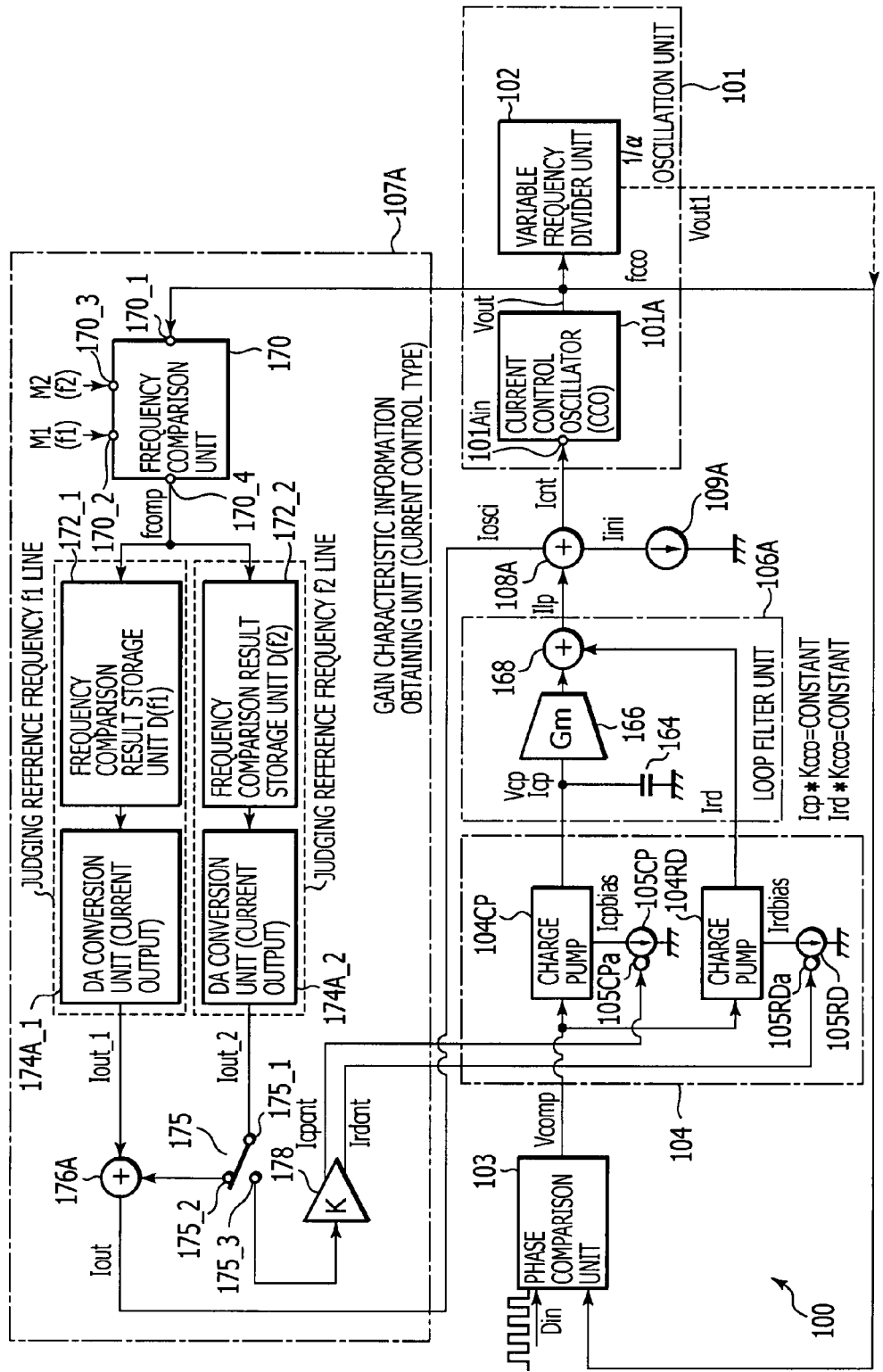
FIG. 30 is a functional block diagram showing the second embodiment of the phase synchronization unit.

FIG. 30 is a functional block diagram showing the second embodiment of the phase synchronization unit (phase synchronization circuit) 100. The phase synchronization unit 100 of the second embodiment has a feature that two charge pumps 104CPs and 104RD are used for the charge pump unit 104 like FIG. 4 shown as a comparative example in the first embodiment. As a whole, this is the same as that of the first embodiment since both the oscillation unit 101 and the control system (the loop filter unit 106A and the gain characteristic information obtaining unit 107A) operate in the current mode. Hereafter, differences from the first embodiment will be mainly described.

In the phase synchronization unit 100 of the second embodiment, firstly, the gain characteristic information obtaining unit 107A includes a current/current conversion unit 178 for outputting the control current Icpcnt and control current Irdcnt, instead of the current/current conversion unit 177 for outputting the control current Icpcnt.

Further, in the phase synchronization unit 100 of the second embodiment, in addition to the charge pump 104CP and the current source 105CP, the charge pump unit 104 includes a charge pump 104RD for outputting and inputting the drive current (referred to as charge pump current Ird) according to the comparison result signal Vcomp outputted from the phase comparison unit 103, and a current-value variable-type current source 105RD for supplying bias current Irdbias to the charge pump 104RD.

From the current/current conversion unit 177 on the gain characteristic information obtaining unit 107A side, current of K times the output current signal Iout_2 of the second DA conversion unit 174A_2 is supplied as the control current Icpcnt into the control input terminal 105CPa of the current-value variable-type current source 105CP. Similarly, current of K times the output current signal Iout_2 is supplied as the control current Irdcnt into a control input terminal 105RDa of the current-value variable-type current source 105RD.

As with the current source 105CP, the current-value variable-type current source 105RD is arranged to receive the control current Irdcnt supplied to the control input terminal 105RDa in the current mirror form (1:1 is sufficient as the current mirror ratio) and to supply the bias current Irdbias to the charge pump 104RD. When the current mirror ratio is 1:1, control current Irdcnt=bias current Irdbias. The charge pump 104RD outputs β times the charge pump current Ird to bias current Irdbias.

Further, the resistance element 162 is removed from the loop filter unit 106A of the second embodiment, and a current summing unit 168 following the voltage/current conversion unit 166 is provided for it. The current summing unit 168 sums up the loop filter output current Ilp outputted from the voltage/current conversion unit 166 and the charge pump current Ird outputted from the charge pump 104RD, thus being supplied to the current summing unit 108A.

Loop Characteristic of Phase Synchronization Unit

Second Embodiment

Incidentally, in the structure of the first embodiment, if the zone $\omega n$ is set up according to equation (2-1) so that each of a plurality of types of the optical discs PD may be matched with, as can be seen from equation (2-2), the damping factor $\zeta$ changes in proportion to the zone $\omega n$.

On the other hand, it is desirable that the damping factor $\zeta$ is constant for the operational stability of the phase synchronization circuit. As a whole, the zone $\omega n$ must be set up in a situation where the damping factor $\zeta$ is constant.

An example of the circuit structure for realizing this is the structure of the loop filter unit 106A employed in the second embodiment. In this case, the zone $\omega n$ and the damping factor $\zeta$ can be expressed by equation (14-1) and equation (14-2). In addition, it can be seen from comparison with equation (1) that there are relationships as shown in equation (14-3) and equation (14-4).

$$\begin{aligned}\omega n &= \sqrt{\frac{Icp \cdot Gm \cdot Kcco}{Cp \cdot \alpha}} \quad (14\text{-}1) \\ \zeta &= \frac{Cp \cdot \frac{Ird}{Icp \cdot Gm}}{2} \omega n \quad (14\text{-}2) \\ Klp &= Gm \quad (14\text{-}3) \\ Flp &= \frac{Ird}{Icp \cdot Gm} \quad (14\text{-}4) \\ Rp &= \frac{Ird}{Icp \cdot Gm} \quad (14\text{-}5)\end{aligned} \quad (14)$$

As shown in equation (14), in the structure of the second embodiment, when the charge pump current Icp (or the frequency division ratio $\alpha$) is adjusted according to equation (14-1) and the zone $\omega n$ is set up so that each of the plurality of types of the optical discs PD may be matched with, the value of Ird/Icp·Gm is adjusted, thus being possible to change the zone $\omega n$, leaving the damping factor $\zeta$ constant.

Further, in this case, by transforming equation (14-1) and equation (14-2), equation (9) in the first embodiment is matched, as shown in equation (15).

$$\begin{aligned}\omega n &= \sqrt{\frac{Icp \cdot Gm \cdot Kcco}{Cp \cdot \alpha}} = K3 \times \sqrt{Icp \cdot Kcco} \quad (15\text{-}1) \\ \zeta &= \frac{Cp \cdot \frac{Ird}{Icp \cdot Gm}}{2} \omega n = K4 \times \frac{Ird}{Icp} \times K3 \times \sqrt{Icp \cdot Kcco} \quad (15\text{-}1) \\ \text{where } K3 &= \sqrt{\frac{Gm}{Cp \cdot \alpha}} \quad K4 = \frac{Cp}{2 \cdot Gm}\end{aligned} \quad (15)$$

About Gain Compensation

Second Embodiment

Therefore, in the second embodiment, even if the input current-oscillation frequency conversion gain Kcco changes from equation (15-1), when the value of Icp·Kcco can always be kept constant by adjusting the charge pump current Icp, the zone $\omega n$ can be provided with a constant value to be matched with each of the plurality of types of the optical discs PD. This point is the same as that in the first embodiment.

Therefore, in the second embodiment, in the case where the variation in the input current-oscillation frequency conversion gain Kcco is compensated for, it is possible to employ the concepts according to equation (10)-equation (13) as with the first embodiment.

In other words, as can be seen from equation (13), also in the second embodiment, the gain characteristic information obtaining unit 107A passes the information on the measured Kcco (real, T) to the current/current conversion unit 177 (drain of the mirror transistor 602 thereof) of the current mirror circuit structure as the output current signal Iout_2 outputted from the DA conversion unit 174A_2. Based on the information, by generating the control current Icpcnt in the current/current conversion unit 178, the bias current Icpbias for the charge pump 104CP may only be controlled to keep the zone ωn constant.

In addition, even if the charge pump current Icp changes with these adjustments, the damping factor ζ can be kept constant when the charge pump current Ird is adjusted so that Ird/Icp may be constant.

Here, in the phase synchronization unit 100 of the second embodiment, when β times the charge pump current Icp is taken, in order to cause Ird/Icp to be constant, it is desirable that the current/current conversion unit 178 adjusts the bias current Icpbias and Irdbias of the charge pumps 104CP and 104RD so that β times the charge pump current Ird may also be taken. This is realized by the current/current conversion unit 178.

Figure 31:
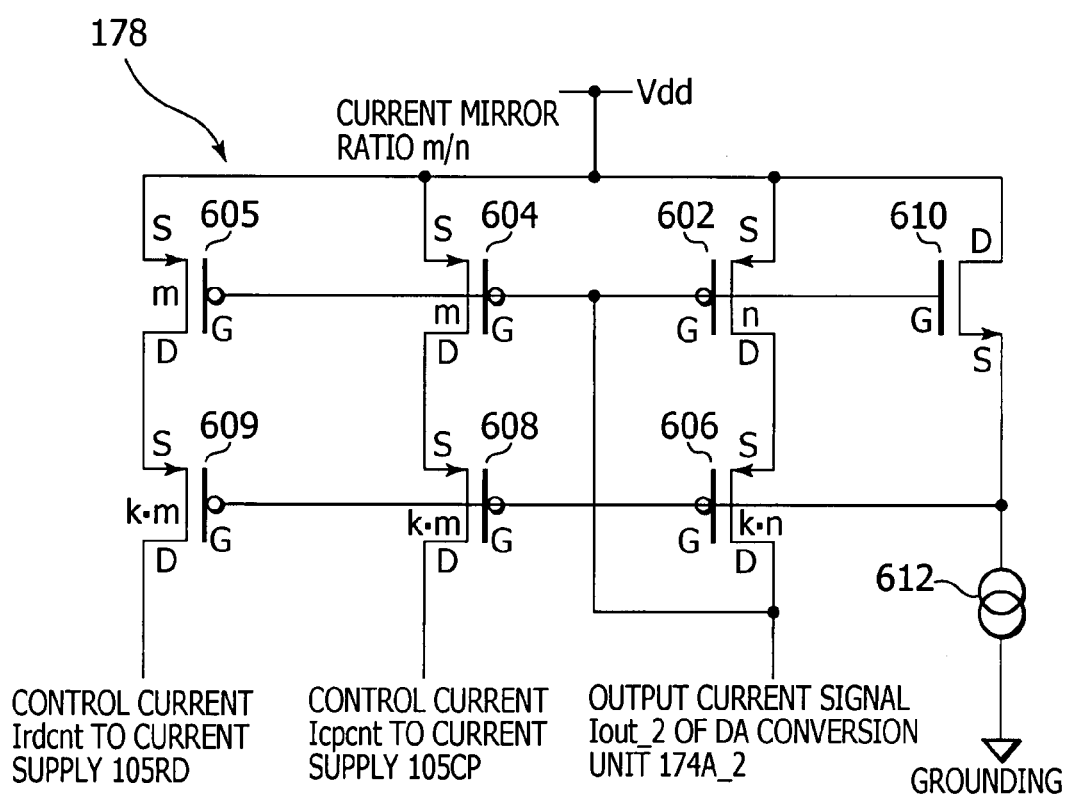
FIG. 31 is a diagram showing an example of a circuit structure of the current/current conversion unit provided for the gain characteristic information obtaining unit of the second embodiment.

FIG. 31 is a diagram showing an example of a circuit structure of the current/current conversion unit 178 provided for the gain characteristic information obtaining unit 107A of the second embodiment. In the current/current conversion unit 177 of the first embodiment as shown in FIG. 28, the output current signal Iout_2 of the second DA conversion unit 174A_2 is amplified to K times to be outputted as the control current Icpcnt. However, in the current/current conversion unit 178 of the second embodiment, the output current signal Iout_2 of the second DA conversion unit 174A_2 is amplified to K times to be outputted as the control current Icpcnt and control current Irdcnt.

Therefore, in the current/current conversion unit 178, a mirror transistor 605 is arranged in parallel with the mirror transistor 604, and a mirror transistor 609 is arranged in parallel with the mirror transistor 608. A drain of the mirror transistor 605 is connected to a source of the mirror transistor 609.

A gate of the mirror transistor 605 is connected to the gate of the NMOS transistor 610 in common with the gates of the mirror transistors 602 and 604 and is connected to the drain of the mirror transistor 606. The current mirror ratio (current of mirror transistor 605/current of the mirror transistor 602) between the mirror transistors 602 and 605 is m/n similar to the current mirror ratio between the mirror transistors 602 and 604.

A gate of the mirror transistor 609 is connected to the connection point between the source of the NMOS transistor 610 and the current source 612, in common with the gate of the mirror transistors 606 and 608. It is assumed that a current gain of the mirror transistor 609 with respect to the input current from the mirror transistor 605 is k times. As a result, the current mirror ratio (current of the mirror transistor 609/current of the mirror transistor 606) between the mirror transistors 606 and 609 is k·m/k·n (=m/n) similar to the current mirror ratio between the mirror transistors 606 and 608.

A drain of the mirror transistor 609 is connected with the control input terminal 105RDa of the current source 105RD. The current outputted from drain of the mirror transistor 609 is used as source-current (control current Irdcnt) to the current source 105RD for the charge pump 104RD.

The current mirror ratio on the control current Irdcnt side is the same as the current mirror ratio on the control current Icpcnt side. Therefore, β times the control current Icpcnt and β times the charge pump current Icp reflecting the former result in β times the control current Irdcnt and β times the charge pump current Ird reflecting the former.

Phase Synchronization Unit

Third Embodiment

Figure 32:
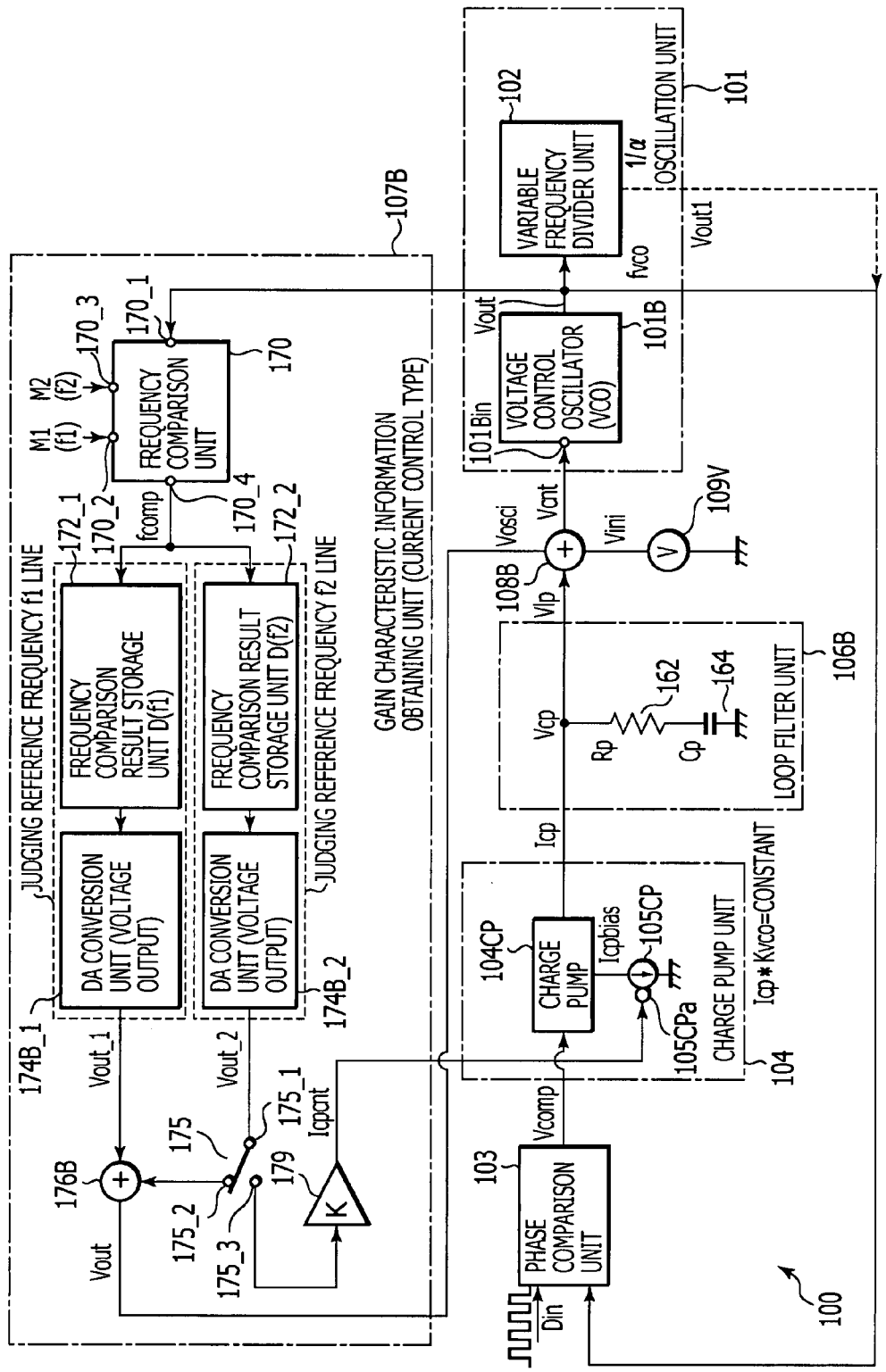
FIG. 32 is a functional block diagram showing the third embodiment of the phase synchronization unit.

FIG. 32 is a functional block diagram showing the third embodiment of the phase synchronization unit (phase synchronization circuit) 100. As with the first embodiment, the phase synchronization unit 100 of the third embodiment is the same as the first embodiment in that one charge pump 104CP is used for the charge pump unit 104. As a whole, however, it is different from the first and second embodiments in that both the oscillation unit 101 and the control system (loop filter unit and gain characteristic information obtaining unit) operate in the voltage mode. Hereafter, the differences from the first embodiment will be mainly described.

The phase synchronization unit 100 of the third embodiment has a first feature that a voltage control oscillating circuit (VCO) is employed as the oscillation unit. And it has a second feature that the voltage output type one (gain characteristic information obtaining unit 107B) as the gain characteristic information obtaining unit 107 that compensates for the manufacture variation and the temperature characteristics of the frequency conversion gain characteristic of the current control oscillating circuit which compensates for the manufacture variation and the temperature characteristics of the frequency conversion gain characteristic of the voltage control oscillating circuit.

In particular, the phase synchronization unit 100 of the third embodiment includes a voltage control oscillation unit (VCO) 101B, instead of the current control oscillation unit 101A. In addition, in the phase synchronization unit 100 of the third embodiment, the gain characteristic information obtaining unit 107A is further replaced with the gain characteristic information obtaining unit 107B.

The gain characteristic information obtaining unit 107B uses voltage output type DA conversion units 174B_1 and 174B_2 instead of the current output type DA conversion units 174A_1 and 174A_2. Further, corresponding to this, the current summing unit 176A is replaced with a voltage summing unit 176B. Furthermore, the current/current conversion unit 177 is replaced with a voltage/current conversion unit 179 in which an output voltage signal Vout_2 of the second DA conversion unit 174B_2 is converted into the output current signal Iout_2, and further, the output current signal Iout_2 is amplified to K times (K is the current mirror ratio), to be outputted as the control current Icpcnt. The voltage summing unit 176B outputs the result of summing an output voltage signal Vout_1 and the output voltage signal Iout_2 as a frequency control voltage Vosci.

The voltage control oscillation unit 101B outputs the output oscillation signal Vout of the oscillation frequency fvco corresponding to the oscillation control voltage Vcnt through the output terminal 101Bout, according to the oscillation control voltage Vcnt supplied to a frequency control input terminal 101Bin and the input voltage-oscillation frequency conversion gain Kvco of its own.

When required, the frequency division unit 102 which divides the oscillation frequency fvco of the output oscillation signal Vout outputted from the output terminal 101Aout of the voltage control oscillation unit 101B into 1/α and acquires the frequency-divided oscillation signal Vout1 may be provided at the latter stage of the voltage control oscillation unit 101B. This point is the same as that of the first embodiment.

Further, in the phase synchronization unit 100 of the third embodiment, the loop filter unit 106A is replaced with a loop filter unit 106B, the current summing unit 108A is replaced with a voltage summing unit 108B, and the regulation current source 109A is further replaced with a regulation voltage source 109B.

The voltage summing unit 108B is an example of the oscillation control signal generation unit which sums up the voltage signal from each part to generate the oscillation control voltage Vcnt so that the phase of the output oscillation signal Vout may synchronize with the phase of the digital data sequence Din.

The loop filter unit 106B has a structure corresponding to the voltage output so as to match the voltage control oscillation unit 101B. In particular, the loop filter unit 106B has a series circuit of a resistance element 162 and a capacitor 164 between the reference potential and Vcp. When the phase synchronization unit 100 is constituted by an IC (semiconductor integrated circuit), the resistance element 162 and the capacitor 164 are connected outside the IC.

In the loop filter unit 106B, based on the charge pump current Icp outputted from the charge pump 104CP, a voltage signal (referred to as charge pump voltage Vcp) is generated at one side (i.e., input of the voltage summing unit 108B) of the series circuit constituted by the resistance element 162 and the capacitor 164. The loop filter unit 106B passes this charge pump voltage Vcp transparently to the voltage summing unit 108B as a loop filter output voltage Vlp.

Further, the voltage summing unit 108B sums up the voltage signal from each part, and supplies it to the frequency control input terminal 101Bin of the voltage control oscillation unit 101B. The regulation voltage source 109B supplies the initial voltage Vini matched to the oscillation frequency fvco of the desired output oscillation signal Vout to the voltage summing unit 108B.

Here, by "the initial voltage Vini matched to the oscillation frequency fvco of the desired output oscillation signal Vout" is meant that, under the standard or ideal condition, a voltage value by which the oscillation frequency fvco having the desired frequency may be obtained only with the initial voltage Vini in the case where other voltage inputs (the charge pump voltage Vcp which is the loop filter output voltage, and the frequency control voltage Vosci from the gain characteristic information obtaining unit 107B) are not applied to the voltage summing unit 108B When the desired frequency (=oscillation frequency fvco) becomes a plurality of types, the initial voltage Vini which is optimized for each of the desired frequencies (=oscillation frequency fvco) is set up. For this reason, each time the data rate (frequency) of the digital data sequence Din is switched, the initial voltage Vini of the regulation voltage source 109B is switched.

As an arrangement for this, although not illustrated, provided is the regulation voltage source 109B for each frequency in which the individual initial voltage Vini matched with each frequency is set for the each frequency. It is preferable to have a structure in which the regulation voltage source 109B for each frequency is switched to one that matched with the frequency, each time the data rate (frequency) of the digital data sequence Din is switched.

In this way, the frequency control voltage Vosci based on the gain compensation processing by means of the gain characteristic information obtaining unit 107B may only be a voltage with which a shift between the oscillation frequency fvco in the real operating situation under the initial voltage Vini (and the charge pump voltage Vcp) and the desired frequency can be compensated. As a result, one initial voltage Vini is matched to a certain desired frequency, and an amount of compensation voltage (=the frequency control voltage Vosci) with which the gain characteristic information obtaining unit 107B should cope can be reduced compared with the case where the correspondence to the plurality of types of desired frequencies is attended with the frequency control voltage Vosci from the gain characteristic information obtaining unit 107B.

Loop Characteristic of Phase Synchronization Unit

Third Embodiment

The loop characteristic (the zone $\omega n$ and the damping factor $\zeta$) in the phase synchronization unit 100 of the third embodiment can be expressed by equation (16-1) and equation (16-2). In addition, it can be seen from comparison with equation (1) that there is a relationship as shown in equation (16-3) and equation (16-4). Further, when equation (2-2) is compared with equation (16-2), it can be seen that there is a relationship as shown in equation (16-5). It is understood that these equations are the same as equation (2) in the first preferred embodiment.

$$\left.\begin{aligned}
\omega n &= \sqrt{\frac{Icp \cdot Kcco}{Cp \cdot \alpha}} \quad (16\text{-}1) \\
\zeta &= \frac{Cp \cdot R}{2} \omega n \quad (16\text{-}2) \\
Klp &= 1 \quad (16\text{-}3) \\
Flp &= R \quad (16\text{-}4) \\
\omega n \cdot \zeta &\propto \sqrt{Icp \cdot Kcco} \quad (16\text{-}5)
\end{aligned}\right\} \quad (16)$$

As can be seen from equation (16), in the structure of the third embodiment, the input current-oscillation frequency conversion gain Kcco is only replaced with the input voltage-oscillation frequency conversion gain Kvco, and the loop characteristic can be considered similarly to the first embodiment.

Therefore, by transforming equation (16-1) and equation (16-2), they are matched as shown in equation (17). This equation is the same as equation (9) of the first preferred embodiment.

$$\left.\begin{aligned}
\omega n &= \sqrt{\frac{Icp \cdot Kcco}{Cp \cdot \alpha}} = K1 \times \sqrt{Icp \cdot Kcco} \quad (17\text{-}1) \\
\zeta &= \frac{Cp \cdot Rp}{2} \omega n = K2 \times K1 \times \sqrt{Icp \cdot Kcco} \quad (17\text{-}2) \\
\text{where } K1 &= \sqrt{\frac{1}{Cp \cdot \alpha}} \quad K2 = \frac{Cp \cdot Rp}{2}
\end{aligned}\right\} \quad (17)$$

Example of Structure of DA Conversion Unit and Operation

Third Embodiment

Figure 33:
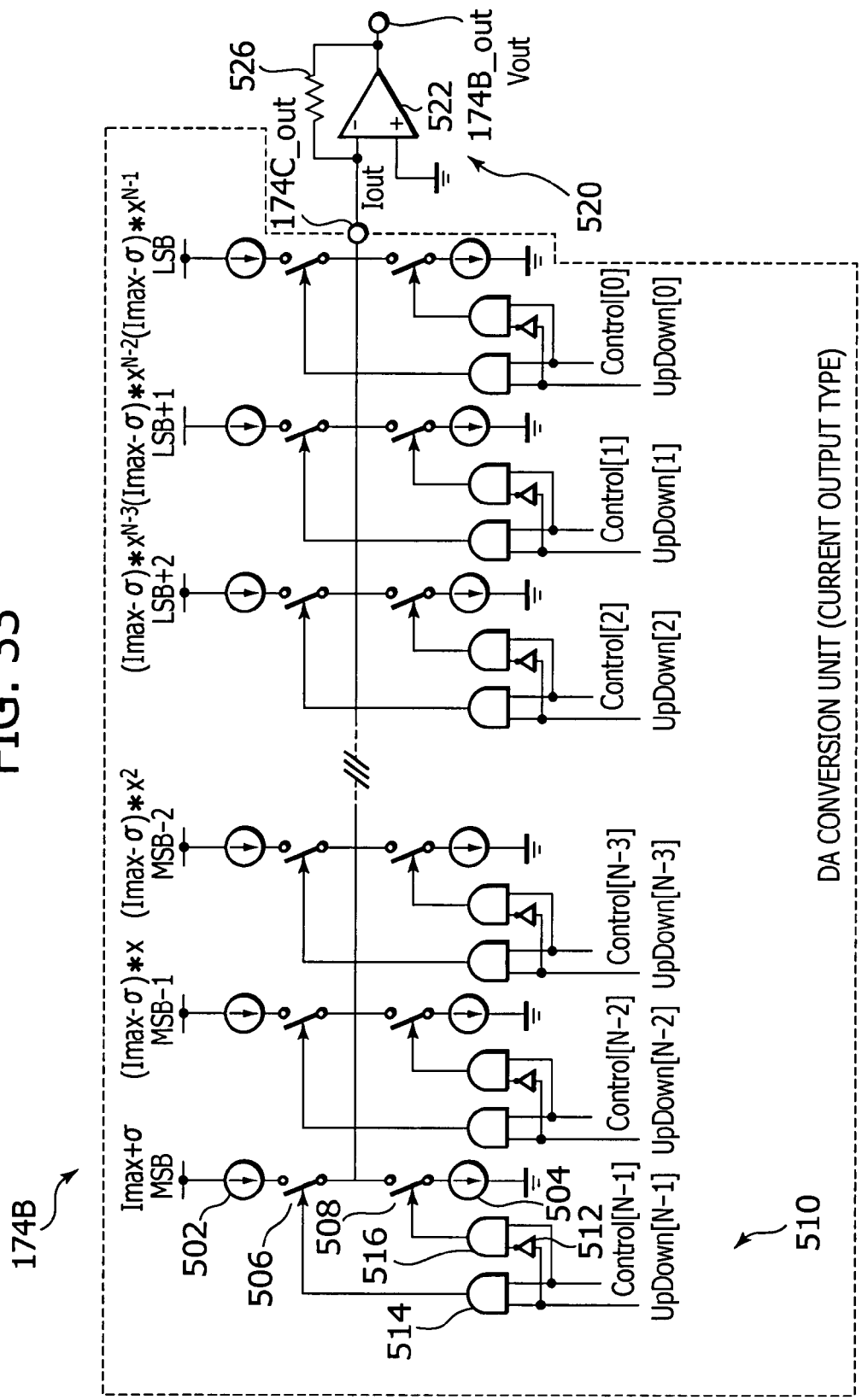
FIG. 33 is a diagram showing a detailed example of a structure of the voltage output type DA conversion unit.

FIG. 33 is a diagram showing a detailed example of a structure of the voltage output type DA conversion unit 174B. The structure as shown in this FIG. 33 corresponded to the DA conversion unit 174A as shown in FIG. 24 of the first embodiment, and is arranged in view of the scaling x and current variations.

In particular, as shown in FIG. 33, the DA conversion unit 174B includes a DA conversion unit 174C having a structure similar to that of the current output type DA conversion unit 174A as illustrated in the first embodiment, and includes an inversion type current/voltage conversion unit 520 following the current output terminal 174 C_out. In the DA conversion unit 174C having the structure similar to the DA conversion unit 174A, corresponding to the inversion type of the current/voltage conversion unit 520 to be connected to its latter stage, the arrangement of the inverter 512 is changed such that it is not on one input terminal side of the AND gate 514 but on one input terminal side of the AND gate 516.

In the AND gate 514, the up-and-down signal UpDown [N–#] is inputted into one input terminal, the control signal Control [N–#] (# is 1, 2, 3, . . . : 1 is on MSB side) for the corresponding bit of the frequency comparison result storage unit 172 is inputted to the other input terminal, and the output is supplied to the control terminal of the output switch 506 on the source-current source 502 side. In the AND gate 516, a signal obtained by logically inversing the up-and-down signal UpDown [N–#] by means of the inverter 512 is inputted to one input terminal, the control signal Control [N–#] is inputted to the other input terminal, and the output is supplied to the control terminal of the output switch 508 on the sink current source 504 side.

The current/voltage conversion unit 520 has an operational amplifier circuit 522 which allows an ideally infinite gain and a resistance element 526 with resistance R526. In the operational amplifier circuit 522, an inverse input terminal (–) is connected to the current output terminal 174 C_out of the DA conversion unit 174C, a non-inversion input terminal (+) is connected to the reference potential (=grounding potential GND). The resistance element 526 is connected between the output terminal and the inverse input terminal (–), and the output terminal is connected to voltage output terminal 174 B_out.

Let the gain of the operational amplifier circuit 522 be infinite and the value of the resistance element 526 be R526, the current and the voltage conversion gain of this current/voltage conversion unit 520 is R526.

About Gain Compensation

Third Embodiment

Figure 34:
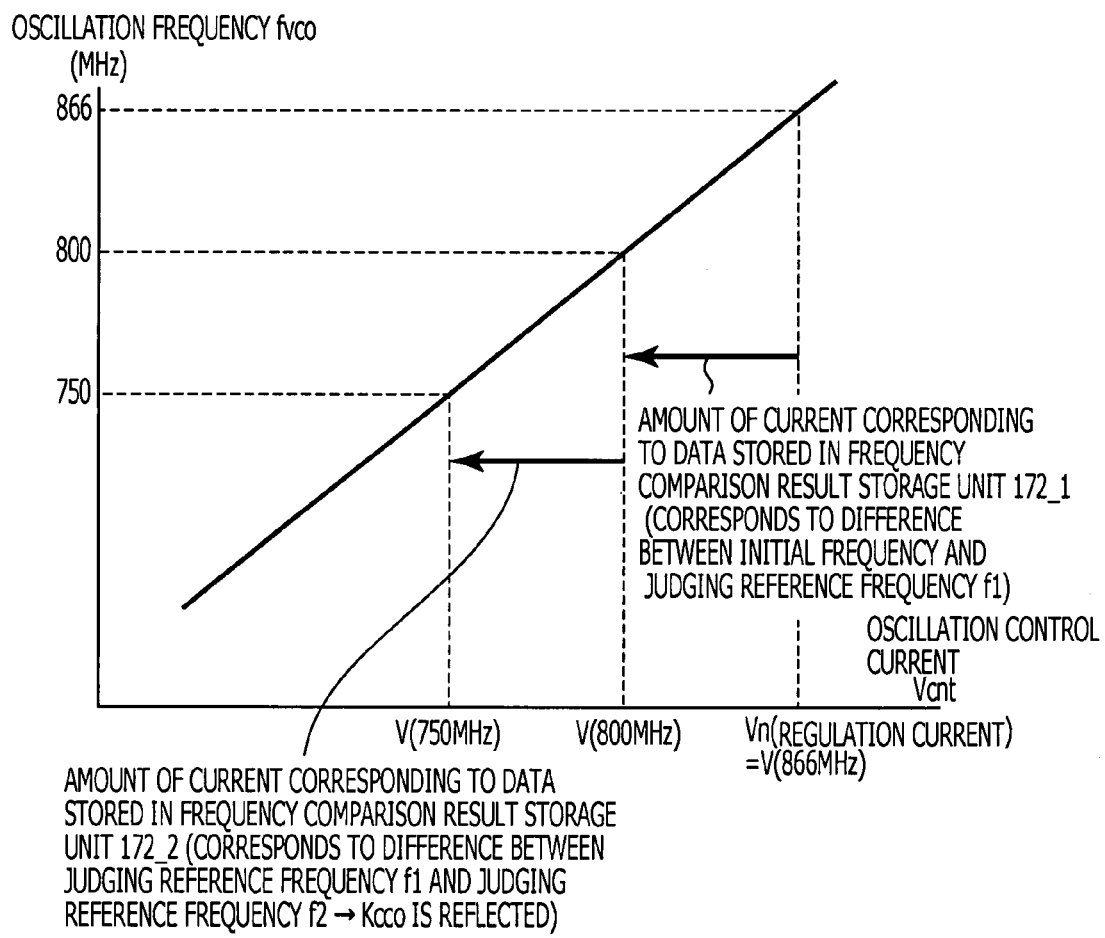
FIG. 34 is a graph for explaining transition of an oscillation frequency by way of the frequency search by using binary search and data corresponding to voltage values which provide judging reference frequencies in the third embodiment.
Figure 35:
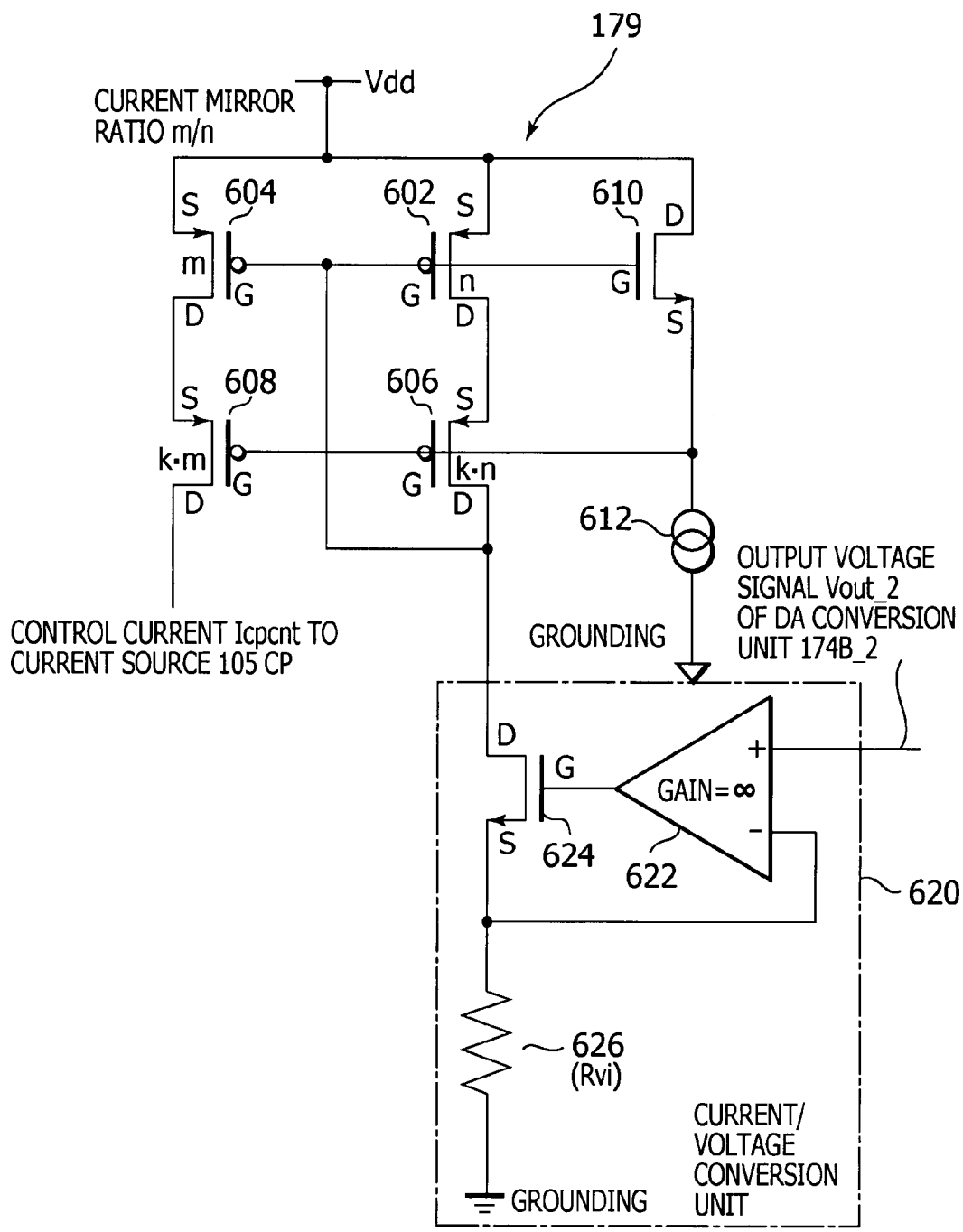
FIG. 35 is a diagram showing an example of a circuit structure of a voltage/current conversion unit provided for the gain characteristic information obtaining unit of the third embodiment.

FIGS. 34 and 35 are a graph and a chart for explaining a method of compensating for the input voltage-oscillation frequency conversion gain Kvco in the gain characteristic information obtaining unit 107B of the third embodiment, where FIG. 34 corresponds to FIG. 26 of the first embodiment and is the graph for explaining transition of the oscillation frequency fvco by way of the twice frequency search by using binary searches for every target oscillation frequency and the data D(f1) and D(f2) corresponding to the voltage values V(f1) and V(f2) which provide the judging reference frequencies f1 and f2 stored in the corresponding frequency comparison result storage units 172_1 and 172_2; and FIG. 35 is the diagram showing an example of a circuit structure of the voltage/current conversion unit 179 provided for the gain characteristic information obtaining unit 107B of the third embodiment. Although not shown, what corresponds to one in FIG. 27 of the first embodiment may be such that the oscillation control current Icnt along a horizontal axis is replaced with the oscillation control voltage Vcnt, and a vertical axis expresses the oscillation frequency fvco instead.

In the third embodiment, according to equation (17-1), even if the input voltage-oscillation frequency conversion gain Kvco changes, when a value of Icp·Kvco can always be kept constant by adjusting the charge pump current Icp, the zone ωn can be provided with a constant value to be matched with each of the plurality of types of the optical discs PD. This point is the same as that in the first embodiment.

Therefore, in the third embodiment, when the variation in the input voltage-oscillation frequency conversion gain Kvco is compensated for, the input current-oscillation frequency conversion gain Kcco in the first embodiment can be replaced with the input voltage-oscillation frequency conversion gain Kvco, and the concepts similar to those in equation (10)-equation (13) can be applied like the first embodiment.

For example, in the gain characteristic information obtaining unit 107B of the third embodiment, the frequency search by using binary search is performed for every target oscillation frequency for two types of judging reference frequencies f1 and f2. The results are stored in the separate frequency comparison result storage units 172_1 and 172_2. As with the first embodiment, the frequency search by using binary search result in the first judging reference frequency f1 is stored in the frequency comparison result storage unit 172_1, and the frequency search by using binary search result in the second judging reference frequency f2 is stored in the frequency comparison result storage unit 172_2.

At this time, the frequency division ratio switching signal Msel supplied to the switch control terminal 304_3 of the multiplexer 304 is caused to be at L level at the time of frequency search by using binary search by means of the first judging reference frequency f1. After the frequency search by using binary search with the first judging reference frequency f1, the frequency division ratio switching signal Msel is switched from L level to H level as a signal indicative of the end, whereby the judging reference frequency is switched from the judging reference frequency f1 to the judging reference frequency f2, and frequency search by using binary search with the second judging reference frequency f2 is performed.

The transition of the oscillation control voltage Vcnt supplied to the frequency control input terminal 101Bin of the voltage control oscillation unit 101B at that time, the measurement result data D(f1) and D(f2) stored in the respective frequency comparison result storage units 172_1 and 172_2, and the corresponding voltage values V(f1) and V(f2) are as shown in FIG. 34.

The example as shown in FIG. 34 illustrates the case where the judging reference frequency f1=800 MHz and the judging reference frequency f2=750 MHz are for converging the frequency, when the voltage control oscillation unit 101B is oscillating at 866 MHz with a regulation voltage Vn (=initial voltage Vini).

In this case, with the regulation voltage Vn, it is first oscillating at 866 MHz. By way of the frequency search by using binary search process at the judging reference frequency f1=800 MHz, the oscillation frequency fvco is gradually converged towards the judging reference frequency f1=800 MHz. As a result, the frequency comparison result storage unit 172_1 first stores therein the data D (800 MHz) which shows the difference in voltage "Vn–V (800 MHz)" between the regulation voltage Vn and the voltage V (800 MHz) required for the voltage control oscillation unit 101B to oscillate at 800 MHz.

In the example as shown in FIG. 34, with the regulation voltage Vn, the voltage control oscillation unit 101B is oscillating at a frequency (866 MHz in this example) higher than the judging reference frequency f1=800 MHz. Thus, a polarity of the difference in voltage is negative. If the voltage control oscillation unit 101B is oscillating with the regulation voltage Vn at a frequency lower than the judging reference frequency f1=800 MHz, the polarity of the difference in voltage becomes positive. This information may be seen from the first judgment result (i.e., data of the data storage unit 480_N−1 which takes charge of MSB of the frequency comparison result storage unit 172_1) of the frequency comparison unit 170 at the judging reference frequency f1. It is negative if it is "H".

Further, after the convergence is completed on the judging reference frequency f1=800 MHz, if the frequency search by using binary search is performed at the judging reference frequency f2=750 MHz, then the frequency comparison result storage unit 172_2 stores therein the data D (750 MHz) indicating the voltage required to lower the oscillation frequency fvco of the voltage control oscillation unit 101B from 800 MHz to 750 MHz i.e., the difference in voltage "V (800 MHz)−V (750 MHz)" between the voltage V (800 MHz) required for the voltage control oscillation unit 101B to oscillate at 800 MHz and the voltage V (750 MHz) required for the voltage control oscillation unit 101B to oscillate at 750 MHz.

Here, if the input voltage-oscillation frequency conversion gain Kvco is a positive characteristic (characteristic that the frequency increases if the voltage is high), the polarity of the difference in voltage "V (800 MHz)−V (750 MHz)" is always negative. This information may be seen from the first judgment result (i.e., data of the data storage unit 480_N−1 which takes charge of MSB of the frequency comparison result storage unit 172_2) of the frequency comparison unit 170 at the judging reference frequency f2. At the time of the first judgment (at the time of the judgment immediately after switching to the judging reference frequency f2), oscillation frequency fvco=800 MHz (=judging reference frequency f1)>judging reference frequency f2, therefore it can be seen that it is always "H" and negative.

As shown in equation (18), the input voltage-oscillation frequency conversion gain Kvco can be found by dividing the frequency difference "800 MHz−750 MHz" by the difference in voltage "V (800 MHz)−V (750 MHz)" as shown with the data D (750 MHz) stored in the frequency comparison result storage unit 170_2.

$$K_{vco} = \frac{800 \text{ MHz} - 750 \text{ MHz}}{V(800 \text{ MHz}) - V(750 \text{ MHz})} \quad (18)$$

$$= \frac{\text{Judging reference frequency } f1 - \text{Judging reference frequency } f2}{\text{Voltage in accordance with data stored in frequency comparison result storage unit} 172\_2}$$

Since a value of a numerator in equation (18) can be arbitrarily set up by the judging reference frequencies f1 and f2, it is given before the twice frequency search by using binary searches. Therefore, this means that the result of measuring the input voltage-oscillation frequency conversion gain Kvco of the voltage control oscillation unit 101B is substantially stored in the frequency comparison result storage unit 172_2.

In the gain characteristic information obtaining unit 107B, based on the measurement result of the input current-oscillation frequency conversion gain Kcco of the current control oscillation unit 101A substantially stored in the frequency comparison result storage unit 172_2, the bias current Icpbias supplied by the current source 105CP of the charge pump 104CP is adjusted so that the shift of the input voltage-oscillation frequency conversion gain Kvco due to the manufacture variation of the voltage control oscillation unit 101B and the temperature change may be offset, to thereby adjust the charge pump current Icp (substantial charge pump gain) of the charge pump 104CP. This point is the same as that in the first embodiment. However, it is necessary to cope with the voltage/current conversion unit 179, considering that the DA conversion unit 174B_2 (as well as the DA conversion unit 174B_1) is of the voltage output type.

For example, in the phase synchronization unit 100 of the third embodiment, the charge pump unit 104B operates in the current mode like the first embodiment, with which the charge pump voltage Vcp is obtained and supplied to the voltage summing unit 108B.

With respect to the variation compensation for the input voltage-oscillation frequency conversion gain Kvco, as with the variation compensation for the input current-oscillation frequency conversion gain Kcco in the first embodiment, based on the measure information on Kvco (real, T), the gain characteristic information obtaining unit 107B controls the bias current Icpbias for the charge pump 104CP, by generating the control current Icpcnt by means of the voltage/current conversion unit 179, so that the zone ωn may be constant. In this case, in the third embodiment, since the voltage output type DA conversion unit 174B is used, the voltage/current conversion unit 179 is arranged to have the function to convert the voltage output into the current output.

As shown in FIG. 35, the voltage/current conversion unit 179 includes the current/current conversion unit 177 of the first embodiment as it is, and includes a voltage/current conversion unit 620 on the drain side of the mirror transistor 606.

The voltage/current conversion unit 620 has an operational amplifier circuit 622 which allows an ideally infinite gain, a transistor 624, and a resistance element 626 having resistance Rvi with which a voltage current conversion gain is determined.

As for the transistor 624, its drain is connected to the drain of the mirror transistor 606, and its source is connected to the reference potential (=grounding potential GND) through the resistance element 626. The operational amplifier circuit 622 is arranged such that its output terminal is connected to a gate of the transistor 624, its inverse input terminal (−) is connected to a source of the transistor 624, and its non-inversion input terminal (+) is connected to the voltage output type voltage output terminal 174 B_out of the DA conversion unit 174B_2.

In the voltage/current conversion unit 179 of such a structure, assuming that the gain of the operational amplifier circuit 622 is infinite, the value of the resistance element 626 which determines the voltage current conversion gain is Rvi and the current mirror ratio is m/n, then the voltage/current conversion gain is 1/Rvi×m/n.

This voltage/current conversion gain 1/Rvi×m/n corresponds to the Kcco compensation current mirror ratio shown by equation (12) applied at the time of the variation compensation with respect to the input current-oscillation frequency conversion gain Kcco. In the variation compensation with respect to the input voltage-oscillation frequency conversion gain Kvco, this voltage/current conversion gain 1/Rvi×m/n is determined as follows.

Firstly, as with the case of the current control oscillation unit 101A, in the real operating situation (real, T) at an environmental temperature of T° C., in order for the Icp (real, T)·Kvco (real, T) to keep the constant value in the ideal state (ideal; room temperature (25° C.)), it is necessary to satisfy equation (19).

$$I_{cp}(\text{real}, T) \cdot K_{vco}(\text{real}, T) = \frac{I_{cp}(\text{ideal}, 25\ \text{deg}) \cdot K_{vco}(\text{ideal}, 25\ \text{deg})}{K_{vco}(\text{real}, T)} \quad (19\text{-}1)$$

$$I_{cp}(\text{real}, T) = \frac{I_{cp}(\text{ideal}, 25\ \text{deg}) \cdot K_{vco}(\text{ideal}, 25\ \text{deg})}{K_{vco}(\text{real}, T)} \quad (19\text{-}2)$$

(19)

where Icp (real, T) and Kvco (real, T) are the values of the charge pump current Icp and the input voltage-oscillation frequency conversion gain Kvco of the voltage control oscillation unit 101B at the time of the temperature of T° C. of the actually manufactured circuit. Similarly, Icp (ideal, 25 deg) and Kvco (ideal, 25 deg) are the values at room temperature (25° C.) at the time of the design.

Kvco (real, T) of a denominator of equation (19-2) is the input voltage-oscillation frequency conversion gain Kvco of the manufactured voltage control oscillation unit 101B, and therefore is the value itself of Kvco measured by the gain characteristic information obtaining unit 107B, and is the same as that shown in equation (18).

Then, if we substitute equation (18) into equation (19-2), equation (19-2) can be transformed to equation (20-1). Further, it is possible to express Icp(ideal, 25 deg)=βIcpbias (ideal, 25 deg) and Icp(real, T)=βIcpbias (real, T) (where β is magnification of the charge pump current Icp with respect to the bias current Icpbias). If we substitute this into equation (20-1), equation (20-1) can be transformed to equation (20-2).

$$I_{cp}(\text{real}, T) = \frac{I_{cp}(\text{ideal}, 25\ \text{deg}) \cdot K_{vco}(\text{ideal}, 25\ \text{deg})}{\text{Judging reference frequency } f1 -} \times$$
$$\text{Judging reference frequency } f2$$
$$V\left(\begin{array}{c}\text{Frequency comparison}\\ \text{result storage unit 172\_2}\end{array}\right) \quad (20\text{-}1)$$

$$I_{cpbias}(\text{real}, T) = \frac{I_{cpbias}(\text{ideal}, 25\ \text{deg}) \cdot K_{vco}(\text{ideal}, 25\ \text{deg})}{\text{Judging reference frequency } f1 -} \times$$
$$\text{Judging reference frequency } f2$$
$$V\left(\begin{array}{c}\text{Frequency comparison}\\ \text{result storage unit 172\_2}\end{array}\right) \quad (20\text{-}2)$$

The output voltage signal Vout_2 is an output voltage signal outputted from the DA conversion unit 174B_2 based on the data D(f2) stored in the frequency comparison result storage unit 172_2. Further, the judging reference frequency f1 is the judging reference frequency (of two types of judging reference frequencies) used in the first frequency search by using binary search. The judging reference frequency f2 is the judging reference frequency used in the frequency search by using binary search after switching the frequency. There is a relationship, the judging reference frequency f1>the judging reference frequency f2.

Here, since Icpbias (ideal, 25 deg) and Kvco (ideal, 25 deg) are the values at room temperature (25° C.) at the time of the design, they are given. Since the judging reference frequency f1—the judging reference frequency f2 are also set up before operating the gain characteristic information obtaining unit 107B, they are given.

From these given values, the voltage/current conversion gain of the voltage/current conversion unit 179 having the current mirror circuit structure as shown in FIG. 35 is determined like equation (21) in the gain characteristic information obtaining unit 107B. This voltage/current conversion gain is referred to as a Kvco compensation voltage-current conversion gain.

$$\begin{array}{l}K_{vco}\ \text{Compensation}\\ \text{voltage-current}\\ \text{conversion}\\ \text{gain}\ (1/Rvi \times m/n)\end{array} = \frac{I_{cpbias}(\text{ideal}, 25\ \text{deg}) \cdot K_{vco}(\text{ideal}, 25\ \text{deg})}{\text{Judging reference frequency } f1 -}$$
$$\text{Judging reference frequency } f2 \quad (21)$$

If we substitute equation (21) into equation (20-2), equation (20-2) can be transformed to equation (22).

$$I_{cp}(\text{real},T) = K_{vco}{}^{\text{Compensation voltage-current conversion gain}}_{(1/Rvi \times m/n)} \times V(^{\text{Frequency comparison result storage unit}}_{172\_2}) \quad (22)$$

As can be seen from equation (22), also in the third embodiment, the gain characteristic information obtaining unit 107B which compensates for the input voltage-oscillation frequency conversion gain Kvco of the voltage control oscillation unit 101B converts the output voltage signal Vout_2 outputted from the DA conversion unit 174B_2 into the current signal by means of the voltage/current conversion unit 179 and passes information on the measured Kvco (real, T) to the current/current conversion unit 177 (drain of the mirror transistor 602 thereof) having a current mirror circuit structure. Based on the information, the control current Icpcnt is generated in the voltage/current conversion unit 179 so that the zone ωn may become constant, whereby the bias current Icpbias for the charge pump 104CP is controlled.

In this embodiment, when performing variation compensation for the input voltage-oscillation frequency conversion gain Kvco of the voltage control oscillation unit 101B, the Kvco compensation voltage-current conversion corresponding to the Kcco compensation current mirror ratio of the first embodiment is set up by the voltage/current conversion unit 179 so that equation (21) may be satisfied. However, this value is determined by Icpbias (ideal, 25 deg), Kvco (ideal, 25 deg), and the judging reference frequencies f1 and f2. As with the description of modification with reference to the first embodiment, according to Icpbias (ideal, 25 deg) and Kvco (ideal, 25 deg) which are physically determined from the element characteristic, a structure can also be employed in which the voltage/current conversion unit 179 including the current/current conversion unit 177 is removed and replaced with a simple voltage/current conversion unit if the difference between the judging reference frequencies f1 and f2 is adjusted so that the current mirror ratio (m/n) may be "1/power of 2".

In particular, in the usual phase synchronizing operation after completion of the measurement by means of the gain characteristic information obtaining unit 107B, i.e., when the path selection switch 175 is returned to the voltage summing unit 176B side after completion of the measurement, the input of the control signal Control [N–#] from the data storage unit 460 and the up-and-down signal UpDown [N–#] from the data storage unit 480 into the voltage output type DA conversion unit 174B_2 is bit shifted towards the lower bit side. Thus, it is substantially possible to cope with the management that the current mirror ratio (m/n) is "1/power of 2". In order to bit shift the input of Control [N–#] and UpDown [N–#] into the DA conversion unit 174B_2, the path selection switch therefore may only be provided.

For example, when Icpbias (ideal, 25 deg)=10 μA, Kcco (ideal, 25 deg)=0.3 MHz/μA, and the judging reference frequency f1=800 MHz, let the judging reference frequency f2=752 MHz, then the current mirror ratio (m/n) is 3/48=1/16. Therefore, the path selection switch may be switched so that the input of Control [N-#] and UpDown [N-#] into the DA conversion unit 174B_2 may be carried out to be inputted in the lower side by 4 bits.

INDUSTRIAL APPLICABILITY

As described above, although the present invention is described with reference to the embodiments, the technical scope of the present invention is not limited to the described range of the above-mentioned embodiments. Various changes or improvement can be added to the above-mentioned embodiments without departing from the scope of the invention, and the thus changed and improved embodiment is also included in the technical scope of the present invention.

Further, the above-mentioned embodiments do not limit the invention according to claims. Furthermore, not all the combinations of the features described with reference to the embodiments are necessarily indispensable for the solution means of the invention. The inventions of various stages are included in the embodiments as described above, and various inventions can be derived by way of a suitable combination in a plurality of disclosed constituent elements. Even if some constituent elements are deleted out of the whole constituent elements as illustrated in the embodiments, as long as the effect is obtained, a structure from which some of these constituent elements are deleted may be extracted as the invention.

For example, at the time of the usual phase synchronizing operation, based on the compensation signals (Icpcnt and Vcpcnt) obtained by the gain characteristic information obtaining unit 107, when controlling the drive unit 104Z so that a product of the input signal-oscillation frequency conversion gain (Kcco and Kvco) obtained by measurement and the drive signals (Icp and Vdr) with which the drive unit 104Z drives the loop filter unit 106 may be constant, the standard drive signals (Icp and Vdr) of the standard input signal-oscillation frequency conversion gain Kosci are arranged to be the values under the conditions of the ideal state (ideal; 25° C. (room temperature)) specified with the designed values in equation (10)-equation (12), equation (19)-equation (21), etc. However, these are described merely by way of example and may also take other values as standard values.

For example, even if this is the case where they are determined in terms of design parameters, not only 25° C. but also another temperature (for example, 20° C.) may be room temperature, and the design parameters may be taken as the respective standard values at that time.

Furthermore, the standard values may not be determined in terms of the design parameters, but an arbitrary real thing (sample) may be chosen whose frequency conversion gain and drive signal are measured under the usual conditions (for example, room temperature (20° C., 25° C., etc.)) and may be taken as standard value. In this case, it is possible to determine the standard values according to an average value, a median, etc. as a result of measuring a plurality of samples (real things).

Further, in each of the above-described embodiments, the variation compensation for the input signal-oscillation frequency conversion gain Kosci is realized by controlling the bias current Icpbias for the charge pump 104CP. In addition, in the first and second embodiments, the oscillation unit 101 serves as the current control oscillation unit 101A controlled in the current mode. In accordance with this, the DA conversion unit 174 of the gain characteristic information obtaining unit 107 also uses the current output type DA conversion unit 174A. On the other hand, in the third embodiment, the oscillation unit 101 serves as the voltage control oscillation unit 101B controlled in the voltage mode. In accordance with this, the DA conversion unit 174 of the gain characteristic information obtaining unit 107 is also arranged to use the voltage output type DA conversion unit 174B. However, since there is a relationship of "principle of duality" between current and voltage in circuit theory, it is possible to substitute the current mode for the voltage mode and vice versa and to change the circuit according to the substitution, and the combination can be changed in various ways.

For example, in a combination of the oscillation unit 101 and the gain characteristic information obtaining unit 107, when the substitution of the current mode for the voltage mode is considered, the following things can be the.

In the case where the control with respect to the current source 105CP of the gain characteristic information obtaining unit 107 is of a current control type and the voltage output type DA conversion unit 174B is employed as the DA conversion unit 174, and when the oscillation unit 101 is the current control oscillation unit 101A, it is at least necessary for the frequency control input terminal 101Ain of the current control oscillation unit 101A to be the oscillation control current Icnt in the current mode. To the extent as described above, the voltage/current conversion unit may be provided in any place.

Figure 36:
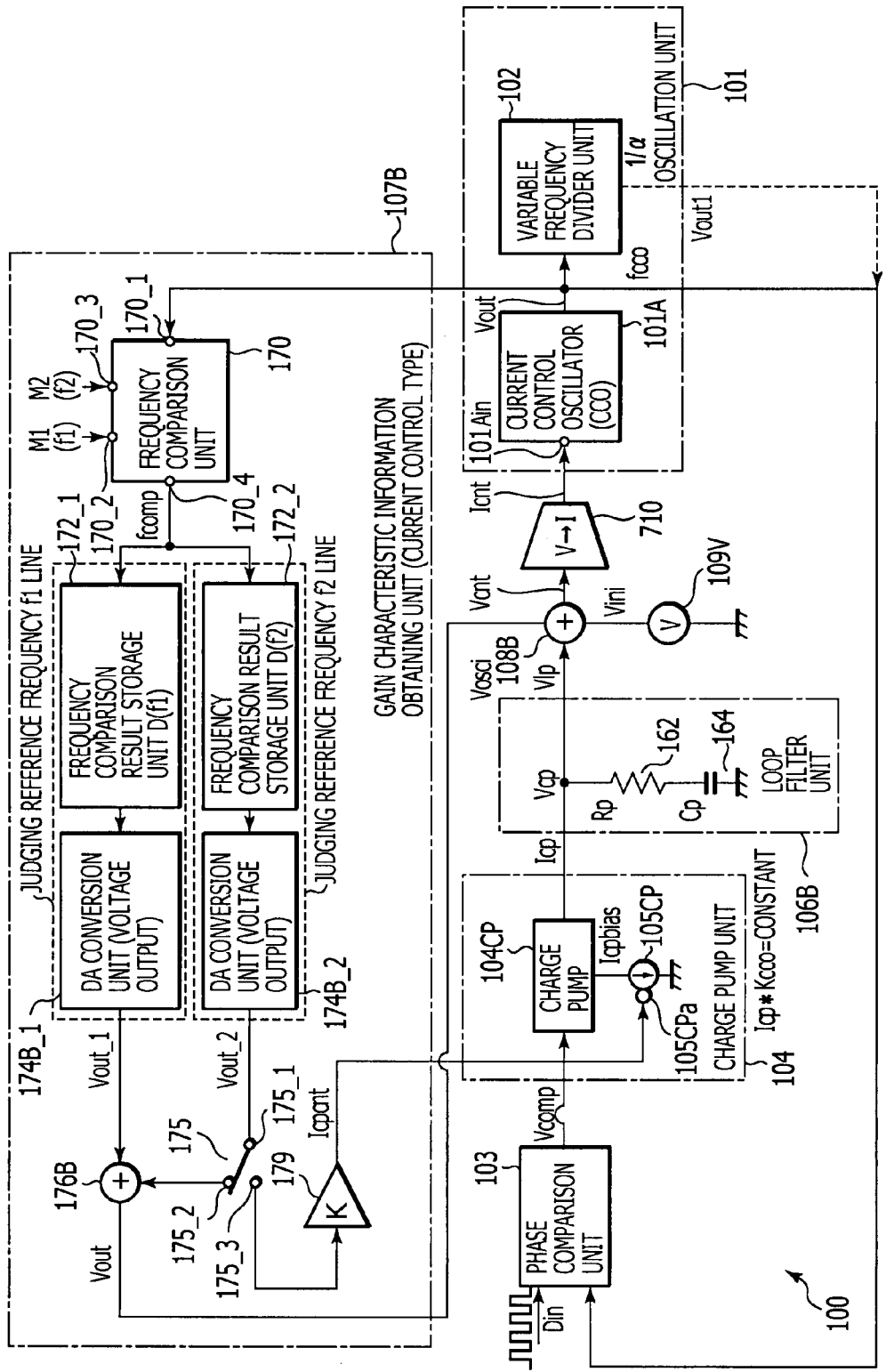
FIG. 36 is a functional block diagram showing the fourth embodiment of the phase synchronization unit.

For example, like the fourth embodiment as shown in FIG. 36, while the loop filter unit 106 or the gain characteristic information obtaining unit 107 may employ the same structure as that in the third embodiment, the voltage/current conversion unit 710 which converts the oscillation control voltage Vcnt into the oscillation control current Icnt may be provided between the output of the voltage summing unit 108B and the frequency control input terminal 101Ain. In this case, as for operation of the whole variation compensation for the input signal-oscillation frequency conversion gain Kosci, the input voltage-oscillation frequency conversion gain Kvco in the third embodiment may only be replaced with the input current-oscillation frequency conversion gain Kcco. The rest can be considered as that in the third embodiment in the same way.

In the case where the control with respect to the current source 105CP of the gain characteristic information obtaining unit 107 is of the current control type and one that if of the voltage output type is employed as the DA conversion unit 174, and when the voltage control oscillation unit 101B is used as the oscillation unit 101, it is at least necessary for the frequency control input terminal 101Bin of the voltage control oscillation unit 101B to be at the oscillation control voltage Vcnt in the voltage mode. To the extent as described above, the current/voltage conversion unit may be provided in any place.

Figure 37:
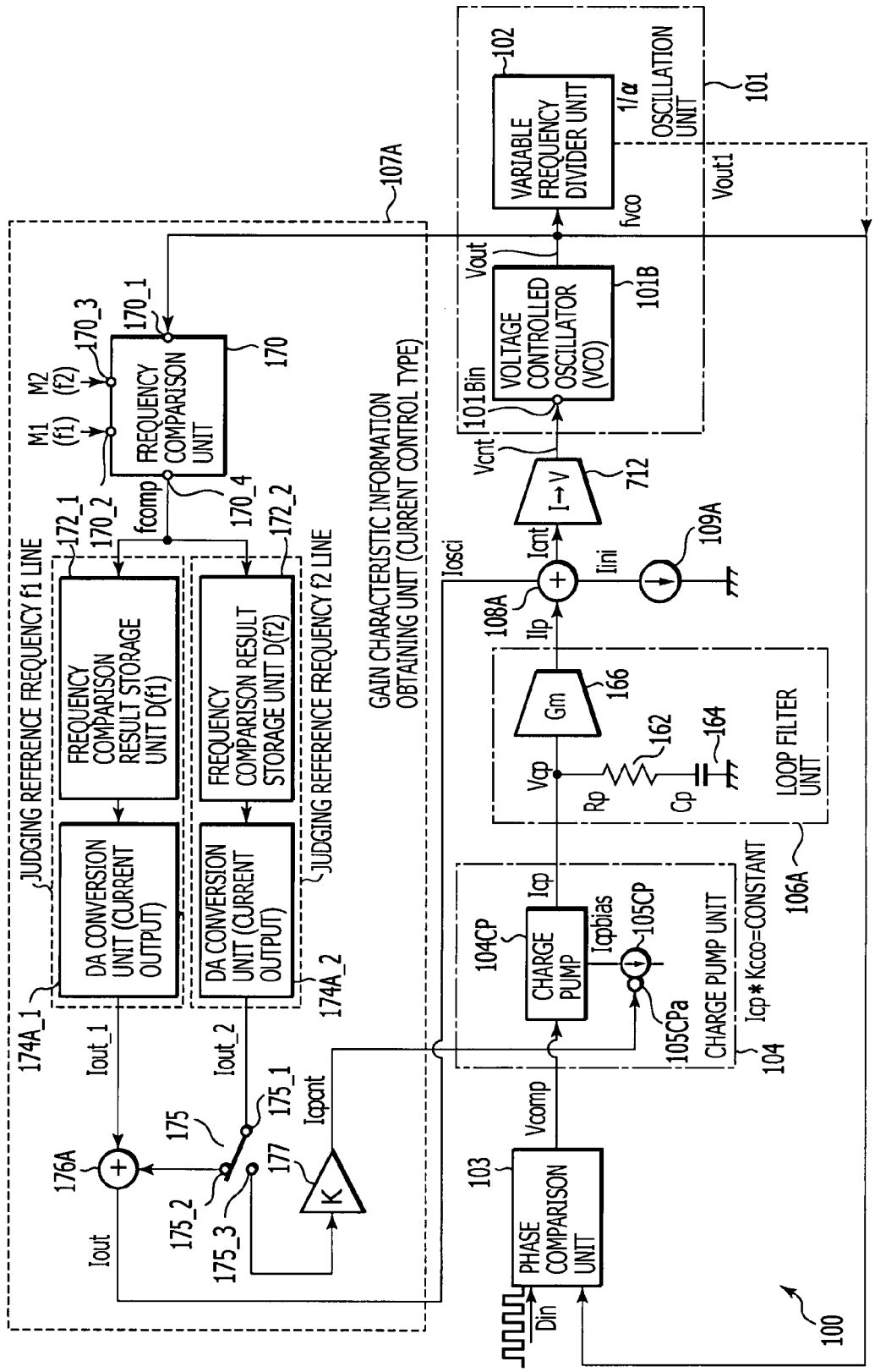
FIG. 37 is a functional block diagram showing the fifth embodiment of the phase synchronization unit.

For example, like the fifth embodiment as shown in FIG. 37, as for the loop filter unit 106 or the gain characteristic information obtaining unit 107, while adopting the structure similar to that of the first or the second embodiment (illustrated based on the first embodiment in the diagram), the current/voltage conversion unit 712 which converts the oscillation control current Icnt into the oscillation control voltage Vcnt may be provided between the output of the current summing unit 108A and the frequency control input terminal 101Bin. In this case, as for operation of the whole variation compensation for the input signal-oscillation frequency conversion gain Kosci, the input current-oscillation frequency conversion gain Kcco in the first or second embodiment may only be replaced with the input voltage-oscillation frequency conversion gain Kvco. The rest can be considered as that in the first or second embodiment in the same way.

Further, as for a mechanism in which the variation compensation for the input signal-oscillation frequency conversion gain Kosci, based on the output signal (Iout_2 or Vout_2) outputted from the DA conversion unit 174_2 based on the information on Kosci (real, T) measured in the gain characteristic information obtaining unit 107, the control current Icpcnt is generated so that the product of the charge pump current Icp and the input signal-oscillation frequency conversion gain Kosci may be constant in order to fix the zone ωn, whereby the bias current Icpbias for the charge pump 104CP is controlled. However, with respect to this, it is also possible to substitute the current mode with the voltage mode and vice versa in terms of circuit theory, and the combination can be changed in various ways.

Figure 38:
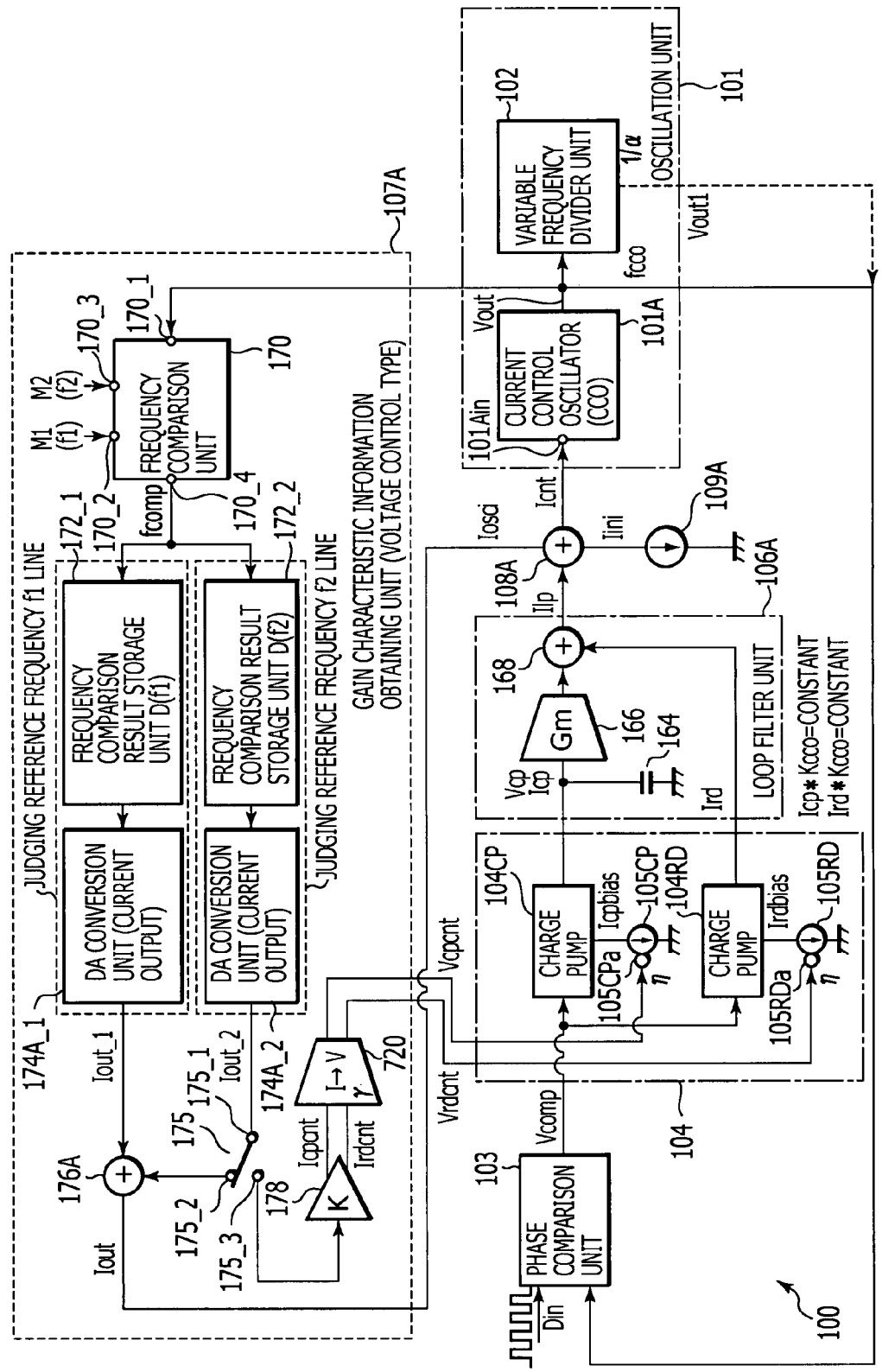
FIG. 38 is a functional block diagram showing the sixth embodiment of the phase synchronization unit.

For example, like the sixth embodiment shown in FIG. 38, as for the loop filter unit 106 or the gain characteristic information obtaining unit 107, while adopting the structure generally similar to that of the first or the second embodiment (illustrated based on the second embodiment in the diagram), the output of the gain characteristic information obtaining unit 107 is made into a voltage form, whereby an arrangement in which the charge pump current Icp and the charge pump current Ird of the charge pump unit 104 are controlled in the voltage mode can be employed. In other words, the current-value variable-type current supplies 105CP and 105RD may be arranged such that the charge pump currents Icp and Ird can be controlled in the voltage mode.

An example of such a structure may be arranged such that a current/voltage conversion unit 720 is prepared which converts the control current Icpcnt outputted from the current/current conversion units 177 and 178 or the voltage/current conversion unit 179 into the voltage signal with a conversion gain γ, and the bias currents Icpbias and Irdbias of the current supplies 105CP and 105RD are controlled with a control conversion gain η by the control voltages Vcpcnt and Vrdcnt outputted from the current/voltage conversion unit 720. As shown, the current/voltage conversion unit 720 is provided in the gain characteristic information obtaining unit 107A, and the gain characteristic information obtaining unit 107A is changed into the voltage control type. However, the current/voltage conversion unit 720 may be provided in the charge pump unit 104, leaving the gain characteristic information obtaining unit 107A to be of the current control type.

An example of a structure in which the bias currents Icpbias and Irdbias are controlled by the control conversion gain η is such that the amounts of currents which flow in the reference current source side of the current mirror are controlled by the control voltage Vcpcnt and Vrdcnt supplied to the control input terminals 105CPa and 105RDa. Accordingly, the bias currents Icpbias and Irdbias may only be arranged to be supplied to the charge pumps 104CP and 104RD, respectively.

In particular, for example, it may be arranged that the NMOS transistors are subjected to the current mirror connection so that the control voltages Vcpcnt and Vrdcnt may be received in the current mirror form, one drain terminal commonly connected to the gate terminal serves as the control input terminal 105CPa or 105RDa, the control voltage Vcpcnt or Vrdcnt is supplied through a current control resister for specifying the control conversion gain η, the bias current Icpbias or Irdbias is obtained at the other drain terminal.

In this case, when it is arranged that the product γ·η of the conversion gain γ of the current/voltage conversion unit 720 and the control conversion gain η with respect to the bias currents Icpbias and Irdbias is set to "1", the variation compensation for the input signal-oscillation frequency conversion gain Kosci may be similarly considered as that in the first-the third embodiments. Further, when the product γ·η is not "1", it may only be offset by adjusting equation (13) and equation (22) relating to compensation.

Further, in the above, as for the current/current conversion units 177 and 178 and the voltage/current conversion unit 179, their basic portions are arranged in the current mirror structure where the current mirror ratio (m/n) is set up in accordance with Icpbias (ideal, 25 deg), Kcco (ideal, 25 deg), and the judging reference frequencies f1 and f2 (all are given), whereby the variation compensation for the input signal-oscillation frequency conversion gain Kosci is realized. However, the portions can also be modified to operate in the voltage mode instead of the current mode.

For example, in a combination with the sixth embodiment, the DA conversion unit 174 may be the voltage output type DA conversion unit 174B, and the combination of the current/current conversion units 177, 178 or the voltage/current conversion unit 179 with the current/voltage conversion unit 720 can be replaced with a current/current conversion unit with a conversion gain K.

However, generally, in terms of circuit structures, when a circuit in which a voltage ratio is set up in the voltage mode is compared with a circuit in which a current ratio is set up in the current mode, it is easier to deal with the circuit in which the current ratio is set up in the current mode and which can use the current mirror form.

Therefore, in view of the phase synchronization unit 100 having the gain characteristic information obtaining unit 107 as a whole, it is preferably arranged that the current mirror form, as a base element, is employed for the current/current conversion units 177 and 178 and the voltage/current conversion unit 179, to allow current mode output and to control the bias current Icpbias and Icpbias in the current mode with respect to the charge pump unit 104. Furthermore, in relation to this, the oscillation unit 101 may serve as the current control oscillation unit 101A, accordingly the gain characteristic information obtaining unit 107 may also employ the gain characteristic information obtaining unit 107A having the current output type DA conversion unit 174A, which is thought to lead to the most compact structure.

Further, in the above-mentioned embodiment, the gain characteristic information obtaining unit 107 measures the input signal-oscillation frequency conversion gain Kosci in the real operating situation. Based on the measurement result, in order to offset the variation in the input signal-oscillation frequency conversion gain Kosci, the drive capability (charge pump currents Icp and Ird) of the charge pump unit 104 which is an example of the drive unit 104Z for driving the loop filter unit 106 is controlled to cause the product of the input signal-oscillation frequency conversion gain Kosci and the charge pump current Icp and Ird to be constant. However, by applying "principle of duality" also to this point, the control can be changed and carried out in the voltage mode instead of the current mode.

For example, the input signal-oscillation frequency conversion gain Kosci in the real operating situation is measured. Based on the measurement result, in order to offset the variation in the input signal-oscillation frequency conversion gain Kosci, the drive capability (drive voltage Vlp) of the drive unit 104Z which drives the loop filter unit 106 may only be controlled so that the product of the input signal-oscillation frequency conversion gain Kosci and the drive voltage Vlp may be constant.

Figure 39:
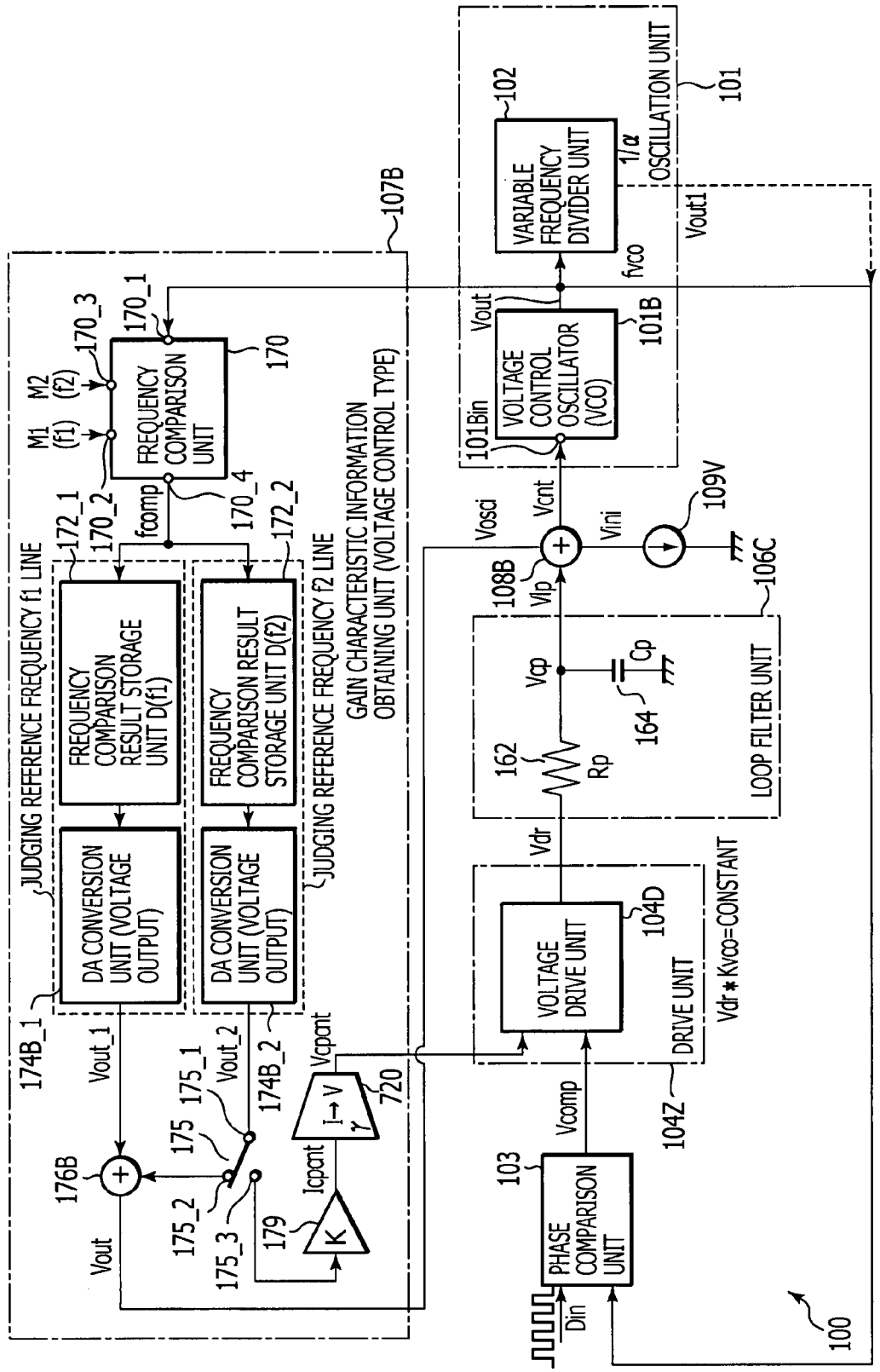
FIG. 39 is a functional block diagram showing the seventh embodiment of the phase synchronization unit.
Figure 40:
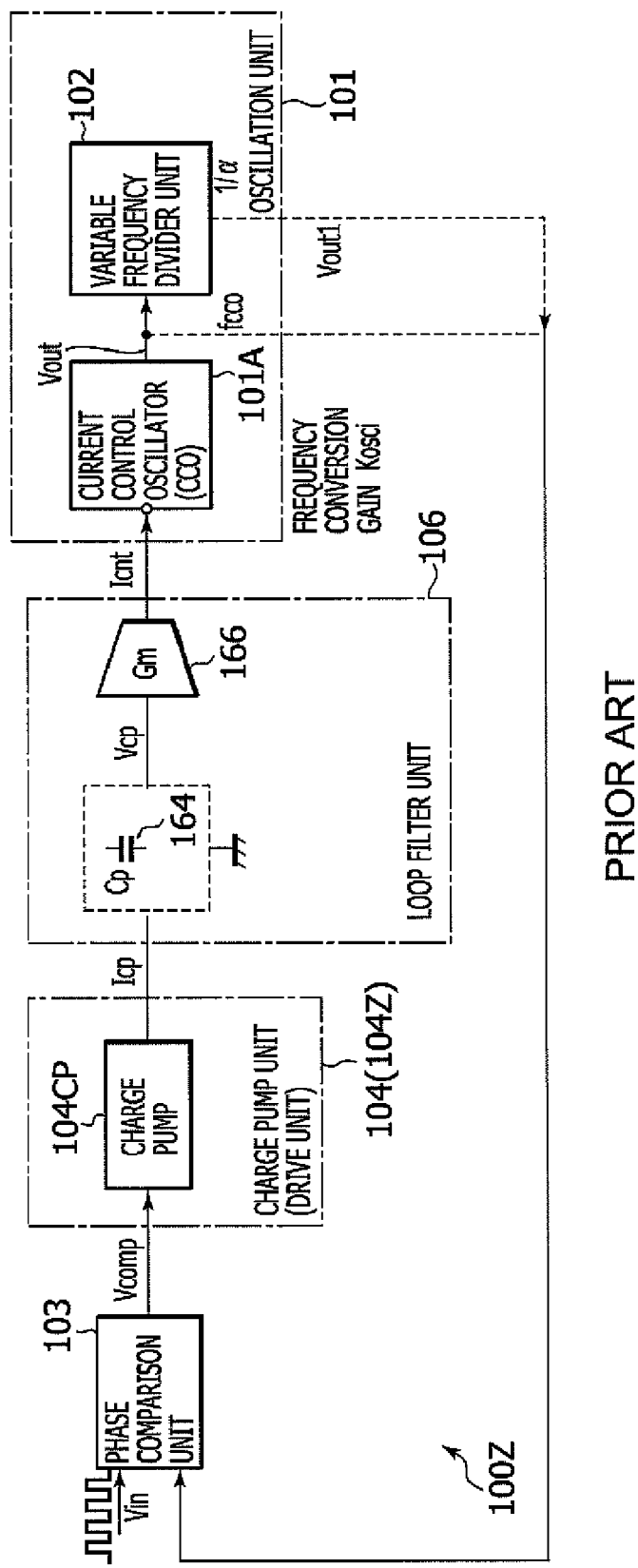
FIG. 40 is a circuit block diagram generally showing the phase synchronization circuit.
Figure 41A:
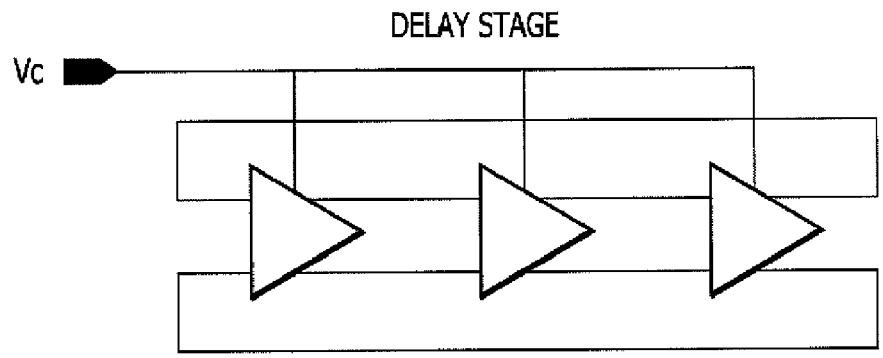
FIGS. 41A and 41B are block diagrams showing an arrangement of non-patent document 1.
Figure 41B:
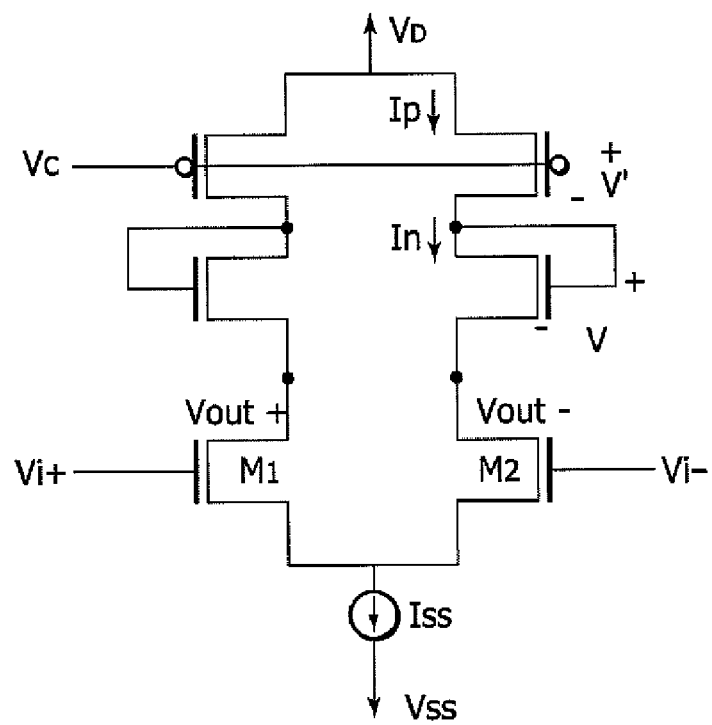
Figure 42:
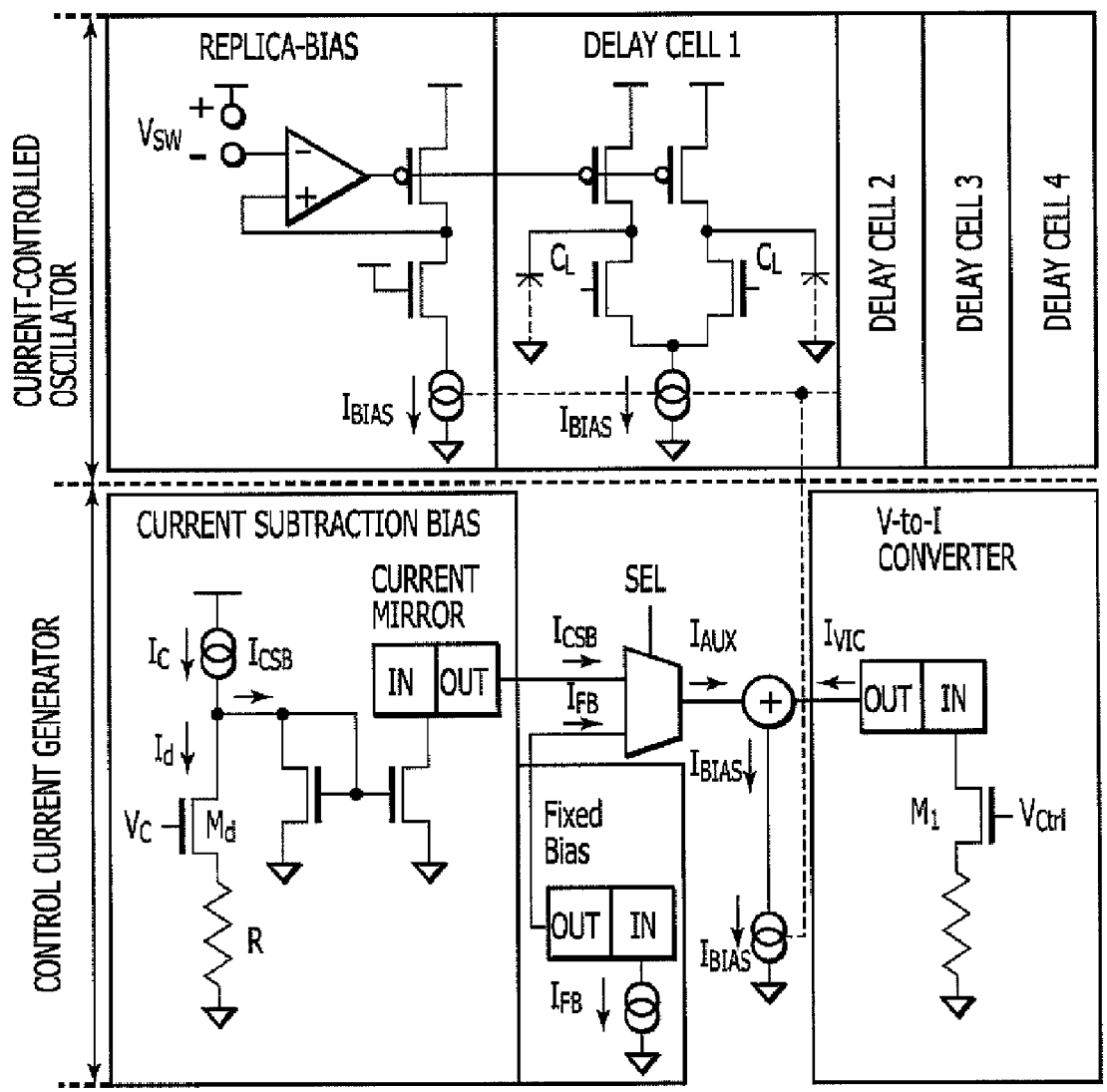
FIG. 42 is a block diagram showing an arrangement of non-patent document 2.
Figure 43:
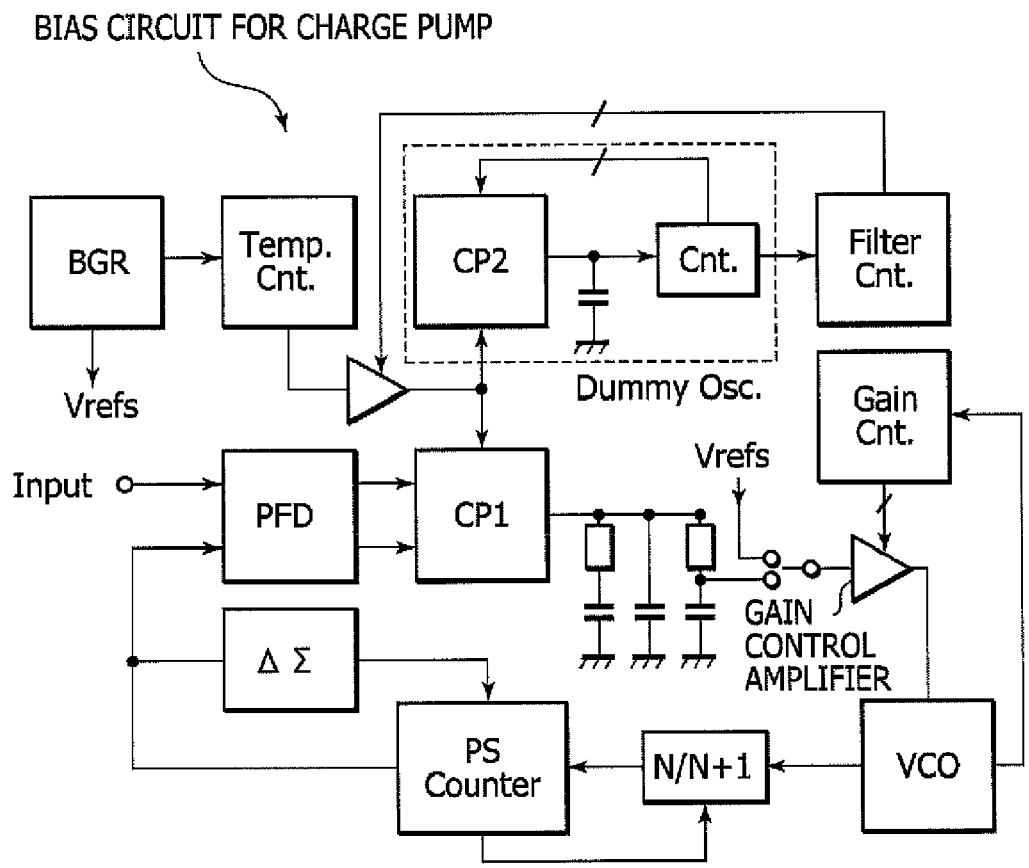
FIG. 43 is a block diagram showing an arrangement of non-patent document 3.

To this end, like the seventh embodiment shown in FIG. 39 (which basically illustrates a combination of the third embodiment and the sixth embodiment), for example, the drive unit 104Z is arranged to have a voltage drive unit 104D of the voltage output type instead of the current output type charge pump unit 104. The loop filter unit 106 is arranged such that the resistance element 162 is disposed between the output of voltage drive unit 104D and the voltage summing unit 108B. The capacitor 164 is arranged to be disposed between the grounding and the connection point of the resistance element 162 and the voltage summing unit 108B.

The drive unit 104Z provided with the voltage drive unit 104D may only be arranged to output the drive voltage Vdr according to the comparison result signal Vcomp outputted from the phase comparison unit 103, and arranged so that the control is carried out to cause the product of the drive voltage Vdr and the input signal-oscillation frequency conversion gain Kosci (the input voltage-oscillation frequency conversion gain Kvco in the figure) to be constant.

The control by the gain characteristic information obtaining unit 107 to this end may be in the current mode (current-control type control current Icpcnt) similarly to the first through the fifth embodiments. Alternatively, as shown, it may be in the voltage mode (voltage-control type control voltage Vcpcnt) similarly to the sixth embodiment. This point is similar to the fact that the control for the current supplies 105CP and 105RD for controlling the charge pump currents Icp and Ird may be in any of the current mode and voltage mode. However, in respect of the increase in efficiency of combination, it is preferable that the gain characteristic information obtaining unit 107 is of the voltage control type.

Further, in the above-mentioned embodiments, the phase synchronization unit 100 is described in the case where it is applied to the optical disc apparatus 1. However, the apparatus to which the phase synchronization unit 100 can be applied and which is described in each embodiment is not limited to the optical disc apparatus 1. For example, it may be applied to various types of communication apparatuses, transmission/reception devices, etc.

According to the phase synchronization unit 100 of the present embodiments, before the oscillation frequency fosci of the oscillation unit (the current control oscillation unit 101A and the voltage control oscillation unit 101B) in PLL (phase synchronization circuit) used for magnetic or optical disc playback systems, high-speed serial communications, etc. is operated as the phase synchronization circuit, it is matched to an input clock frequency or the reception data rate (equivalent to the digital data sequence Din of the present embodiment) to shorten the acquisition time of PLL (the synthesizer is not required for clock reproduction). At the same time, it is possible to compensate for the characteristic of the input signal-oscillation frequency conversion gain Kosci of a nonlinear oscillator. After completion of the compensation, low power consumption is realized in DC operation, which is not a noise source against PLL. Thus, it is possible to prevent the jitter due to the added compensation circuit from increasing.

It should be understood by those skilled in the art that various modifications, combinations, sub-combinations and alternations may occur depending on design requirements and other factors insofar as they are within the scope of the appended claims or the equivalents thereof.

The present application claims benefit of priority of Japanese Patent Application No. 2006-246327 on Sep. 12, 2006, the entire content of which being incorporated herein by reference.

What is claimed is:
1. A phase synchronization circuit comprising:
an oscillation unit for outputting an output oscillation signal with a predetermined frequency based on an oscillation control signal;
a phase comparison unit for comparing phases between the output oscillation signal outputted from the oscillation unit and an input signal inputted from outside;
a loop filter unit;
a drive unit for generating a drive signal based on a signal indicative of a phase comparison result outputted from the phase comparison unit, and driving the loop filter unit by the drive signal;
an oscillation control signal generation unit for generating an oscillation control signal based on a loop filter output signal outputted from the loop filter unit so that a phase of the output oscillation signal synchronizes with the phase of the input signal; and
a gain characteristic information obtaining unit for obtaining gain characteristic information which specifies an input signal-oscillation frequency conversion gain characteristic of the oscillation unit at the time of actual operation and for storing the gain characteristic information, the gain characteristic information being obtained by comparing an actual oscillation frequency and first and second target frequencies to find a difference, while supplying, by using the first and second target frequencies, a regulation signal of a predetermined magnitude and a compensation for oscillating the oscillation unit at each frequency as the oscillation control signal;
wherein a compensation signal is generated based on the gain characteristic information obtained by the gain characteristic information obtaining unit at a time of a usual phase synchronizing operation, and the drive unit is controlled by the compensation signal so that a product of the input signal-oscillation frequency conversion gain at a time of actual operation and the drive signal with which the drive unit drives the loop filter unit is constant;
wherein said gain characteristic information obtaining unit comprises:
a frequency comparison unit for comparing magnitudes between a frequency of the output oscillation signal outputted from the oscillation unit and each of the first target frequency and the second target frequency;
a frequency comparison result storage unit for storing a frequency comparison result by the frequency comparison unit in order of bit-weighting for each bit one by one with respect to each of the first target frequency and the second target frequency;
a frequency control signal generation unit for generating a first frequency control signal with respect to the first target frequency and a second frequency control signal with respect to the second target frequency, based on the frequency comparison result for each bit stored in the frequency comparison result storage unit;
a summing unit for summing up the first frequency control signal generated by the frequency control signal generation unit with respect to the first target frequency and the second frequency control signal generated by the frequency control signal generation unit with respect to the second target frequency, to be supplied to the oscillation control signal generation unit as a final frequency control signal; and
a path selection unit for switching the second frequency control signal generated by the frequency control sig- nal generation unit with respect to the second target frequency so that the second frequency control signal is supplied to the summing unit at a time of obtaining the gain characteristic information and the second frequency control signal is supplied to the drive unit side at a time of the usual phase synchronizing operation.

2. The phase synchronization circuit according to claim 1, wherein the gain characteristic information obtaining unit includes a signal conversion unit for obtaining the compensation signal by taking K times the second frequency control signal obtained by the frequency control signal generation unit with respect to the second target frequency; and
the K is set as a value obtained by dividing the product of the standard input signal-oscillation frequency conversion gain and the standard drive signal by a difference between the first target frequency and the second target frequency.

3. The phase synchronization circuit according to claim 2, wherein the frequency control signal generation unit outputs the first frequency control signal and the second frequency control signal in a current mode; and
the signal conversion unit includes a current mirror circuit for processing the second frequency control signal in the current mode to perform the multiplication by K.

4. The phase synchronization circuit according to claim 2, wherein the frequency control signal generation unit outputs the first frequency control signal and the second frequency control signal in a voltage mode; and
the signal conversion unit includes a voltage/current conversion unit for converting the second frequency control signal in the voltage mode into the second frequency control signal in a current mode, and a current mirror circuit for processing the second frequency control signal outputted from the voltage/current conversion unit in the current mode to perform the multiplication by K.

5. The phase synchronization circuit according to claim 3 or 4, wherein the drive unit includes a charge pump for outputting the drive signal as charge pump current, and a current source for generating a bias current for the charge pump, the bias current being 1/β times the charge pump current; and
an amount of the bias current to be generated in the current source based on the gain characteristic information obtained in the gain characteristic information obtaining unit is controlled.

6. The phase synchronization circuit according to claim 1, wherein the gain characteristic information obtaining unit performs frequency search by using binary search by comparing frequencies until it reaches a predetermined number of bits while controlling weighting of the bit in a lowering direction at the time of obtaining the gain characteristic information, so that the frequency comparison result is stored in a corresponding bit of the frequency comparison result storage unit each time the frequency comparison is performed.

7. The phase synchronization circuit according to claim 6, wherein the frequency comparison unit counts a number of clocks of each target frequency for a predetermined period of a judging reference signal having a frequency fLow which is lower than the first and second target frequencies, of a frequency division ratio M1 with respect to the first target frequency, and of a frequency division ratio M2 with respect to the second target frequency, and performs the frequency comparison by comparing magnitudes between a count result and a judgment value according to the frequency division ratios, assuming that a maximum value, which can be taken by variation, of the input signal-oscillation frequency conversion gain is $K_{oscimax}$, a value for specifying the first frequency control signal or the second frequency control signal of the most significant bit is S, and variation in the first frequency control signal or the second frequency control signal of the most significant bit is σ, then a predetermined number N of bits, a scaling x for specifying weighting of the bit satisfy the following equation (A):

$$\begin{aligned} x^{N-1}S < \frac{2f_{Low}}{K_{oscimax}} & \quad (A1) \\ \frac{\sigma}{S} < \frac{2x - 2x^N + x^{N-1} - 1}{1 - x^N} & \quad (A2) \end{aligned} \Biggr\} \quad (A)$$

8. The phase synchronization circuit according to claim 1, wherein the oscillation unit is a current control oscillation unit oscillating based on the oscillation control current as an oscillation control signal, and
the frequency control signal generation unit generates the first frequency control signal and the second frequency control signal in a current mode.

9. The phase synchronization circuit according to claim 1, wherein the oscillation unit is an voltage control oscillation unit oscillating based on the oscillation control voltage as an oscillation control signal, and
the frequency control signal generation unit generates the first frequency control signal and the second frequency control signal in a voltage mode.

10. The phase synchronization circuit according to claim 1, wherein the frequency comparison result storage unit includes a binary counter unit for counting an inputted clock signal, and comprises:
a bit switch signal generation unit for generating a bit switch signal for each bit one by one, which specifies a switch timing for bit-weighting by count output of the binary counter unit, and
a data storage unit provided for each bit, which takes in and stores the frequency comparison result from the frequency comparison unit at the switch timing of the bit-weighting for the bit switch signal generated by the bit switch signal generation unit.

11. The phase synchronization circuit according to claim 1, wherein the frequency control signal generation unit comprises:
a 1-bit current source provided for each bit, which generates source-current or sink-current according to bit-weighting, and
a switching unit for performing the switching by allowing the 1-bit current source to generate either the source-current or the sink-current according to the data stored in the frequency comparison result storage unit, and generate the first frequency control signal and the second frequency control signal in a current mode by synthesizing and outputting input and output currents of the 1-bit current source for each bit.

12. The phase synchronization circuit according to claim 11, wherein the frequency control signal generation unit further includes a current/voltage conversion unit for generating the first frequency control signal and the second frequency control signal in a voltage mode by converting the first frequency control signal and the second frequency control signal in the current mode into a voltage signal.

* * * * *